(12) United States Patent
Inoue et al.

(10) Patent No.: US 8,038,911 B2
(45) Date of Patent: *Oct. 18, 2011

(54) LANTHANOID-CONTAINING OXIDE TARGET

(75) Inventors: Kazuyoshi Inoue, Sodegaura (JP); Nobuo Tanaka, Sodegaura (JP); Tokie Tanaka, legal representative, Sodegaura (JP)

(73) Assignee: Idemitsu Kosan Co., Ltd., Tokyo (JP)

( * ) Notice: Subject to any disclaimer, the term of this patent is extended or adjusted under 35 U.S.C. 154(b) by 139 days.

This patent is subject to a terminal disclaimer.

(21) Appl. No.: 12/376,838

(22) PCT Filed: Aug. 6, 2007

(86) PCT No.: PCT/JP2007/065346
§ 371 (c)(1),
(2), (4) Date: Feb. 9, 2009

(87) PCT Pub. No.: WO2008/018403
PCT Pub. Date: Feb. 14, 2008

(65) Prior Publication Data
US 2010/0282604 A1    Nov. 11, 2010

(30) Foreign Application Priority Data

| | | |
|---|---|---|
| Aug. 10, 2006 | (JP) | 2006-218014 |
| Aug. 10, 2006 | (JP) | 2006-218034 |
| Aug. 23, 2006 | (JP) | 2006-226340 |
| Sep. 21, 2006 | (JP) | 2006-255381 |
| Sep. 21, 2006 | (JP) | 2006-255385 |
| Sep. 21, 2006 | (JP) | 2006-255390 |

(51) Int. Cl.
*H01B 1/08* (2006.01)
*C23C 30/00* (2006.01)

(52) U.S. Cl. ............... 252/521.1; 204/192.15
(58) Field of Classification Search ............ 252/518.1, 252/521.1; 204/192.15
See application file for complete search history.

(56) References Cited

U.S. PATENT DOCUMENTS

| | | | |
|---|---|---|---|
| 5,972,527 A | 10/1999 | Kaijou et al. | |
| 7,306,861 B2 | 12/2007 | Inoue et al. | |
| 7,393,600 B2 | 7/2008 | Inoue et al. | |
| 7,612,850 B2 * | 11/2009 | Inoue et al. | 349/114 |
| 7,648,657 B2 * | 1/2010 | Inoue et al. | 252/521.1 |
| 2004/0081836 A1 | 4/2004 | Inoue et al. | |
| 2005/0199959 A1 | 9/2005 | Chiang et al. | |
| 2006/0234088 A1 | 10/2006 | Inoue et al. | |

(Continued)

FOREIGN PATENT DOCUMENTS
JP  6-234565 A  8/1994
(Continued)

OTHER PUBLICATIONS

Written Opinion of the International Searching Authority for PCT/JP2007/065346.

(Continued)

*Primary Examiner* — Mark Kopec
(74) *Attorney, Agent, or Firm* — Millen, White, Zelano & Branigan, P.C.

(57) ABSTRACT

An oxide target including indium (In) and an element (A) selected from the following group A, wherein it contains an oxide shown by $AInO_3$,
Group A: lanthanum (La), neodymium (Nd), ytterbium (Yb), erbium (Er) and dysprosium (Dy).

5 Claims, 62 Drawing Sheets

U.S. PATENT DOCUMENTS

| | | |
|---|---|---|
| 2007/0037402 A1 | 2/2007 | Inoue |
| 2007/0170434 A1 | 7/2007 | Inoue et al. |
| 2008/0239217 A1 | 10/2008 | Inoue et al. |

FOREIGN PATENT DOCUMENTS

| | | | |
|---|---|---|---|
| JP | 7-235219 A | | 9/1995 |
| JP | 2004-68054 A | | 3/2004 |
| JP | 2004-119272 A | | 4/2004 |
| JP | 2004-139780 A | | 5/2004 |
| JP | 2004-146136 A | | 5/2004 |
| JP | 2004-158315 A | | 6/2004 |
| JP | 2004-240091 A | | 8/2004 |
| JP | 2004-294630 A | | 10/2004 |
| JP | 2004-333882 A | | 11/2004 |
| JP | 2005-314734 A | | 11/2005 |
| WO | WO 2005/086179 A1 | | 9/2005 |
| WO | WO2007010702 | * | 1/2007 |
| WO | WO2010024034 | * | 3/2010 |

OTHER PUBLICATIONS

International Search Report for PCT/JP2007/065346 (Oct. 29, 2007).

S. Zuca et al., "Contribution to the Study of $SnO_2$-Based Ceramics", Journal of Materials Science, vol. 26 (1991) pp. 1673-1676.

S. Nishiyama et al., "P-Type Electrical Conduction of $LaInO_3$ Based Ceramics and Calculation of Its Density of States", Key Engineering Materials, vol. 216 (2002) pp. 65-68.

M. Kimura et al., "Junsui Oyobi Shushu no Ganso de Bubun Chikan shita $LaInO_3$ Shoketsutai no Denkiteki Seishitsu", The Ceramic Society of Japan, vol. 2000 (Mar. 21, 2000) p. 213.

* cited by examiner

LANTHANOID-CONTAINING OXIDE TARGET

TECHNICAL FIELD

The invention relates to an oxide target used in forming a conductive film or a semiconductor. More particularly, the invention relates to an oxide target comprising an oxide sintered body containing a lanthanoid.

BACKGROUND

In a transparent conductive film composed mainly of indium, tin-doped indium oxide (ITO) is generally used. The reason is that the concentration of carriers is increased by doping with tin, whereby a transparent conductive film improved in conductivity can be obtained.

However, an ITO film has the following disadvantages. Since a strong acid (for example, aqua regia) is required to be used for etching an ITO film, when an ITO film is used as an electrode for a TFT liquid crystal, metal wiring in underlying layers may undergo corrosion by etching. In addition, an ITO target, which is used for preparing an ITO film by sputtering, tends to blacken by reduction. Change of its properties with time has become a problem.

As a transparent conductive film which is not only more improved in etching properties than ITO films but also have conductivity and light transmittance which are equivalent to those of ITO films, and as a sputtering target which is preferable to obtain such a transparent conductive film, a target or a transparent conductive film comprising indium oxide and zinc oxide has been proposed (Patent Documents 1 and 2). However, a transparent conductive film comprising indium oxide and zinc oxide are etched quickly in a weak acid, and therefore can be etched with an etchant for a thin metal film. However, when etching a thin metal film formed on a transparent conductive film, a transparent conductive film comprising indium oxide and zinc oxide may also be etched. Therefore, a transparent conductive film comprising indium oxide and zinc oxide is not suitable when selectively etching a thin metal film on a transparent conductive film.

It is known that a transparent conductive film comprising indium oxide and zinc oxide can be used also as an oxide semiconductor due to the presence of a large amount of oxygen during film formation by the sputtering method (Patent Document 3).

Furthermore, it is reported that a transparent conductive film containing indium and a lanthanoid element is effective as an electrode for an organic EL and as a semi-transmissive/semi-reflective LCD electrode (Patent Documents 4 to 12).

However, oxides of a lanthanoid-based element have no conductivity. If these oxides are mixed in indium oxide to prepare a target, insulating particles are present in the target as they are. As a result, abnormal discharge during sputtering or blackening of the target surface occurs, resulting in disadvantages such as a lowered sputtering speed.

Patent Document 1: JP-A-H6-234565
Patent Document 2: JP-A-H7-235219
Patent Document 3: US Patent Publication No. 2005/199959
Patent Document 4: JP-A-2004-68054
Patent Document 5: JP-A-2004-119272
Patent Document 6: JP-A-2004-139780
Patent Document 7: JP-A-2004-146136
Patent Document 8: JP-A-2004-158315
Patent Document 9: JP-A-2004-240091
Patent Document 10: JP-A-2004-294630
Patent Document 11: JP-A-2004-333882
Patent Document 12: JP-A-2005-314734

DISCLOSURE OF THE INVENTION

The invention has been made in view of the above-mentioned problem, and an object thereof is to provide an oxide target which is free from abnormal discharge or blackening of target surface. Another object of the invention is to provide an oxide target which has a high conductivity.

The invention provides the following oxide target (hereinafter simply referred to as the "target") or the like.

1. An oxide target comprising indium (In) and an element (A) selected from the following group A, wherein it contains an oxide shown by $AInO_3$,
Group A: lanthanum (La), neodymium (Nd), ytterbium (Yb), erbium (Er) and dysprosium (Dy).
2. An oxide target comprising tin (Sn) and an element (A) selected from the following group A, wherein it contains an oxide shown by $A_2Sn_2O_7$,
Group A: lanthanum (La), neodymium (Nd), ytterbium (Yb), erbium (Er) and dysprosium (Dy).
3. An oxide target comprising indium (In), tin (Sn) and an element (B) selected from the following group B, wherein it contains an oxide shown by $B_2Sn_2O_7$,
Group B: lanthanum (La), gadolinium (Gd), neodymium (Nd), ytterbium (Yb), erbium (Er) and dysprosium (Dy).
4. The oxide target according to 3, wherein the element (B) is Gd and the ratio of Gd to the total content of In, Sn and Gd [Gd/(Gd+Sn+In): atomic ratio] is 0.001 to 0.5.
5. The oxide target according to 3 or 4, wherein the content of Sn relative to the total cation metal elements [Sn/(total cation metal elements): atomic ratio] is larger than the content of the element (B) [B/(total cation metal elements): atomic ratio].
6. The oxide target according to any one of 1 to 5, wherein the element (A) is any one of Nd, Yb and Dy, the element (B) is any one of Gd, Nd, Yb and Dy, and the density is 6.5 g/cm³ or more.
7. The oxide target according to 1, wherein the element (A) is La, and the ratio of La to the total content of In and La [La/(La+In): atomic ratio] is 0.001 to 0.5.
8. The oxide target according to 2, wherein the element (A) is La, and the ratio of La to the total content of Sn and La [La/(La+Sn): atomic ratio] is 0.001 to 0.5.
9. The oxide target according to 3, wherein the element (B) is La, and the ratio of La to the total content of In, Sn and La [La/(La+Sn+In): atomic ratio] is 0.001 to 0.5.
10. The oxide target according to any one of 1 to 3, 5 and 7 to 9, wherein the element (A) or the element (B) is La, and the density is 6.5 g/cm³ or more.
11. The oxide target according to any one of 1 to 3, 5 and 7 to 10, wherein the element (A) or the element (B) is La, and the bulk resistance is 1 Ωcm or less.
12. The oxide target according to any one of 3 to 6, wherein the element (A) or the element (B) is Gd, and the bulk resistance is 1 Ωcm or less.
13. The oxide target according to any one of 1 to 3 and 5, wherein the element (A) or the element (B) is Er, and the density is 4.5 g/cm³ or more.

The above invention includes oxide targets containing each of the following lanthanoids.

[Lanthanum (La)]
1. An oxide target containing indium (In) and lanthanum (La), wherein it contains an oxide shown by $LaInO_3$.
2. The oxide target according to 1, wherein the ratio of La to the total content of the above-mentioned In and La [La+(La+In): atomic ratio] is 0.001 to 0.5.
3. An oxide target containing tin (Sn) and lanthanum (La), wherein it contains an oxide shown by $La_2Sn_2O_7$.

4. The oxide target according to 3, wherein the ratio of La to the total content of the above-mentioned Sn and La [La+(La+Sn): atomic ratio] is 0.001 to 0.5.

5. An oxide target containing indium (In), tin (Sn) and lanthanum (La), wherein it contains an oxide shown by $La_2Sn_2O_7$ and/or $LaInO_3$.

6. The oxide target according to 5, wherein the ratio of La to the total content of the above-mentioned In, Sn and La [La+(La+Sn+In): atomic ratio] is 0.001 to 0.5.

7. The oxide target according to any one of 1 to 6, wherein it has a density of 6.5 g/cm$^3$ or more.

8. The oxide target according to any one of 1 to 7, wherein it has a bulk resistance of 1 Ωcm or less.

[Gadolinium (Gd)]

1. An oxide target containing indium (In), tin (Sn) and gadolinium (Gd), wherein it contains an oxide shown by $Gd_2Sn_2O_7$ and/or $GdInO_3$.

2. The oxide target according to 2, wherein the ratio of Gd to the total content of the above-mentioned In, Sn and Gd [(Gd/(Gd+Sn+In): atomic ratio] is 0.001 to 0.5.

3. The oxide target according to 1 and 2, wherein the ratio of Sn to the total content of In, Sn and Gd [Sn/(Gd+Sn+In): atomic ratio] and the ratio of Gd [Gd/(Gd+Sn+In): atomic ratio] satisfies the following relationship:

[Sn/(Gd+Sn+In)]>[Gd/(Gd+Sn+In)]

4. The oxide target according to any one of 1 to 3, wherein it has a density of 6.5 g/cm$^3$ or more.

5. The oxide target according to any one of 1 to 4, wherein it has a bulk resistance of 1 Ωcm or less.

[Neodymium (Nd)]

1. An oxide target containing indium (In) and neodymium (Nd), wherein it contains an oxide shown by $NdInO_3$.

2. An oxide target containing tin (Sn) and neodymium (Nd), wherein it contains an oxide shown by $Nd_2Sn_2O_7$.

3. An oxide target containing indium (In), tin (Sn) and neodymium (Nd), wherein it contains an oxide shown by $Nd_2Sn_2O_7$ and/or $NdInO_3$.

4. The oxide target according to 3, wherein the content of Sn relative to the total cation metal elements [Sn/(total cation metal elements): atomic ratio] is larger than the content of Nd [Nd/(total cation metal elements): atomic ratio].

5. The oxide target according to any one of 1 to 4, wherein it has a density of 6.5 g/cm$^3$ or more.

[Ytterbium (Yb)]

1. An oxide target containing indium (In) and ytterbium (Yb), wherein it contains an oxide shown by $YbInO_3$.

2. An oxide target containing tin (Sn) and ytterbium (Yb), wherein it contains an oxide shown by $Yb_2Sn_2O_7$.

3. An oxide target containing indium (In), tin (Sn) and ytterbium (Yb), wherein it contains an oxide shown by $Yb_2Sn_2O_7$.

4. The oxide target according to 3, wherein the content of Sn relative to the total cation metal elements [Sn/(total cation metal elements): atomic ratio] is larger than the content of Yb [Yb/(total cation metal elements): atomic ratio].

5. The oxide target according to any one of 1 to 4, wherein it has a density of 6.5 g/cm$^3$ or more.

[Erbium (Er)]

1. An oxide target containing indium (In) and erbium (Er), wherein it contains an oxide shown by $ErInO_3$.

2. An oxide target containing tin (Sn) and erbium (Er), wherein it contains an oxide shown by $Er_2Sn_2O_7$.

3. An oxide target containing indium (In), tin (Sn) and erbium (Er), wherein it contains an oxide shown by $Er_2Sn_2O_7$.

4. The oxide target according to 3, wherein the content of Sn relative to the total cation metal elements [Sn/(total cation metal elements): atomic ratio] is larger than the content of Er [Er/(total cation metal elements): atomic ratio].

5. The oxide target according to any one of 1 to 4, wherein it has a density of 4.5 g/cm$^3$.

[Dysprosium (Dy)]

1. An oxide target containing indium (In) and dysprosium (Dy), wherein it contains an oxide shown by $DyInO_3$.

2. An oxide target containing tin (Sn) and dysprosium (Dy), wherein it contains an oxide shown by $Dy_2Sn_2O_7$.

3. An oxide target containing indium (In), tin (Sn) and dysprosium (Dy), wherein it contains an oxide shown by $Dy_2Sn_2O_7$.

4. The oxide target according to 3, wherein the content of Sn relative to the total cation metal elements [Sn/(total cation metal elements): atomic ratio] is larger than the content of Dy [Dy/(total cation metal elements): atomic ratio].

5. The oxide target according to any one of 1 to 4, wherein it has a density of 6.5 g/cm$^3$ or more.

The oxide target of the invention is improved in conductivity since it contains a lanthanoid-containing oxide having a specific structure. Therefore, the oxide target of the invention is free from abnormal discharge. This oxide target can be used as a sputtering target, an electron beam target or an ion plating target, and serves as a raw material for forming a thin film.

BEST MODE FOR CARRYING OUT THE INVENTION

Figure 1:
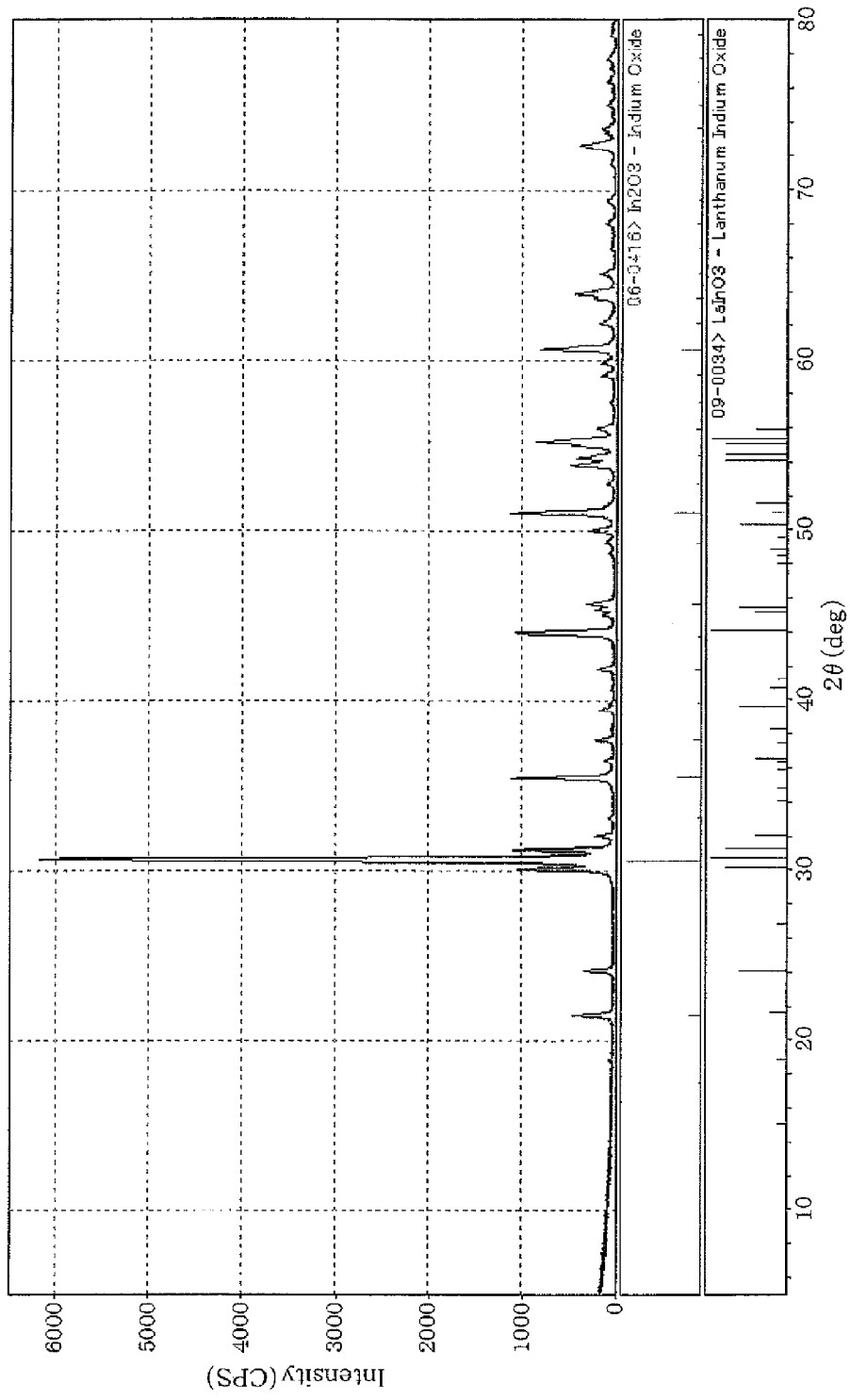
FIG. 1 is the X-ray chart of the target prepared in Example 1-1.

The oxide target of the invention is characterized by satisfying the following characteristics 1 to 3.
1. An oxide target comprising indium (In) and an element (A) selected from the group (Group A) consisting of lanthanum (La), neodymium (Nd), ytterbium (Yb), erbium (Er) and dysprosium (Dy), wherein it contains an oxide shown by $AInO_3$ (Target I).
2. An oxide target comprising tin (Sn) and an element (A) selected from Group A, wherein it contains $A_2Sn_2O_7$ (Target II).
3. An oxide target comprising indium (In) and tin (Sn) and an element (B) selected from the group (Group B) consisting of lanthanum (La), gadolinium (Gd), neodymium (Nd), ytterbium (Yb), erbium (Er) and dysprosium (Dy), wherein it contains an oxide shown by $B_2Sn_2O_7$ (Target III).

The invention will be described for each of the lanthanoids constituting Group A or Group B.
[Lanthanum (La)]
According to the first aspect of the oxide target of the invention, the oxide target comprises a sintered body of an oxide containing indium (In) and lanthanum (La), wherein it contains an oxide shown by $LaInO_3$ (Target I).

As compared with a target which simply comprises $In_2O_3$ and $La_2O_3$, this Target I has a high conductivity. In addition, it suffers from only a slight degree of target surface blackening and is free from abnormal discharge during sputtering, whereby stable sputtering state can be maintained. As a result, a transparent conductive film having a light transmittance equivalent to that of an ITO film can be obtained stably.

Target I contains an oxide with a structure shown by $LaInO_3$. Preferred examples of oxides constituting the target are given below.
(a) $LaInO_3$
(b) A mixture of $LaInO_3$ and $In_2O_3$
(c) A mixture of $LaInO_3$ and $La_2O_3$ Of these, the sintered body (b) is preferable. The structure of the oxide in the target is identified by a chart obtained by an X-ray diffraction measurement. The same can be applied to the targets II and III and other lanthanoid-containing oxide targets.

In this target, the ratio of La to the total of La and In (atomic ratio: La/(La+In)) is preferably 0.001 to 0.5, more preferably 0.01 to 0.2, particularly preferably 0.01 to 0.15. If the ratio of La is less than 0.001, effects of adding La atoms may not be obtained. If the ratio of La exceeds 0.5, $La_2O_3$ exists alone, and since the resistance value of the target increases significantly, abnormal discharge may occur during sputtering. In addition, due to a decrease in the strength of the target itself, a problem may occur that the target is broken or deformed during sintering in the target production process.

The atomic ratio of La and In in the target can be controlled by adjusting the mixing ratio of an indium compound and a lanthanoid compound, which are raw materials, before sintering. It is supposed that, due to the adjustment of the mixing ratio before sintering, a lanthanum-indium compound comprising an indium compound and a lanthanum compound, which satisfies a stoichiometric ratio, such as $LaInO_3$, is formed, and a remaining indium compound exists as a crystalline substance, an amorphous substance, or the like.

Examples of the method for producing Target I include a method in which a compound containing an indium atom and a compound containing a lanthanum atom are used as raw materials, followed by sintering of the mixture of these materials.

As the compound containing an indium atom, indium oxide, indium hydroxide or the like can be given. Indium oxide is preferable.

As the compound containing a lanthanum atom, lanthanum oxide, lanthanum hydroxide or the like can be given. Lanthanum oxide is preferable.

It is preferred that these starting raw materials be pulverized and mixed by means of a beads mill or the like. By doing this, the raw materials can be homogeneously mixed, and the particle size of the raw materials can be reduced.

The average particle size of the raw materials is 3 μm or less at maximum, preferably 1 μm or less, and more preferably 0.8 μm or less. If the average particle size exceeds 3 μm, abnormal discharge may be caused since $La_2O_3$ remains in the target as insulating particles, for example. Formation of $La_2InO_3$ can be confirmed by X-ray diffractometry.

The raw material powder is molded into a predetermined shape, and the resulting molded product is sintered. The sintering condition is 1000 to 1600° C., preferably 1200 to 1500° C., more preferably 1250 to 1450° C. If the temperature is lower than 1000° C., $LaInO_3$ may not be formed due to low reactivity of $La_2O_3$. If the temperature exceeds 1600° C., sublimation or thermal decomposition of $In_2O_3$ occurs, and the composition may be varied or the generated $LaInO_3$ may be decomposed.

In the invention, the sintered body contains $LaInO_3$. The oxide with this structure can be formed by the above-mentioned sintering. The particle size of the formed $LaInO_3$ can be measured by EPMA mapping. The particle size of $LaInO_3$ is 10 μm or less, preferably 5 μm or less. If particles of $LaInO_3$ with a size exceeding 10 μm are present, abnormal discharge may occur due to difference in conductivity around the particles. If the particle size is 10 μm or less, such abnormal discharge can be suppressed, enabling stable sputtering.

In the second aspect of the oxide target of the invention, the oxide target comprises a sintered body of an oxide containing tin (Sn) and lanthanum (La), wherein it contains an oxide shown by $La_2Sn_2O_7$ (Target II).

As compared with a target which simply comprises $SnO_2$ and $La_2O_3$, this Target II is free from target surface blackening and abnormal discharge during sputtering, whereby stable sputtering state can be maintained.

Target II contains an oxide with a structure shown by $La_2Sn_2O_7$, and preferred examples of oxides constituting the target include the following:

(a) $La_2Sn_2O_7$
(b) A mixture of $La_2Sn_2O_7$ and $SnO_2$
(c) A mixture of $La_2Sn_2O_7$ and $La_2O_3$ Of these, the sintered body (b) is preferable.

In this target, the ratio of La to the total of La and Sn (atomic ratio: La/(La+Sn)) is preferably 0.001 to 0.5, more preferably 0.01 to 0.2, particularly preferably 0.01 to 0.15. If the ratio is less than 0.001, effects of adding La may not be obtained. If the ratio of La exceeds 0.5, $La_2O_3$ exists alone, and since insulating particles are present in the target, a trouble such as abnormal discharge may occur during sputtering.

The atomic ratio of the above-mentioned La and Sn can be controlled by adjusting the mixing ratio of a tin compound and a lanthanum compound before sintering. It is supposed that, due to the adjustment of the mixing ratio before sintering, an oxide $La_2Sn_2O_7$ comprising a tin compound and a lanthanum compound, which satisfies a stoichiometric ratio, is formed, and a remaining tin compound exists as a crystalline substance, an amorphous substance, or the like.

Examples of the method for producing Target II include a method in which a compound containing a tin atom and a compound containing a lanthanum atom are used as raw materials, followed by sintering of the mixture of these materials.

As examples of the compound containing a tin atom, tin oxide (stannous oxide, stannic oxide), metastannic acid or the like can be given. Tin oxide (stannic oxide) is preferable.

It is preferred that these starting raw materials be pulverized and mixed by means of a beads mill or the like. By doing this, the raw materials can be homogeneously mixed, and the particle size of the raw materials can be reduced.

The average particle size of the raw materials is 3 μm or less at maximum, preferably 1 μm or less, and more preferably 0.8 μm or less. If the average particle size exceeds 3 μm, abnormal discharge may be caused since $La_2O_3$ remains in the target as insulating particles, for example. Formation of $La_2Sn_2O_7$ can be confirmed by X-ray diffractometry.

The raw material powder is molded into a predetermined shape, and the resulting molded product is sintered. The sintering condition is 1000 to 1600° C., preferably 1200 to 1500° C., more preferably 1250 to 1450° C. If the temperature is lower than 1000° C., $La_2Sn_2O_7$ may not be formed due to low reactivity of $La_2O_3$. If the temperature exceeds 1600° C., sublimation or thermal decomposition of $La_2O_3$ occurs, and the composition may be varied or the generated $La_2Sn_2O_7$ may be decomposed.

In the invention, the sintered body contains $La_2Sn_2O_7$. The oxide with this structure can be formed by the above-mentioned sintering. The particle size of the formed $La_2Sn_2O_7$ can be measured by EPMA mapping. The particle size of $La_2Sn_2O_7$ is 10 μm or less, preferably 5 μm or less. If particles of $La_2Sn_2O_7$ with a particle size exceeding 10 μm are present, abnormal discharge may occur due to difference in conductivity around the particles. If the particle size is 10 μm or less, such abnormal discharge can be suppressed, enabling stable sputtering.

In the third aspect of the oxide target of the invention, the oxide target comprises a sintered body of an oxide containing indium (In), tin (Sn) and lanthanum (La), wherein it contains an oxide shown by $La_2Sn_2O_7$ and/or $LaInO_3$ (Target III).

As compared with a target which simply comprises $In_2O_3$, $SnO_2$ and $La_2O_3$, this Target III has a high conductivity. In addition, it is free from target surface blackening and abnormal discharge during sputtering, whereby stable sputtering state can be maintained.

Target III contains an oxide with a structure shown by $La_2Sn_2O_7$ and/or $LaInO_3$ and preferred examples of oxides constituting the target include the following:

(a) A mixture of $La_2Sn_2O_7$ and $In_2O_3$ (b) A mixture of $La_2Sn_2O_7$, $In_2O_3$ and $SnO_2$
(c) A mixture of $La_2Sn_2O_7$, $LaInO_3$ and $In_2O_3$
(d) A mixture of $La_2Sn_2O_7$, $LaInO_3$ and $SnO_2$ Of these, the sintered body formed of (a), (b) or (c) is preferable.

In this target, the atomic ratio of La (La/(La+In+Sn)) is preferably 0.001 to 0.5, more preferably 0.01 to 0.3, particularly preferably 0.01 to 0.25. If the ratio is less than 0.001, effects of adding La may not be obtained. If the ratio exceeds 0.5, $La_2O_3$ exists alone. As a result, the strength of the target may be decreased significantly, and the target may be broken due to thermal stress during sputtering. Furthermore, due to a decrease in the strength of the target itself, problems such as target breakage may occur during the target production process.

In addition, it is preferred that the ratio of the content of La and the content of Sn (atomic ratio) in the target satisfy the relationship represented by the following formula:

$$La/(La+In+Sn = \text{total cation metal elements}) < Sn/(La+In+Sn)$$

The reason is that $La_2Sn_2O_7$ tends to be formed since La and Sn are reacted easily. That is, if La exists in an amount exceeding the amount of Sn, almost all of Sn is consumed by La, and $LaInO_3$ is mainly formed. As a result, the amount of Sn to be doped with $In_2O_3$ decreases, leading to an increase in the bulk resistance of the target.

If the content of La is rendered smaller than that of Sn such that the above formula is satisfied, while La is consumed by Sn, excessive Sn is doped with $In_2O_3$. As a result, resistance of the target is decreased, and the stable sputtering state can be maintained.

The content of Sn [atomic ratio: Sn/(La+In+Sn)] satisfies the above-mentioned relationship, and is preferably in the range of 0.03 to 0.45, particularly preferably 0.05 to 0.3.

The atomic ratio of the above-mentioned La, In and Sn is obtained by adjusting the mixing ratio of an indium compound, a tin compound and a lanthanum compound before sintering.

It is supposed that, due to the adjustment of the mixing ratio before sintering, an $La_2Sn_2O_7$ compound comprising a tin compound and a lanthanum compound, which satisfies a stoichiometric ratio, is formed, an $LaInO_3$ compound comprising an indium compound and a lanthanum compound, which satisfies a stoichiometric ratio, is formed, and a remaining indium compound and a remaining tin compound exist as a crystalline substance, an amorphous substance, or the like.

Examples of the method for producing Target III include a method in which a compound containing an indium atom, a compound containing a tin atom and a compound containing a lanthanum atom are used as raw materials, followed by sintering of the mixture of these materials.

Specific examples of the compound containing an indium atom, the compound containing a tin atom, and the compound containing a lanthanum atom are the same as those exemplified above for Target I or Target II.

The raw material powder is molded into a predetermined shape, and the resulting molded product is sintered. The sintering condition is 1000 to 1600° C., preferably 1200 to 1500° C., more preferably 1250 to 1450° C. If the temperature is lower than 1000° C., $La_2Sn_2O_7$ or $LaInO_3$ may not be formed due to low reactivity of $La_2O_3$. If the temperature exceeds 1600° C., sublimation or thermal decomposition of $In_2O_3$ occurs, and the composition may be varied or the generated $La_2Sn_2O_7$ or $LaInO_3$ may be decomposed.

In the invention, the sintered body comprises $La_2Sn_2O_7$ and/or $LaInO_3$. The oxide with this structure can be formed by a sintering reaction (thermal reaction).

The sintered body constituting the target of the invention suffers only a slight degree of blackening during sputtering and has a high degree of conductivity. Specifically, it is possible to render the bulk resistance of the sintered body 1 Ωm or less. Furthermore, it is possible to render the bulk resistance of the sintered body 0.1 Ωm or less. In the invention, in particular, the bulk resistance can be reduced by allowing the composition to be La/(La+Sn+In)<Sn/(La+Sn+In).

[Gadolinium (Gd)]

The oxide target of the invention is an oxide target comprising a sintered body of an oxide containing indium (In), tin (Sn) and gadolinium (Gd), wherein it contains an oxide shown by $Gd_2Sn_2O_7$ and/or $GdInO_3$ (Target III).

As compared with a target which simply comprises $In_2O_3 \cdot SnO_2$ and $Gd_2O_3$, this Target III has a high conductivity. In addition, it is free from target surface blackening and abnormal discharge during sputtering, whereby stable sputtering state can be maintained.

The target of the invention contains an oxide with a structure shown by $Gd_2Sn_2O_7$ and/or $GdInO_3$ and preferred examples of the oxide constituting the target include the following:

(a) A mixture of $Gd_2Sn_2O_7$ and $In_2O_3$
(b) A mixture of $Gd_2Sn_2O_7$, $In_2O_3$ and $SnO_2$
(c) A mixture of $Gd_2Sn_2O_7$, $GdInO_3$ and $In_2O_3$
(d) A mixture of $Gd_2Sn_2O_7$, $GdInO_3$ and $SnO_2$ Of these, the sintered body formed of (a), (b) or (c) is preferable.

In this target, the atomic ratio of Gd (Gd/(Gd+In+Sn)) is preferably 0.001 to 0.5, more preferably 0.01 to 0.3, particularly preferably 0.01 to 0.25. If the ratio is less than 0.001, effects of adding Gd may not be obtained. If the ratio of Gd exceeds 0.5, $Gd_2O_3$ exists alone. As a result, the strength of the target may be decreased significantly, and the target may be broken due to thermal stress during sputtering. Furthermore, due to a decrease in strength of the target itself, problems such as target breakage may occur during the target production process.

In addition, it is preferred that the ratio of the content of Gd and the content of Sn (atomic ratio) in the target satisfy the relationship represented by the following formula:

$$Sn/(Gd+In+Sn = \text{total cation metal elements}) > Gd/(Gd+In+Sn)$$

The reason is that $Gd_2Sn_2O_7$ tends to be formed since Gd and Sn are reacted easily. That is, if Gd exists in an amount exceeding the amount of Sn, almost all of Sn is consumed by Ga, and $GdInO_3$ is mainly formed. As a result, the amount of Sn to be doped with $In_2O_3$ decreases, leading to an increase in the bulk resistance of the target.

If the content of Gd is rendered smaller than that of Sn such that the above formula is satisfied, while Gd is consumed by Sn, excessive Sn is doped with $In_2O_3$. As a result, the resistance of the target is decreased, and the stable sputtering state can be maintained.

The content of Sn [atomic ratio: Sn/(Gd+In+Sn)] satisfies the above-mentioned relationship, and is preferably in the range of 0.03 to 0.45, particularly preferably 0.05 to 0.4.

The atomic ratio of the above-mentioned Gd, In and Sn is obtained by adjusting the mixing ratio of an indium compound, a tin compound and a gadolinium compound before sintering.

It is supposed that, due to the adjustment of the mixing ratio before sintering, a $Gd_2Sn_2O_7$ compound comprising a tin compound and a gadolinium compound, which satisfies a stoichiometric ratio is formed, a GdInO$_3$ compound comprising an indium compound and a gadolinium compound, which satisfies a stoichiometric ratio, is formed, and a remaining indium compound and a remaining tin compound exist as a crystalline substance, an amorphous substance, or the like.

Examples of the method for producing the target include a method in which a compound containing an indium atom, a compound containing a tin atom and a compound containing a gadolinium atom are used as raw materials, followed by sintering of the mixture of these materials.

As the compound containing an indium atom, indium oxide, indium hydroxide or the like can be given. Indium oxide is preferable.

As the compound containing a gadolinium atom, gadolinium oxide, gadolinium hydroxide or the like can be given. Gadolinium oxide is preferable.

As examples of a compound containing a tin atom, tin oxide (stannous oxide, stannic oxide), metastatic acid or the like can be given. Tin oxide (stannic oxide) is preferable.

It is preferred that these starting raw materials be pulverized and mixed by means of a beads mill or the like. By doing this, raw materials can be homogeneously mixed, and the particle size of the raw materials can be reduced.

The average particle size is 3 μm or less at maximum, preferably 1 μm or less, and more preferably 0.8 μm or less. If the average particle size exceeds 3 μm, abnormal discharge may be caused since Gd$_2$O$_3$ remains in the target as insulating particles, for example. Formation of Gd$_2$Sn$_2$O$_7$ can be confirmed by X-ray diffractometry.

The raw material powder is molded into a predetermined shape, and the resulting molded product is sintered. The sintering condition is 1000 to 1600° C., preferably 1200 to 1500° C., more preferably 1250 to 1450° C. If the temperature is lower than 1000° C., Gd$_2$Sn$_2$O$_7$ or GdInO$_3$ may not be formed due to low reactivity of Gd$_2$O$_3$. If the temperature exceeds 1600° C., sublimation or thermal decomposition of In$_2$O$_3$ occurs, and the composition may be varied or the generated Gd$_2$Sn$_2$O$_7$ or GdInO$_3$ may be decomposed.

In the invention, the sintered body contains Gd$_2$Sn$_2$O$_7$ and/or GdInO$_3$. The oxide with this structure can be formed by a sintering reaction (thermal reaction).

The sintered body constituting the target of the invention suffers only a slight degree of blackening during sputtering and has a high conductivity. Specifically, it is possible to render the bulk resistance of the sintered body 1 Ωm or less. Furthermore, it is possible to render the bulk resistance of the sintered body 0.1 Ωm or less. In the invention, in particular, the bulk resistance can be reduced by allowing the composition to be Gd/(Gd+Sn+In)<Sn/(Gd+Sn+In).

[Neodymium (Nd)]

In the first aspect of the oxide target of the invention, the oxide target formed of a sintered body of an oxide containing indium (In) and neodymium (Nd), wherein it contains an oxide shown by NdInO$_3$ (Target I).

As compared with a target which simply comprises In$_2$O$_3$ and Nd$_2$O$_3$, this Target I has a high conductivity. In addition, it suffers from only a slight degree of target surface blackening and is free from abnormal discharge during sputtering, whereby stable sputtering state can be maintained. As a result, a transparent conductive film having a light transmittance equivalent to that of an ITO film and an oxide semiconductor film having a light transmittance equivalent to that of an oxide semiconductor film composed of indium oxide and zinc oxide can be obtained stably.

Target I contains an oxide with a structure shown by NdInO$_3$ and preferred examples of the sintered body constituting the target include the following:

(a) NdInO$_3$
(b) A mixture of NdInO$_3$ and In$_2$O$_3$
(c) A mixture of NdInO$_3$ and Nd$_2$O$_3$ Of these, the sintered body (b) is preferable.

In this target, the ratio of Nd to the total of Nd and In (atomic ratio: Nd/(Nd+In)) is preferably 0.001 to 0.5, more preferably 0.01 to 0.2, particularly preferably 0.01 to 0.15. If the ratio is less than 0.001, effects of adding Nd atoms may not be obtained. If the ratio exceeds 0.5, Nd$_2$O$_3$ exists alone, and the resistance value of the target increases significantly since Nd$_2$O$_3$ as an insulating substance exists in the target in the form of particles. As a result, abnormal discharge may occur during sputtering. In addition, due to a decrease in the strength of the target itself, a problem may occur that the target is broken or deformed during sintering in the target production process.

The atomic ratio of Nd and In in the target can be controlled by adjusting the mixing ratio of an indium compound and a neodymium compound, which are raw materials, before sintering. It is supposed that, due to the adjustment of the mixing ratio before sintering, a neodymium/indium compound comprising an indium compound and a neodymium compound, which satisfies a stoichiometric ratio, such as NdInO$_3$, is formed, and a remaining indium compound exists as a crystalline substance, an amorphous substance, or the like.

Examples of the method for producing Target I include a method in which a compound containing an indium atom and a compound containing a neodymium atom are used as raw materials, followed by sintering of the mixture of these materials.

As the compound containing an indium atom, indium oxide, indium hydroxide or the like can be given. Indium oxide is preferable.

As examples of the compound containing a neodymium atom, neodymium oxide, neodymium carbonate, neodymium chloride, neodymium nitrate, neodymium sulfate or the like can be given. Neodymium oxide is preferable.

It is preferred that the above-mentioned starting raw materials be pulverized and mixed by means of a beads mill or the like. By doing this, the raw materials can be homogenously mixed and the particle size of the raw materials can be reduced.

The average particle size of the raw materials is 3 μm or less at maximum, preferably 1 μm or less, and more preferably 0.8 μm or less. If the average particle size exceeds 3 μm, abnormal discharge may be caused since Nd$_2$O$_3$ remains as insulating particles in the target. Formation of NdInO$_3$ can be confirmed by X-ray diffractometry.

The raw material powder is molded in a predetermined shape, and the resulting molded product is sintered. The sintering condition is 1000 to 1600° C., preferably 1200 to 1500° C., and more preferably 1250 to 1450° C. If the sintering is performed at a temperature lower than 1000° C., reactivity of Nd$_2$O$_3$ is low, and there may be a possibility that NdInO$_3$ is not formed. If the sintering is performed at a temperature exceeding 1600° C., sublimation or thermal decomposition of In$_2$O$_3$ may occur, and the composition may be varied or the generated NdInO$_3$ may be decomposed.

In the invention, the sintered body contains NdInO$_3$. The oxide with this structure can be formed by the above-mentioned sintering. The particle size of the generated NdInO$_3$ can be measured by EPMA mapping. The particle size of NdInO$_3$ is 10 μm or less, preferably 5 μm or less. If particles with a particle size exceeding 10 μm are present, abnormal discharge may occur due to difference in conductivity around the particles. If the particle size is 10 μm or less, such abnormal discharge can be suppressed to enable stable sputtering.

According to the second aspect of the oxide target of the invention, the oxide target comprises a sintered body of an oxide containing tin (Sn) and neodymium (Nd), wherein it contains an oxide shown by $Nd_2Sn_2O_7$ (Target II).

As compared with a target which simply comprises $SnO_2$ and $Nd_2O_3$, this Target II is free from abnormal discharge during sputtering and target surface blackening, whereby stable sputtering state can be maintained.

Target II contains an oxide with a structure shown by $Nd_2Sn_2O_7$. Preferred examples of the sintered body constituting the target are given below.

(a) $Nd_2Sn_2O_7$
(b) A mixture of $Nd_2Sn_2O_7$ and $SnO_2$
(c) A mixture of $Nd_2Sn_2O_7$ and $Nd_2O_3$
(d) A mixture of $Nd_2Sn_2O_7$, $SnO_2$ and $Nd_2O_3$ Of these, the sintered body (b) is preferable.

In this target, the ratio of Nd to the total of Nd and Sn (atomic ratio: Nd/(Nd+Sn)) is preferably 0.001 to 0.5, more preferably 0.01 to 0.2, particularly preferably 0.01 to 0.15. If the ratio is less than 0.001, effects of adding Nd may not be obtained. If the ratio exceeds 0.5, $Nd_2O_3$ exists alone, and since the resistance value of the target increases significantly, a trouble such as abnormal discharge may occur during sputtering. In such a case, abnormal discharge may be suppressed by using the RF sputtering method.

The atomic ratio of Nd and Sn in the target can be controlled by adjusting the mixing ratio of a tin compound and a neodymium compound before sintering. It is supposed that, due to the adjustment of the mixing ratio before sintering, an oxide $Nd_2Sn_2O_7$ comprising a tin compound and a neodymium compound, which satisfies a stoichiometric ratio, is formed, and a remaining tin compound exists as a crystalline substance, an amorphous substance, or the like.

Examples of the method for producing Target II include a method in which a compound containing a tin atom and a compound containing a neodymium atom are used as raw materials, followed by sintering of the mixture of these materials.

As the compound containing a tin atom, tin oxide (stannous oxide, stannic oxide), metastannic acid or the like can be given. Tin oxide (stannic oxide) is preferable.

Specific examples of the compound containing a neodymium atom are the same as those exemplified above for Target I.

It is preferred that the above-mentioned starting raw materials be pulverized and mixed by means of a beads mill or the like. By doing this, the raw materials can be homogenously mixed and the particle size of the raw materials can be reduced.

The average particle size of the raw materials is 3 μm or less at maximum, preferably 1 μm or less, and more preferably 0.8 μm or less. If the average particle size exceeds 3 μm, abnormal discharge may be caused since $Nd_2O_3$ remains in the target as insulating particles, for example. Formation of $Nd_2Sn_2O_7$ can be confirmed by X-ray diffractometry.

The raw material powder is molded into a predetermined shape, and the resulting molded product is sintered. The sintering condition is 1000 to 1600° C., preferably 1200 to 1500° C., more preferably 1250 to 1450° C. If the temperature is lower than 1000° C., $Nd_2Sn_2O_7$ may not be formed due to low reactivity of $Nd_2O_3$. If the temperature exceeds 1600° C., sublimation or thermal decomposition of $Nd_2O_3$ occurs, and the composition may be varied or the generated $Nd_2Sn_2O_7$ may be decomposed.

In the invention, the sintered body contains $Nd_2Sn_2O_7$. The oxide with this structure can be formed by the above-mentioned sintering. The particle size of the generated $Nd_2Sn_2O_7$ can be measured by EPMA mapping. The particle size of $Nd_2Sn_2O_7$ is 10 μm or less, preferably 5 μm or less. If $Nd_2Sn_2O_7$ particles with a particle size exceeding 10 μm are present, abnormal discharge may occur due to difference in conductivity around the particles. If the particle size is 10 μm or less, such abnormal discharge can be suppressed to enable stable sputtering.

In the third aspect of the oxide target of the invention, the oxide target comprises a sintered body of an oxide containing indium (In), tin (Sn) and neodymium (Nd), wherein it contains an oxide shown by $Nd_2Sn_2O_7$ and/or $NdInO_3$ (Target III).

As compared with a target which simply comprises $In_2O_3$, $SnO_2$ and $Nd_2O_3$, this Target III has a high conductivity. In addition, it is free from target surface blackening and abnormal discharge during sputtering, whereby stable sputtering state can be maintained.

Target III contains an oxide with a structure shown by $Nd_2Sn_2O_7$ and/or $NdInO_3$ and preferred examples of the sintered body constituting the target include the following:

(a) A mixture of $Nd_2Sn_2O_7$ and $In_2O_3$
(b) A mixture of $Nd_2Sn_2O_7$, $In_2O_3$ and $SnO_2$
(c) A mixture of $Nd_2Sn_2O_7$, $NdInO_3$ and $In_2O_3$
(d) A mixture of $Nd_2Sn_2O_7$, $NdInO_3$ and $SnO_2$ Of these, the sintered body formed of (a), (b) or (c) is preferable. The sintered body formed of (a) is more preferable.

In this target, the atomic ratio of Nd (Nd/(Nd+In+Sn)) is preferably 0.001 to 0.5, more preferably 0.01 to 0.2, particularly preferably 0.01 to 0.15. If the ratio is less than 0.001, effects of adding Nd may not be obtained. If the ratio exceeds 0.5, $Nd_2O_3$ exists alone, and since the resistance value of the target increases significantly, a trouble such as abnormal discharge may occur during sputtering. In addition, due to a decrease in the strength of the target itself, problems such as target breakage during sputtering may occur.

In addition, it is preferred that the content of Sn to the total cation metal elements [Sn/(total cation metals): atomic ratio] be larger than the content of Nd to the total cation metal elements [Nd/(total cation metals): atomic ratio]. That is, it is preferred that the relationship represented by the following formula be satisfied:

$$Nd/(\text{total cation metal elements}) < Sn/(\text{total cation metal elements})$$

The reason is that $Nd_2Sn_2O_7$ tends to be formed since Nd and Sn are reacted easily. That is, if Nd exists in an amount exceeding the amount of Sn, almost all of Sn is consumed by Nd, and $NdInO_3$ is mainly formed. As a result, the amount of Sn to be doped with $In_2O_3$ may decrease, leading to an increase in the bulk resistance of the target.

If the content of Nd is rendered smaller than that of Sn such that the above formula is satisfied, while Nd is consumed by Sn, excessive Sn is doped with $In_2O_3$. As a result, resistance of the target is decreased, and the stable sputtering state can be maintained.

The content of Sn [atomic ratio: Sn/(Nd+In+Sn)] satisfies the above-mentioned relationship, and is preferably in the range of 0.03 to 0.45, particularly preferably 0.05 to 0.3.

The atomic ratio of the above-mentioned Nd, In and Sn is obtained by adjusting the mixing ratio of an indium compound, a tin compound and a neodymium compound before sintering.

It is supposed that, due to the adjustment of the mixing ratio before sintering, an $Nd_2Sn_2O_7$ compound comprising a tin compound and a neodymium compound, which satisfies a stoichiometric ratio; is formed, an $NdInO_3$ compound comprising an indium compound and a neodymium compound, which satisfies a stoichiometric ratio, is formed, and a remaining indium compound and a remaining tin compound exist as a crystalline substance, an amorphous substance, or the like.

Examples of the method for producing Target III include a method in which a compound containing an indium atom, a compound containing a tin atom and a compound containing a neodymium atom are used as raw materials, followed by sintering of the mixture of these materials.

Specific examples of the compound containing an indium atom, the compound containing a tin atom, and the compound containing a neodymium atom are the same as those exemplified above for Target I or Target II.

The raw material powder is molded into a predetermined shape, and the resulting molded product is sintered. The sintering condition is 1000 to 1600° C., preferably 1200 to 1500° C., more preferably 1250 to 1450° C. If the temperature is lower than 1000° C., $Nd_2Sn_2O_7$ or $NdInO_3$ may not be formed due to low reactivity of $Nd_2O_3$. If the temperature exceeds 1600° C., sublimation or thermal decomposition of $In_2O_3$ occurs, and the composition may be varied or the generated $Nd_2Sn_2O_7$ or $NdInO_3$ may be decomposed.

In the invention, the sintered body comprises $Nd_2Sn_2O_7$ and/or $NdInO_3$. The oxide with this structure can be formed by a sintering reaction (thermal reaction).

The sintered body constituting the target of the invention has a high degree of conductivity. In particular, the above-mentioned Targets I and III had a high degree of conductivity. Specifically, in Targets I and III, it is possible to render the bulk resistance of the sintered body 5 Ωm or less. Furthermore, it is possible to render the bulk resistance of the sintered body 1 Ωm or less. In the invention, in particular, the bulk resistance can be reduced by allowing the composition to be Nd/(Nd+Sn+In)<Sn/(Nd+Sn+In).

[Ytterbium (Yb)]

In the first aspect of the oxide target of the invention, the target comprises a sintered body of an oxide containing indium (In) and ytterbium (Yb), wherein it contains an oxide shown by $YbInO_3$ (Target I).

As compared with a target which simply comprises $In_2O_3$ and $Yb_2O_3$, this Target I has a high conductivity. In addition, it suffers from only a slight degree of target surface blackening and is free from abnormal discharge during sputtering, whereby stable sputtering state can be maintained. As a result, a transparent conductive film having a light transmittance equivalent to that of an ITO film and an oxide semiconductor film having a light transmittance equivalent to that of an oxide semiconductor film composed of indium oxide and zinc oxide can be obtained stably.

Target I contains an oxide with a structure shown by $YbInO_3$ and preferred examples of the sintered body constituting the target include the following:

(a) $YbIn_2O_3$
(b) A mixture of $YbInO_3$ and $In_2O_3$
(c) A mixture of $YbInO_3$ and $Yb_2O_3$ Of these, the sintered body formed of (a) or (b) is preferable. In this case, $Yb_2O_3$ does not exist alone, and therefore, abnormal discharge during sputtering can be suppressed. In the case of the sintered body formed of (c), $Yb_2O_3$ may exist alone, causing abnormal discharge.

In this target, the ratio of Yb to the total of Yb and In (atomic ratio: (Yb/(Yb+In)) is preferably 0.001 to 0.5, more preferably 0.01 to 0.2, particularly preferably 0.01 to 0.15. If the ratio is less than 0.001, effects of adding Yb atoms may not be obtained. If the ratio exceeds 0.5, $Yb_2O_3$ exists alone, and the resistance value of the target increases significantly since $Yb_2O_3$ as an insulating substance exists in the target in the form of particles. As a result, a trouble such as abnormal discharge may occur during sputtering. In addition, due to a decrease in the strength of the target itself, a problem may occur that the target is broken or deformed during sintering in the target production process.

The atomic ratio of Yb and In in the target can be controlled by adjusting the mixing ratio of an indium compound and an ytterbium compound, which are raw materials, before sintering. It is supposed that, due to the adjustment of the mixing ratio before sintering, an ytterbium/indium compound comprising an indium compound and an ytterbium compound, which satisfies a stoichiometric ratio, such as $YbInO_3$, is formed, and a remaining indium compound exists as a crystalline substance, an amorphous substance, or the like.

Examples of the method for producing Target I include a method in which a compound containing an indium atom and a compound containing an ytterbium atom are used as raw materials, followed by sintering of the mixture of these materials.

As the compound containing an indium atom, indium oxide, indium hydroxide or the like can be given. Indium oxide is preferable.

As the compound containing an ytterbium atom, ytterbium oxide, ytterbium nitrate or the like can be given. Ytterbium oxide is preferable.

It is preferred that the above-mentioned starting raw materials be pulverized and mixed by means of a beads mill or the like. By doing this, the raw materials can be mixed homogenously and the particle size of the raw materials can be reduced.

The average particle size of the raw materials is 3 μm or less at maximum, preferably 1 μm or less, and more preferably 0.8 μm or less. If the average particle size exceeds 3 μm, abnormal discharge may be caused since $Yb_2O_3$ remains in the target as insulating particles, for example. Formation of $YbInO_3$ can be confirmed by X-ray diffractometry.

The raw material powder is molded in a predetermined shape, and the resulting molded product is sintered. The sintering condition is 1000 to 1600° C., preferably 1200 to 1500° C., and more preferably 1250 to 1450° C. If the sintering is performed at a temperature lower than 1000° C., reactivity of $Yb_2O_3$ is low, and there may be a possibility that $YbInO_3$ is not formed. If the sintering is performed at a temperature exceeding 1600° C., sublimation or thermal decomposition of $In_2O_3$ may occur, and the composition may be varied or the generated $YbInO_3$ may be decomposed.

In the invention, the sintered body contains $YbInO_3$. The oxide with this structure can be formed by the above-mentioned sintering. The particle size of the generated $YbInO_3$ can be measured by EPMA mapping. The particle size of $YbInO_3$ is 10 μm or less, preferably 5 μm or less. If particles with a particle size exceeding 10 μm are present, abnormal discharge may occur due to difference in conductivity around the particles. If the particle size is 10 μm or less, such abnormal discharge can be suppressed to enable stable sputtering.

In the second aspect of the oxide target of the invention, the oxide target comprises a sintered body of an oxide containing tin (Sn) and ytterbium (Yb), wherein it contains an oxide shown by $Yb_2Sn_2O_7$ (Target II).

As compared with a target which simply comprises $SnO_2$ and $Yb_2O_3$, this Target II is free from target surface blackening and abnormal discharge during sputtering, whereby stable sputtering state can be maintained.

Target II contains an oxide with a structure shown by $Yb_2Sn_2O_7$ and preferred examples of the sintered body constituting the target include the following:
(a) $Yb_2Sn_2O_7$
(b) A mixture of $Yb_2Sn_2O_7$ and $SnO_2$
(c) A mixture of $Yb_2Sn_2O_7$ and $Yb_2O_3$
(d) A mixture of $Yb_2Sn_2O_7$, $SnO_2$ and $Yb_2O_3$
Of these, the sintered body (b) is preferable.

In this target, the ratio of Yb to the total of Yb and Sn (atomic ratio: (Yb/(Yb+Sn)) is preferably 0.001 to 0.5, more preferably 0.01 to 0.2, particularly preferably 0.01 to 0.15. If the ratio is less than 0.001, effects of adding Yb may not be obtained. If the ratio exceeds 0.5, $Yb_2O_3$ exists alone, since the resistance value of the target increases significantly, problems such as abnormal discharge may occur during sputtering.

The atomic ratio of the above-mentioned Yb and Sn can be controlled by adjusting the mixing ratio of an indium compound and an ytterbium compound before sintering. It is supposed that, due to the adjustment of the mixing ratio before sintering, an ytterbium/tin compound comprising a tin compound and an ytterbium compound which satisfies a stoichiometric ratio, such as $Yb_2Sn_2O_7$, is formed, and a remaining tin compound exists as a crystalline substance, an amorphous substance, or the like.

Examples of the method for producing Target II include a method in which a compound containing a tin atom and a compound containing an ytterbium atom are used as raw materials, followed by sintering of the mixture of these materials.

As examples of the compound containing a tin atom, tin oxide (stannous oxide, stannic oxide), metastannic acid or the like can be given. Tin oxide (stannic oxide) is preferable.

Specific examples of the compound containing an ytterbium atom are the same as those exemplified above for Target I.

It is preferred that the above-mentioned starting raw materials be pulverized and mixed by means of a beads mill or the like. By doing this, the raw materials can be homogenously mixed and the particle size of the raw materials can be reduced.

The average particle size of the raw materials is 3 μm or less, preferably 1 μm or less, and more preferably 0.8 μm or less. If the average particle size exceeds 3 μm, abnormal discharge may be caused since $Yb_2O_3$ remains in the target as insulating particles, for example. Formation of $Yb_2Sn_2O_7$ can be confirmed by X-ray diffractometry.

The raw material powder is molded in a predetermined shape, and the resulting molded product is sintered. The sintering condition is 1000 to 1600° C., preferably 1200 to 1500° C., and more preferably 1250 to 1450° C. If the sintering is performed at a temperature lower than 1000° C., reactivity of $Yb_2O_3$ is low, and there may be a possibility that $Yb_2Sn_2O_7$ is not formed. If the sintering is performed at a temperature exceeding 1600° C., sublimation or thermal decomposition of $Yb_2O_3$ may occur, and the composition may be varied or the generated $Yb_2Sn_2O_7$ may be decomposed.

In the invention, the sintered body contains $Yb_2Sn_2O_7$. The oxide with this structure can be formed by the above-mentioned sintering. The particle size of the generated $Yb_2Sn_2O_7$ can be measured by EPMA mapping. The particle size of $Yb_2Sn_2O_7$ is 10 μm or less, preferably 5 μm or less. If particles with a particle size exceeding 10 μm are present, abnormal discharge may occur due to difference in conductivity around the particles. If the particle size is 10 μm or less, such abnormal discharge can be suppressed to enable stable sputtering.

In the third aspect of the oxide target of the invention, the oxide target comprises a sintered body of an oxide containing indium (In), tin (Sn) and ytterbium (Yb), wherein it contains an oxide shown by $Yb_2Sn_2O_7$ (Target III).

As compared with a target which simply comprises $In_2O_3$, $SnO_2$ and $Yb_2O_3$, this Target III has a high conductivity. In addition, it is free from target surface blackening and abnormal discharge during sputtering, whereby stable sputtering state can be maintained.

Target III contains an oxide with a structure shown by $Yb_2Sn_2O_7$ and preferred examples of the sintered body constituting the target include the following:
(a) A mixture of $Yb_2Sn_2O_7$ and $In_2O_3$
(b) A mixture of $Yb_2Sn_2O_7$, $In_2O_3$ and $SnO_2$
(c) A mixture of $Yb_2Sn_2O_7$, $YbInO_3$ and $In_2O_3$
(d) A mixture of $Yb_2Sn_2O_7$, $YbInO_3$ and $SnO_2$
Of these, the sintered body formed of (a) or (b) is preferable.

In this target, the atomic ratio of Yb (Yb/(Yb+In+Sn)) is preferably 0.001 to 0.5, more preferably 0.01 to 0.2, particularly preferably 0.01 to 0.15. If the ratio is less than 0.001, effects of adding Yb may not be obtained. If the ratio exceeds 0.5, $Yb_2O_3$ exists alone, and since the resistance value of the target increases significantly, a trouble such as abnormal discharge may occur during sputtering. In addition, due to a decrease in the strength of the target itself, a problem may occur that the target is broken during sputtering.

In addition, it is preferred that the content of Sn to the total cation metal elements [Sn/(total cation metals): atomic ratio] be larger than the content of Yb to the total cation metal elements [Yb/(total cation metals): atomic ratio]. That is, it is preferred that the relationship represented by the following formula be satisfied:

$$Yb/(\text{total cation metal elements}) < Sn/(\text{total cation metal elements})$$

The reason is that $Yb_2Sn_2O_7$ tends to be formed since Yb and Sn are reacted easily. That is, if Yb exists in an amount exceeding the amount of Sn, almost all of Sn is consumed by Yb, and $YbInO_3$ is mainly formed. As a result, the amount of Sn to be doped with $In_2O_3$ decreases, leading to an increase in the bulk resistance of the target.

If the content of Yb is rendered smaller than that of Sn such that the above formula is satisfied, while Yb is consumed by Sn, excessive Sn is doped with $In_2O_3$. As a result, resistance of the target is decreased, and the stable sputtering state can be maintained.

The content of Sn [atomic ratio: Sn/(Yb+In+Sn)] satisfies, the above-mentioned relationship, and is preferably in the range of 0.03 to 0.45, particularly preferably 0.05 to 0.3.

The atomic ratio of the above-mentioned Yb, In and Sn is obtained by adjusting the mixing ratio of an indium compound, a tin compound and an ytterbium compound before sintering. It is supposed that, due to the adjustment of the mixing ratio before sintering, an ytterbium/tin compound comprising a tin compound and an ytterbium compound, which satisfies a stoichiometric ratio, such as $Yb_2Sn_2O_7$, is formed, and a remaining indium compound and a remaining tin compound exist as a crystalline substance, an amorphous substance, or the like.

Examples of the method for producing Target III include a method in which a compound containing an indium atom, a compound containing a tin atom, and a compound containing an ytterbium atom are used as raw materials, followed by sintering of the mixture of these materials.

Specific examples of the compound containing an indium atom, the compound containing a tin atom and the compound containing an ytterbium compound are the same as those exemplified above for Target I or Target II.

The raw material powder is molded in a predetermined shape, and the resulting molded product is sintered. The sintering condition is 1000 to 1600° C., preferably 1200 to 1500° C., and more preferably 1250 to 1450° C. If the sintering is performed at a temperature lower than 1000° C., reactivity of $Yb_2O_3$ is low, and there may be a possibility that $Yb_2Sn_2O_7$ is not formed. If the sintering is performed at a temperature exceeding 1600° C., sublimation or thermal decomposition of $In_2O_3$ may occur, and the composition may be varied or the generated $Yb_2Sn_2O_7$ may be decomposed.

In the invention, the sintered body contains $Yb_2Sn_2O_7$. The oxide with this structure can be formed by a sintering reaction (thermal reaction).

The particle size of the generated $Yb_2Sn_2O_7$ can be measured by EPMA mapping. The particle size of $Yb_2Sn_2O_7$ is 10 µm or less, preferably 5 µm or less. If particles of $Yb_2Sn_2O_7$ with a particle size exceeding 10 µm are present, abnormal discharge may occur due to difference in conductivity around the particles. If the particle size is 10 µm or less, such abnormal discharge can be suppressed to enable stable sputtering.

The sintered body constituting the target of the invention has a high degree of conductivity. Specifically, it is possible to render the bulk resistance of the sintered body 5 Ωm or less. Furthermore, it is possible to render the bulk resistance of the sintered body 1 Ωm or less. In the invention, in particular, the bulk resistance can be reduced by allowing the composition to be $Yb/(Yb+Sn+In) < Sn/(Yb+Sn+In)$.

In order to suppress occurrence of troubles such as abnormal discharge, it is preferred that the bulk resistance be less than 2 MΩ cm.

[Erbium (Er)]

In the first aspect of the oxide target of the invention, the oxide target comprises a sintered body of an oxide containing indium (In) and erbium (Er), wherein it contains an oxide shown by $ErInO_3$ (Target I).

As compared with a target which simply comprises $In_2O_3$ and $Er_2O_3$, this Target I has a high conductivity. In addition, the target suffers from only a slight degree of target surface blackening and is free from abnormal discharge during sputtering, whereby stable sputtering state can be maintained. As a result, a transparent conductive film having a light transmittance equivalent to that of an ITO film or an oxide semiconductor film having a light transmittance equivalent to that of an oxide semiconductor film composed of indium oxide/zinc oxide can be obtained stably.

Target I contains an oxide with a structure shown by $ErInO_3$ and preferred examples of the sintered body constituting the target include the following:

(a) $ErInO_3$
(b) A mixture of $ErInO_3$ and $In_2O_3$
(c) A mixture of $ErInO_3$ and $Er_2O_3$ Of these, the sintered body (a) or (b) is preferable. In this case, $Er_2O_3$ does not exist alone, and therefore, abnormal discharge during sputtering can be suppressed. In the case of the sintered body (c), $Er_2O_3$ may exist alone, causing abnormal discharge.

In this target, the ratio of Er to the total of Er and In (atomic ratio: (Er/(Er+In)) is preferably 0.001 to 0.5, more preferably 0.01 to 0.2, particularly preferably 0.01 to 0.15. If the ratio is less than 0.001, effects of adding Er atoms may not be obtained. If the ratio exceeds 0.5, $Er_2O_3$ exists alone, and the resistance value of the target increases significantly since $Er_2O_3$ as an insulating substance exists in the target in the form of particles, a trouble such as abnormal discharge may occur during sputtering. In addition, due to a decrease in the strength of the target itself, a problem may occur that the target is broken or deformed during sintering in the target production process.

The atomic ratio of Er and In in the target can be controlled by adjusting the mixing ratio of an indium compound and an erbium compound, which are raw materials, before sintering. It is supposed that, due to the adjustment of the mixing ratio before sintering, an erbium/indium compound comprising an indium compound and an erbium compound, which satisfies a stoichiometric ratio, such as $ErInO_3$, is formed, and a remaining indium compound exists as a crystalline substance, an amorphous substance, or the like.

Examples of the method for producing Target I include a method in which a compound containing an indium atom and a compound containing an erbium atom are used as raw materials, followed by sintering of the mixture of these materials.

As the compound containing an indium atom, indium oxide, indium hydroxide or the like can be given. Indium oxide is preferable.

As the compound containing an erbium atom, erbium oxide, erbium oxalate, erbium nitrate or the like can be given. Erbium oxide is preferable.

It is preferred that these starting raw materials be pulverized and mixed by means of a beads mill or the like. By doing this, the raw materials can be homogeneously mixed, and the particle size of the raw materials can be reduced.

The average particle size of the raw materials is 3 µm or less, preferably 1 µm or less, and more preferably 0.8 µm or less. If the average particle size exceeds 3 µm, abnormal discharge may be caused since $Er_2O_3$-remains in the target as insulating particles. Formation of $ErInO_3$ can be confirmed by X-ray diffractometry.

The raw material powder is molded into a predetermined shape, and the resulting molded product is sintered. The sintering condition is 1000 to 1600° C., preferably 1200 to 1500° C., more preferably 1250 to 1450° C. If the temperature is lower than 1000° C., $ErInO_3$ may not be formed due to low reactivity of $Er_2O_3$. If the temperature exceeds 1600° C., sublimation or thermal decomposition of $In_2O_3$ occurs, and the composition may be varied or the generated $ErInO_3$ may be decomposed.

In the invention, the sintered body contains $ErInO_3$. The oxide with this structure can be formed by the above-mentioned sintering. The particle size of the generated $ErInO_3$ can be measured by EPMA mapping. The particle size of $ErInO_3$ is 10 µm or less, preferably 5 µm or less. If particles of $ErInO_3$ with a size exceeding 10 µm are present, abnormal discharge may occur due to difference in conductivity around the particles. If the particle size is 10 µm or less, such abnormal discharge can be suppressed, enabling stable sputtering.

In the second aspect of the oxide target of the invention, the oxide target comprises a sintered body of an oxide containing tin (Sn) and erbium (Er), wherein it contains an oxide shown by $Er_2Sn_2O_7$ (Target II).

As compared with a target which simply comprises $SnO_2$ and $Er_2O_3$, this Target II is free from target surface blackening and abnormal discharge during sputtering, whereby stable sputtering state can be maintained.

Target II contains an oxide shown by $Er_2Sn_2O_7$, and preferred examples of sintered bodies constituting the target include the following:

(a) $Er_2Sn_2O_7$
(b) A mixture of $Er_2Sn_2O_7$ and $SnO_2$
(c) A mixture of $Er_2Sn_2O_7$ and $Er_2O_3$ (d) A mixture of $Er_2Sn_2O_7$, $SnO_2$ and $Er_2O_3$ Of these, the sintered body (a) or (b) is preferable.

In this target, the ratio of Er to the total of Er and Sn (atomic ratio: (Er/(Er+Sn)) is preferably 0.001 to 0.5, more preferably 0.01 to 0.2, particularly preferably 0.01 to 0.15. If the ratio is less than 0.001, effects of adding Er may not be obtained. If the ratio exceeds 0.5, $Er_2O_3$ exists alone, and since the resistance value of the target increases significantly, a trouble such as abnormal discharge may occur during sputtering.

The atomic ratio of the above-mentioned Er and Sn can be controlled by adjusting the mixing ratio of a tin compound and an erbium compound before sintering. It is supposed that, due to the adjustment of the mixing ratio before sintering, an erbium/tin oxide comprising a tin compound and an erbium compound, which satisfies a stoichiometric ratio, such as $Er_2Sn_2O_7$, is formed, and a remaining tin compound exists as a crystalline substance, an amorphous substance, or the like.

Examples of the method for producing Target II include a method in which a compound containing a tin atom and a compound containing an erbium atom are used as raw materials, followed by sintering of the mixture of these materials.

As examples of the compound containing a tin atom, tin oxide (stannous oxide, stannic oxide), metastannic acid or the like can be given. Tin oxide (stannic oxide) is preferable.

Specific examples of the compound containing an erbium atom are the same as those exemplified above for Target I.

It is preferred that these starting raw materials be pulverized and mixed by means of a beads mill or the like. By doing this, the raw material can be uniformly mixed, and the particle size of the raw materials can be reduced.

The average particle size of the raw materials is 3 μm or less, preferably 1 μm or less, and more preferably 0.8 μm or less. If the average particle size exceeds 3 μm, abnormal discharge may be caused since $Er_2O_3$ remains in the target as insulating particles, for example. Formation of $Er_2Sn_2O_7$ can be confirmed by X-ray diffractometry.

The raw material powder is molded into a predetermined shape, and the resulting molded product is sintered. The sintering condition is 1000 to 1600° C., preferably 1200 to 1500° C., more preferably 1250 to 1450° C. If the temperature is lower than 1000° C., $Er_2Sn_2O_7$ may not be formed due to low reactivity of $Er_2O_3$. If the temperature exceeds 1600° C., sublimation or thermal decomposition of $Er_2O_3$ occurs, and the composition may be varied or the generated $Er_2Sn_2O_7$ may be decomposed.

In the invention, the sintered body contains $Er_2Sn_2O_7$. The oxide with this structure can be formed by the above-mentioned sintering. The particle size of the generated $Er_2Sn_2O_7$ can be measured by EPMA mapping. The particle size of $Er_2Sn_2O_7$ is 10 μm or less, preferably 5 μm or less. If particles of $Er_2Sn_2O_7$ with a particle size exceeding 10 μm are present, abnormal discharge may occur due to difference in conductivity around the particles. If the particle size is 10 μm or less, such abnormal discharge can be suppressed, enabling stable sputtering.

In the third aspect of the oxide target of the invention, the oxide target comprises a sintered body of an oxide containing indium (In), tin (Sn) and erbium (Er), wherein it contains an oxide shown by $Er_2Sn_2O_7$ (Target III).

As compared with a target which simply comprises $In_2O_3$, $SnO_2$ and $Er_2O_3$, this Target III has a high conductivity. In addition, it is free from abnormal discharge during sputtering and target surface blackening, whereby stable sputtering state can be maintained.

Target III contains an oxide with a structure shown by $Er_2Sn_2O_7$ and preferred examples of the sintered body constituting the target include the following:

(a) A mixture of $Er_2Sn_2O_7$ and $In_2O_3$
(b) A mixture of $Er_2Sn_2O_7$, $In_2O_3$ and $SnO_2$
(c) A mixture of $Er_2Sn_2O_7$, $ErInO_3$ and $In_2O_3$
(d) A mixture of $Er_2Sn_2O_7$, $ErInO_3$ and $SnO_2$ Of these, the sintered body formed of (a) or (b) is preferable.

In this target, the atomic ratio of Er (Er/(Er+In+Sn)) is preferably 0.001 to 0.5, more preferably 0.01 to 0.2, particularly preferably 0.01 to 0.15. If the ratio is less than 0.001, effects of adding Er may not be obtained. If the ratio exceeds 0.5, $Er_2O_3$ exists alone, and since the resistance value of the target increases significantly, a trouble such as abnormal discharge may occur during sputtering. In addition, due to a decrease in the strength of the target itself, a problem may occur that the target is broken during sputtering.

In addition, it is preferred that the ratio of the content of Sn to the total cation metal elements [Sn/(total cation metals): atomic ratio] be larger than the content of Er to the total cation metal elements [Er/(total cation metals): atomic ratio]. That is, it is preferred that the relationship represented by the following formula be satisfied:

$$Er/(\text{total cation metal elements}) < Sn/(\text{total cation metal elements})$$

The reason is that $Er_2Sn_2O_7$ tends to be formed since Er and Sn are reacted easily. That is, if Er exists in an amount exceeding the amount of Sn, almost all of Sn is consumed by Er, and $ErInO_3$ is mainly formed. As a result, the amount of Sn to be doped with $In_2O_3$ may decrease, leading to an increase in the bulk resistance of the target.

If the content of Er is rendered smaller than that of Sn such that the above formula is satisfied, while Er is consumed by Sn, excessive Sn is doped to $In_2O_3$. As a result, resistance of the target is decreased, and the stable sputtering state can be maintained.

The content of Sn [atomic ratio: Sn/(Er+In+Sn)] satisfies the above-mentioned relationship, and is preferably in the range of 0.03 to 0.45, particularly preferably 0.05 to 0.3.

The atomic ratio of the above-mentioned Er, In and Sn is obtained by adjusting the mixing ratio of an indium compound, a tin compound and an erbium compound before sintering. It is supposed that, due to the adjustment of the mixing ratio before sintering, an erbium/tin compound comprising an indium compound and an erbium compound, which satisfies a stoichiometric ratio, such as $Er_2Sn_2O_7$, is formed, and a remaining indium compound and a remaining tin compound exist as a crystalline substance, an amorphous substance, or the like.

Examples of the method for producing Target III include a method in which the compound containing an indium atom, the compound containing a tin atom and the compound containing an erbium atom are used as raw materials, followed by sintering of the mixture of these materials.

Specific examples of a compound containing an indium atom, a compound containing a tin atom and a compound containing an erbium atom are the same as those exemplified above for Target I or Target II.

The raw material powder is molded into a predetermined shape, and the resulting molded product is sintered. The sintering condition is 1000 to 1600° C., preferably 1200 to 1500° C., more preferably 1250 to 1450° C. If the temperature is lower than 1000° C., $Er_2Sn_2O_7$ may not be formed due to low reactivity of $Er_2O_3$. If the temperature exceeds 1600° C., sublimation or thermal decomposition of $In_2O_3$ occurs, and the composition may be varied or the generated $Er_2Sn_2O_7$ may be decomposed.

In the invention, the sintered body contains $Er_2Sn_2O_7$, an oxide with this structure can be formed by a sintering reaction (thermal reaction).

The particle size of the generated $Er_2Sn_2O_7$ can be measured by EPMA mapping. The particle size of $Er_2Sn_2O_7$ is 10 µm or less, preferably 5 µm or less. If particles of $Er_2Sn_2O_7$ with a particle size exceeding 10 µm are present, abnormal discharge may occur due to difference in conductivity around the particles. If the particle size is 10 µm or less, such abnormal discharge can be suppressed, enabling stable sputtering.

The sintered body constituting the target of the invention has a high conductivity. Specifically, it is possible to render the bulk resistance of the sintered body 5 Ωcm or less. Furthermore, it is possible to render the bulk resistance of the sintered body 1 Ωcm or less. In the invention, in particular, the bulk resistance can be reduced by allowing the composition to be Er/(Er+Sn+In)<Sn/(Er+Sn+In).

In order to suppress occurrence of troubles such as abnormal discharge, it is preferred that the bulk resistance be less than 2 MΩm.

[Dysprosium (Dy)]

According to the first aspect of the oxide target of the invention, the oxide target comprises a sintered body of an oxide containing indium (In) and dysprosium (Dy), wherein it contains an oxide shown by $DyInO_3$ (Target I).

As compared with a target which simply comprises $In_2O_3$ and $Dy_2O_3$, this Target I has a high conductivity. This target suffers from only a slight degree of target surface blackening and is free from abnormal discharge during sputtering, whereby stable sputtering state can be maintained. As a result, a transparent conductive film having a light transmittance equivalent to that of an ITO film or an oxide semiconductor film having a light transmittance equivalent to that of an oxide semiconductor film composed of indium oxide/zinc oxide can be obtained stably.

Target I contains an oxide with a structure shown by $DyInO_3$. Preferred examples of sintered bodies constituting the target are given below.

(a) $DyInO_3$
(b) A mixture of $DyInO_3$ and $In_2O_3$
(c) A mixture of $DyInO_3$ and $Dy_2O_3$ Of these, the sintered body (a) or (b) is preferable. In this case, $Dy_2O_3$ does not exist alone, and therefore, abnormal discharge during sputtering can be suppressed. In the case of the sintered body (c), $Dy_2O_3$ may exist alone, causing abnormal discharge.

In this target, the ratio of Dy to the total of Dy and In (atomic ratio: Dy/(Dy+In)) is preferably 0.001 to 0.5, more preferably 0.01 to 0.2, particularly preferably 0.01 to 0.15. If the ratio of Dy is less than 0.001, effects of adding Dy atoms may not be obtained. If the ratio of Dy exceeds 0.5, $Dy_2O_3$ exists alone, and the resistance value of the target increases significantly since $Dy_2O_3$ as an insulating substance exists in the target in the form of particles, a trouble such as abnormal discharge may occur during sputtering. In addition, due to a decrease in the strength of the target itself, a problem may occur that the target is broken or deformed during sintering in the target production process.

The atomic ratio of Dy and In in the target can be controlled by adjusting the mixing ratio of an indium compound and a dysprosium compound, which are raw materials, before sintering. It is supposed that, due to the adjustment of the mixing ratio before sintering, a dysprosium-indium compound comprising an indium compound and a dysprosium compound, which satisfies a stoichiometric ratio, such as $DyInO_3$, is formed, and a remaining indium compound exists as a crystalline substance, an amorphous substance, or the like.

Examples of the method for producing Target I include a method in which a compound containing an indium atom and a compound containing a dysprosium atom are used as raw materials, followed by sintering of the mixture of these materials.

As the compound containing an indium atom, indium oxide, indium hydroxide or the like can be given. Indium oxide is preferable.

As the compound containing a dysprosium atom, dysprosium oxide, dysprosium oxalate, dysprosium carbonate, dysprosium nitrate or the like can be given. Dysprosium oxide and dysprosium carbonate are preferable.

It is preferred that these starting raw materials be pulverized and mixed by means of a beads mill or the like. By doing this, the raw materials can be homogeneously mixed, and the particle size of the raw materials can be reduced.

The average particle size of the raw materials is 3 µm or less, preferably 1 µm or less, and more preferably 0.8 µm or less. If the average particle size exceeds 3 µm, abnormal discharge may be caused since $Dy_2O_3$ remains in the target as insulating particles. Formation of $Dy_2InO_3$ can be confirmed by X-ray diffractometry.

The raw material powder is molded into a predetermined shape, and the resulting molded product is sintered. The sintering condition is 1000 to 1600° C., preferably 1200 to 1500° C., more preferably 1250 to 1450° C. If the temperature is lower than 1000° C., $DyInO_3$ may not be formed due to low reactivity of $Dy_2O_3$. If the temperature exceeds 1600° C., sublimation or thermal decomposition of $In_2O_3$, and the composition may be varied or the generated $DyInO_3$ may be decomposed.

In the invention, the sintered body contains $DyInO_3$. The oxide with this structure can be formed by the above-mentioned sintering. The particle size of the generated $DyInO_3$ can be measured by EPMA mapping. The particle size of $DyInO_3$ is 10 µm or less, preferably 5 µm or less. If particles of $DyInO_3$ with a particle size exceeding 10 µm are present, abnormal discharge may occur due to difference in conductivity around the particles. If the particle size is 10 µm or less, such abnormal discharge can be suppressed, enabling stable sputtering.

In the second aspect of the oxide target of the invention, the oxide target comprises a sintered body of an oxide containing tin (Sn) and dysprosium (Dy), wherein it contains an oxide shown by $Dy_2Sn_2O_7$ (Target II).

As compared with a target which simply comprises $SnO_2$ and $Dy_2O_3$, this Target II is free from target surface blackening and abnormal discharge during sputtering, whereby stable sputtering state can be maintained.

Target II contains an oxide with a structure shown by $Dy_2Sn_2O_7$. Preferred examples of sintered bodies constituting the target are given below.

(a) $Dy_2Sn_2O_7$
(b) A mixture of $Dy_2Sn_2O_7$ and $SnO_2$
(c) A mixture of $Dy_2Sn_2O_7$ and $Dy_2O_3$
(d) A mixture of $Dy_2Sn_2O_7$, $SnO_2$ and $Dy_2O_3$ Of these, the sintered body (b) is preferable.

In this target, the ratio of Dy to the total of Dy and Sn (atomic ratio: Dy/(Dy+Sn)) is preferably 0.001 to 0.5, more preferably 0.01 to 0.2, particularly preferably 0.01 to 0.15. If the ratio of Dy is less than 0.001, effects of adding Dy may not be obtained. If the ratio of Dy exceeds 0.5, $Dy_2O_3$ exists alone, and since the resistance value of the target increases significantly, a trouble such as abnormal discharge during sputtering may occur. In such a case, abnormal discharge may be suppressed by using the RF sputtering method.

The atomic ratio of the above-mentioned Dy and Sn in the target can be controlled by adjusting the mixing ratio of a tin compound and a dysprosium compound before sintering. It is supposed that, due to the adjustment of the mixing ratio before sintering, a dysprosium-tin oxide comprising a tin compound and a dysprosium compound, which satisfies a stoichiometric ratio, such as $Dy_2Sn_2O_7$, is formed, and a remaining tin compound exists as a crystalline substance, an amorphous substance, or the like.

Examples of the method for producing Target II include a method in which a compound containing a tin atom and a compound containing a dysprosium atom are used as raw materials, followed by sintering of the mixture of these materials.

As examples of the compound containing a tin atom, tin oxide (stannous oxide, stannic oxide), metastannic acid or the like can be given. Tin oxide (stannic oxide) is preferable.

Examples of the compound containing a dysprosium atom are the same as those exemplified above for Target I.

It is preferred that these starting raw materials be pulverized and mixed by means of a beads mill or the like. By doing this, the raw materials can be uniformly mixed, and the particle size of the raw materials can be reduced.

The average particle size of the raw materials is 3 μm or less, preferably 1 μm or less, and more preferably 0.8 μm or less. If the average particle size exceeds 3 μm, abnormal discharge may be caused since $Dy_2O_3$ remains in the target as insulating particles, for example. Formation of $Dy_2Sn_2O_7$ can be confirmed by X-ray diffractometry.

The raw material powder is molded into a predetermined shape, and the resulting molded product is sintered. The sintering condition is 1000 to 1600° C., preferably 1200 to 1500° C., more preferably 1250 to 1450° C. If the temperature is lower than 1000° C., $Dy_2Sn_2O_7$ may not be formed due to low reactivity of $Dy_2O_3$. If the temperature exceeds 1600° C., sublimation or thermal decomposition of $Dy_2O_3$ occurs, and the composition may be varied or the generated $Dy_2Sn_2O_7$ may be decomposed.

In the invention, the sintered body contains $Dy_2Sn_2O_7$. An oxide with this structure can be formed by the above-mentioned sintering. The particle size of the generated $Dy_2Sn_2O_7$ can be measured by EPMA mapping. The particle size of $Dy_2Sn_2O_7$ is 10 μm or less, preferably 5 μm or less. If particles of $Dy_2Sn_2O_7$ with a particle size exceeding 10 μm are present, abnormal discharge may occur due to difference in conductivity around the particles. If the particle size is 10 μm or less, such abnormal discharge can be suppressed, enabling stable sputtering.

In the third aspect of the oxide target of the invention, the oxide target comprises a sintered body of an oxide containing indium (In), tin (Sn) and dysprosium (Dy), wherein it contains an oxide shown by $Dy_2Sn_2O_7$ (Target III).

As compared with a target which simply comprises $In_2O_3$, $SnO_2$ and $Dy_2O_3$, this Target III has a high conductivity. In addition, it is free from abnormal discharge during sputtering and target surface blackening, whereby stable sputtering state can be maintained.

Target III contains an oxide with a structure shown by $Dy_2Sn_2O_7$ and preferred examples of sintered bodies constituting the target include the following:
   (a) A mixture of $Dy_2Sn_2O_7$ and $In_2O_3$
   (b) A mixture of $Dy_2Sn_2O_7$, $In_2O_3$ and $SnO_2$
   (c) A mixture of $Dy_2Sn_2O_7$, $DyInO_3$ and $In_2O_3$
   (d) A mixture of $Dy_2Sn_2O_7$, $DyInO_3$ and $SnO_2$ Of these, the sintered body formed of (a) or (b) is preferable.

In this target, the atomic ratio of Dy (Dy/(Dy+In+Sn)) is preferably 0.001 to 0.5, more preferably 0.01 to 0.2, particularly preferably 0.01 to 0.15. If the ratio of Dy is less than 0.001, effects of adding Dy may not be obtained. If the ratio of Dy exceeds 0.5, $Dy_2O_3$ exists alone, and since the resistance value of the target increases significantly, a trouble such as abnormal discharge may occur during sputtering.

In addition, due to a decrease in the strength of the target itself, a problem may occur that the target is broken during sputtering.

In addition, it is preferred that the ratio of the content of Sn to the total cation metal elements [Sn/(total cation metals): atomic ratio] be larger than the content of Dy to the total cation metal elements [Dy/(total cation metals): atomic ratio]. That is, it is preferred that the relationship represented by the following formula be satisfied:

Dy/(total cation metal elements)<Sn/(total cation metal elements)

The reason is that $Dy_2Sn_2O_7$ tends to be formed since Dy and Sn are reacted easily. That is, if Dy exists in an amount exceeding the amount of Sn, almost all of Sn is consumed by Dy, and $DyInO_3$ is mainly formed. As a result, the amount of Sn to be doped with $In_2O_3$ decreases, leading to an increase in the bulk resistance of the target.

If the content of Dy is rendered smaller than that of Sn such that the above formula is satisfied, while Dy is consumed by Sn, excessive Sn is doped with $In_2O_3$. As a result, resistance of the target is decreased, and the stable sputtering state can be maintained.

The content of Sn [atomic ratio: Sn/(Dy+In+Sn)] satisfies the above-mentioned relationship, and is preferably in the range of 0.03 to 0.45, particularly preferably 0.05 to 0.3.

The atomic ratio of the above-mentioned Dy, In and Sn is obtained by adjusted by adjusting the mixing ratio of an indium compound, a tin compound and a dysprosium compound before sintering. It is supposed that, due to the adjustment of the mixing ratio before sintering, a dysprosium/tin compound comprising a tin compound and a dysprosium compound, which satisfies a stoichiometric ratio, such as $Dy_2Sn_2O_7$, is formed, and a remaining indium compound and a remaining tin compound exist as a crystalline substance, an amorphous substance, or the like.

Examples of the method for producing Target III include a method in which a compound containing an indium atom, a compound containing a tin atom and a compound containing a dysprosium atom are used as raw materials, followed by sintering of the mixture of these materials.

Specific examples of the compound containing an indium atom, the compound containing a tin atom and the compound containing a dysprosium atom are the same as those exemplified above for Target I or Target II.

The raw material powder is molded into a predetermined shape, and the resulting molded product is sintered. The sintering condition is 1000 to 1600° C., preferably 1200 to 1500° C., more preferably 1250 to 1450° C. If the temperature is lower than 1000° C., $Dy_2Sn_2O_7$ may not be formed due to low reactivity of $Dy_2O_3$. If the temperature exceeds 1600° C., sublimation or thermal decomposition of $In_2O_3$ occurs, and the composition may be varied or the generated $Dy_2Sn_2O_7$ may be decomposed.

In the invention, the sintered body contains $Dy_2Sn_2O_7$. An oxide with this structure can be formed by a sintering reaction (thermal reaction).

The particle size of the formed $Dy_2Sn_2O_7$ can be measured by EPMA mapping. The particle size of $Dy_2Sn_2O_7$ is 10 μm or less, preferably 5 μm or less. If particles of $Dy_2Sn_2O_7$ with a particle size exceeding 10 μm are present, abnormal discharge may occur due to difference in conductivity around the particles. If the particle size is 10 μm or less, such abnormal discharge can be suppressed, enabling stable sputtering.

The sintered body constituting the target of the invention has a high degree of conductivity. Specifically, it can have a bulk resistance of 5 Ωcm or less. Furthermore, the sintered body constituting the target of the invention can have a bulk resistance of 1 Ωm or less. In the invention, in particular, the bulk resistance can be rendered small by allowing the sintered body to have a composition satisfying the relationship of $Dy/(Dy+Sn+In)<Sn/(Dy+Sn+In)$.

In order to suppress troubles such as abnormal discharge, it is preferred that the bulk resistance be less than 2 MΩcm.

In the above-mentioned Targets I to III according to the invention, except for the case where the element belonging to Group A or Group B is Er, the density of the sintered body constituting the target is preferably 6.5 g/cm$^3$ or more, more preferably 6.6 to 7.2 g/cm$^3$. If the density of the sintered body is less than 6.5 g/cm$^3$, the surface of the target may be blackened to cause abnormal discharge.

If the element belonging to Group A or Group B is Er, the density is preferably 4.5 g/cm$^3$ or more, more preferably 4.6 to 7.0 g/cm$^3$. If the density of the sintered body is less than 4.5 g/cm$^3$, the surface of the target may be blackened to cause abnormal discharge.

In order to obtain a high-density sintered body, it is preferable to perform molding by the cold isostatic pressing (CIP) before sintering, or perform sintering by the hot isostatic pressing (HIP) or the like.

A conductive film can be formed by using the above-mentioned target of the invention. Examples of the film-forming method include the RF magnetron sputtering method, the DC magnetron sputtering method, the electron beam-evaporation method, and the ion-plating method. Of these, the RF magnetron sputtering method can be preferably used. If the bulk resistance of the target exceeds 1 Ωcm, the RF magnetron sputtering can maintain stable sputtering state can be maintained without causing abnormal discharge. If the bulk resistance of the target is 1 Ωcm or less, it is possible to use the DC magnetron sputtering method which is industrially advantageous.

In this way, stable sputtering state can be maintained without causing abnormal discharge, whereby continuous and stable film formation can be industrially realized.

It is known that a transparent thin film composed of indium oxide and zinc oxide can be used as an oxide semiconductor by causing a large amount of oxygen to be present during film formation by sputtering (U.S. Patent Publication No. 2005/199959). In the invention, since the carrier density of the thin film can be controlled by allowing a large amount of oxygen to be present during film formation by sputtering, the film can be used as an oxide semiconductor.

EXAMPLES

The method for measuring the characteristics of the targets prepared in Examples and Comparative Examples is given below.
(1) Density
The density was calculated from the weight and external dimensions of the target which had been cut into a predetermined size.

(2) Atomic Ratio of Each Element in the Target
The amount of each element was measured by the ICP (Inductively Coupled Plasma) measurement.
(3) Bulk Resistance of the Target
The bulk resistance of the target was measured by the four probe method by using a resistivity meter (Loresta, manufactured by Mitsubishi Yuka K.K.).
(4) Structure of an Oxide Present in the Target
The structure of an oxide was identified by analyzing the chart obtained by an X-ray diffraction measurement. The X-ray diffraction measurement was performed under the following conditions:
Apparatus: Ultilma-III, manufactured by Rigaku Corporation
X-ray: Cu—Kα rays (wavelength: 1.5406 Å, monochromized by means of a graphite monochrometer)
2θ-θ reflection, continuous scan (1.0°/min) Sampling interval: 0.02°
Slit DS, SS: ⅔°, RS: 0.6 mm

[Lanthanum (La)]

Example 1-1

700 g of indium oxide with a purity of 99.99% or more and 300 g of lanthanum oxide with a purity of 99.99% or more were mixed, and the resultant was pulverized and mixed for about 5 hours by means of a dry-type beads mill.

Subsequently, the resulting powder was placed in a 10 mmφ-die, and subject to preliminary molding by means of a die pressing machine at a pressure of 100 kg/cm$^2$. Subsequently, the resultant was compacted by means of a cold isostatic pressing machine at a pressure of 4 t/cm$^2$, followed by sintering at 1350° C. for 10 hours, whereby a sintered body was obtained. This sintered body was machined into a target (grinding, polishing, and attaching to a backing plate).

The X-ray diffraction measurement was conducted for the resulting target. The results showed that the target was composed of an oxide containing $LaInO_3$ and $In_2O_3$ as the main components.

FIG. 1 shows the X-ray chart of the target.

As a result of the ICP analysis, the atomic ratio [La/(La+In)] was 0.27.

The dispersion state of In and La was confirmed by the in-plane elemental distribution measurement by means of an EPMA (Electron Probe Micro Analyzer). The results showed that the composition was substantially uniform.

The density of the target was 6.78 g/cm$^3$ and the bulk resistance was 260 Ωcm.

Example 1-2

900 g of tin oxide and 100 g of lanthanum oxide were mixed, and the resultant was pulverized and mixed for about 5 hours by means of a dry-type beads mill.

Subsequently, the resulting powder was placed in a 10 mmφ-die, and subjected to preliminary molding by means of a die pressing machine at a pressure of 100 kg/cm$^2$. Subsequently, the resultant was compacted by means of a cold isostatic pressing machine at a pressure of 4 t/cm$^2$, followed by sintering at 1350° C. for 10 hours, whereby a sintered body was obtained. The thus obtained sintered body was machined into a target.

As a result of the X-ray diffraction measurement, the target obtained by the above process was confirmed to be composed of an oxide containing $La_2Sn_2O_7$ and $SnO_2$ as the main components.

Figure 2:
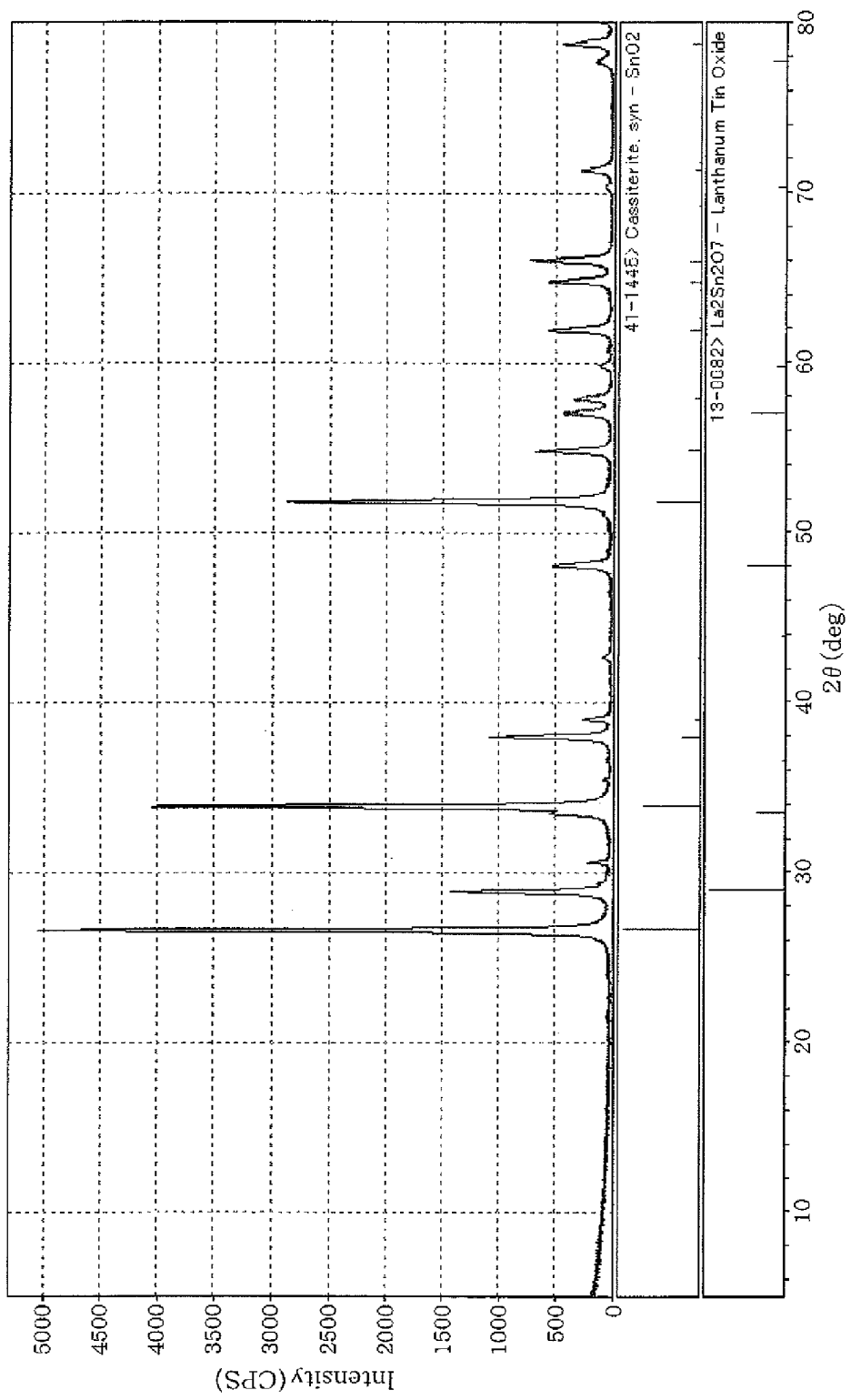
FIG. 2 is the X-ray chart of the target prepared in Example 1-2.

FIG. 2 shows the X-ray chart of the target.

As a result of the ICP analysis, the atomic ratio [La/(La+Sn)] was 0.09.

The dispersion state of Sn and La was confirmed by the in-plane elemental distribution measurement by means of EPMA. The results showed that the composition was substantially uniform. The density of the target was 6.64 g/cm³ and the bulk resistance was 950 Ωcm.

Examples 1-3 to 1-12

Indium oxide powder, tin oxide powder and lanthanum oxide powder were mixed such that the composition shown in Table 1 was attained, and pulverized and mixed for about 5 hours by means of a dry-type beads mill.

Subsequently, the resulting powder was placed in a 10 mmφ-die, and subjected to preliminary molding by means of a die pressing machine at a pressure of 100 kg/cm². Subsequently, the resultant was compacted by means of a cold isostatic pressing machine at a pressure of 4 t/cm², followed by sintering at 1350° C. for 10 hours, whereby a sintered body was obtained. The thus obtained sintered body was machined into a target.

TABLE 1

| Example | Amount of Raw Materials wt % | | |
|---------|-------------------------------|---------|----------|
|         | $In_2O_3$                     | $SnO_2$ | $La_2O_3$ |
| 1-3     | 80 | 10 | 10 |
| 1-4     | 70 | 10 | 20 |
| 1-5     | 70 | 20 | 10 |
| 1-6     | 60 | 10 | 30 |
| 1-7     | 60 | 20 | 20 |
| 1-8     | 60 | 30 | 10 |
| 1-9     | 50 | 10 | 40 |
| 1-10    | 50 | 20 | 30 |
| 1-11    | 50 | 30 | 20 |
| 1-12    | 50 | 40 | 10 |

As a result of the X-ray diffraction measurement, the target obtained by the above process was confirmed to be composed of an oxide containing $In_2O_3$, $La_2Sn_2O_7$ and $LaInO_3$ as the main components. FIGS. 3 to 12 respectively show the X-ray chart of the target prepared in Examples 1-3 to 1-12.

Table 2 shows the results of the ICP analysis of the target, the results of the in-plane elemental distribution measurement by means of EPMA, the density and the bulk resistance.

Comparative Example 1-1

400 g of indium oxide and 600 g of lanthanum oxide were mixed, and the resultant was pulverized and mixed for about 5 hours by means of a dry-type beads mill.

Subsequently, the resulting powder was placed in a 10 mmφ-die, and subjected to preliminary molding by means of a die pressing machine at a pressure of 100 kg/cm². Subsequently, the resultant was compacted by means of a cold isostatic pressing machine at a pressure of 4 t/cm², followed by sintering at 1350° C. for 10 hours.

The sintered body immediately after being taken out from the furnace had a large number of cracks, and broken. Therefore, this sintered body could not be machined into a target (grinding, polishing, and attaching to a backing plate).

The X-ray diffraction measurement was conducted for this sintered body. The results showed that the sintered body was composed of an oxide containing $LaInO_3$ and $La_2O_3$ as the main components.

Figure 13:
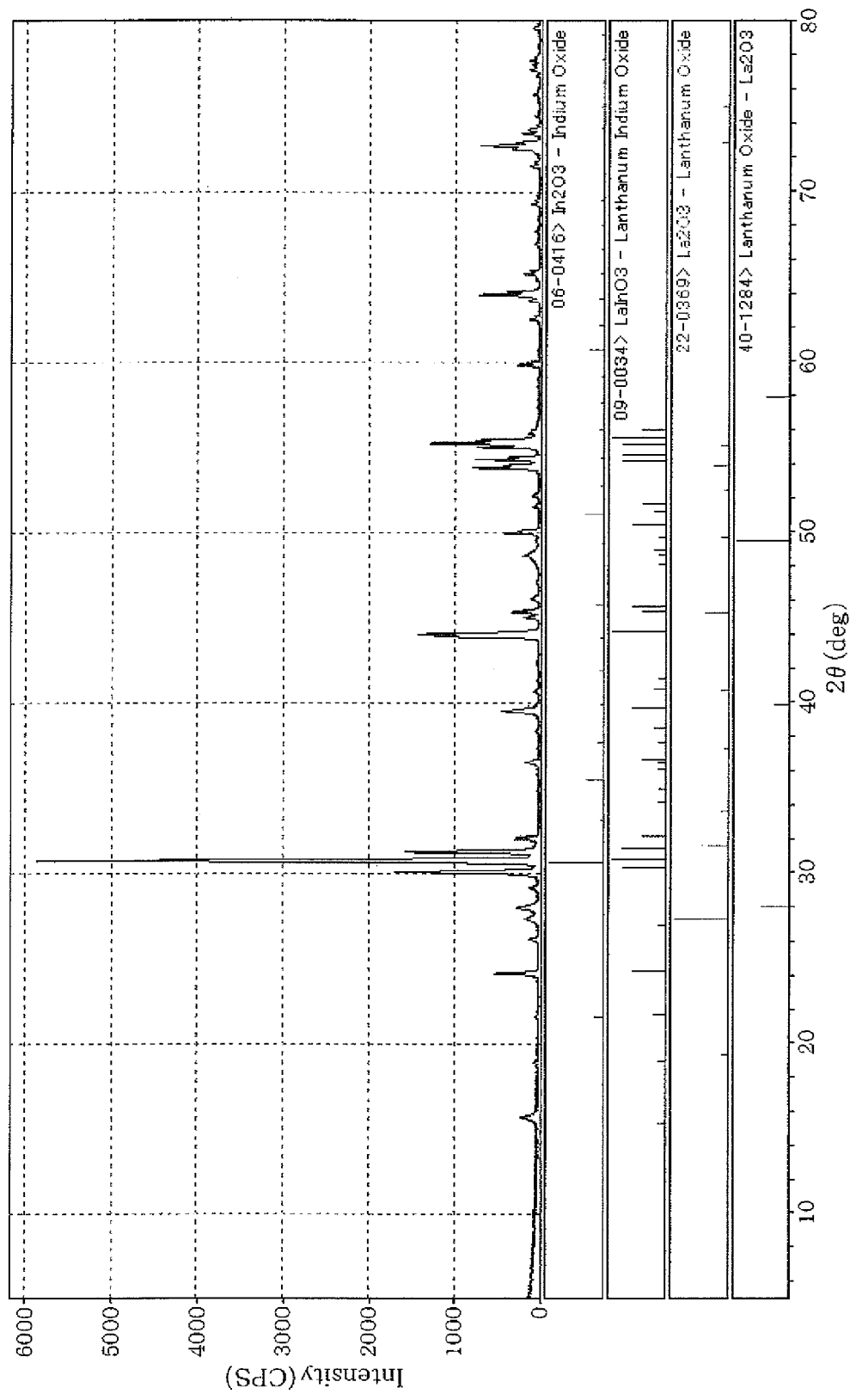
FIG. 13 is the X-ray chart of the sintered body prepared in Comparative Example 1-1.

FIG. 13 shows the X-ray chart of this sintered body.

As a result of the ICP analysis, the atomic ratio [La/(La+In)] was 0.56.

The dispersion state of In and La was confirmed by the in-plane elemental distribution measurement of the sintered body by means of EPMA. The results showed that the composition was substantially non-uniform. This sintered body was a substantially insulating material having a bulk resistance of 2 MΩcm or more.

[Gadolinium (Gd)]

Examples 2-1 to 2-10

With the amount ratio shown in Table 3, indium oxide with a purity of 99.9% or more, gadolinium oxide with a purity of 99.9% or more, and tin oxide with a purity of 99.9% or more were mixed, and the resultant was pulverized and mixed for about 5 hours by means of a dry-type beads mill.

Subsequently, the resulting powder was placed in a 10 rump-die, and subjected to preliminary molding by means of a die pressing machine at a pressure of 100 kg/cm². Subsequently, the resultant was compacted by means of a cold isostatic pressing machine at a pressure of 4 t/cm², followed by sintering at 1350° C. for 10 hours, whereby a sintered body was obtained. This sintered body was machined into a target (grinding, polishing, and attaching to a backing plate).

TABLE 2

Figure 3:
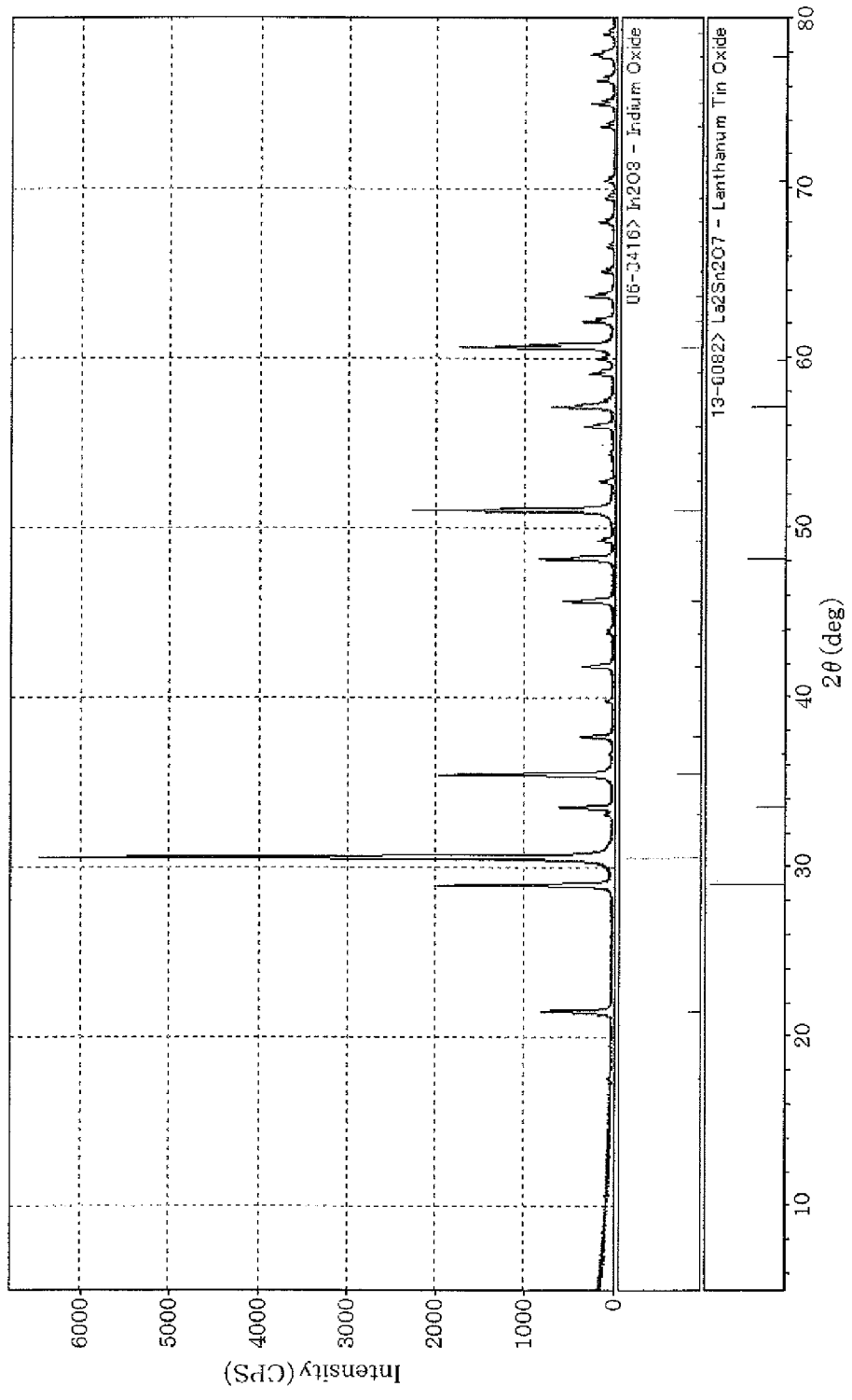
FIG. 3 is the X-ray chart of the target prepared in Example 1-3.
Figure 4:
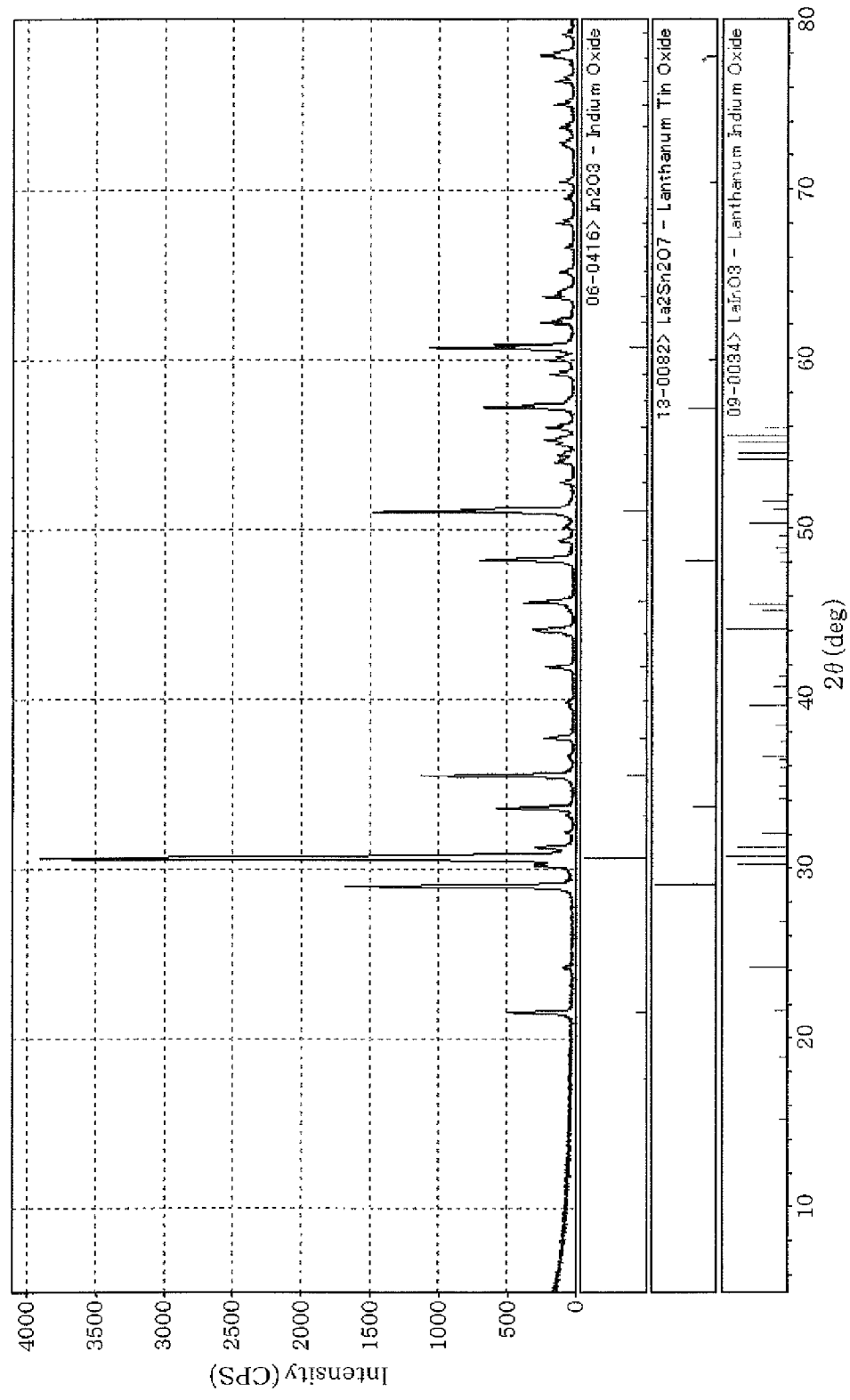
FIG. 4 is the X-ray chart of the target prepared in Example 1-4.
Figure 5:
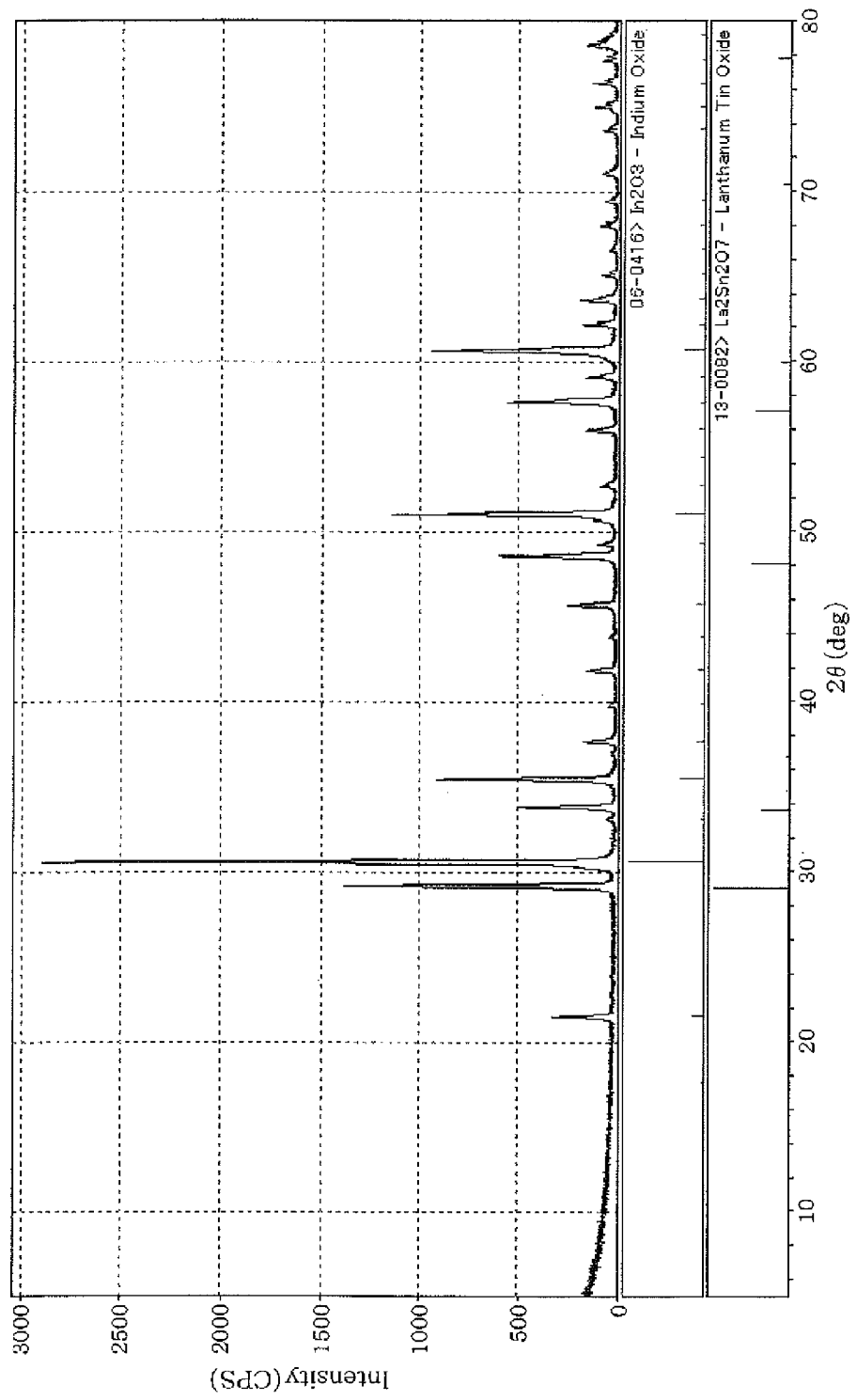
FIG. 5 is the X-ray chart of the target prepared in Example 1-5.
Figure 6:
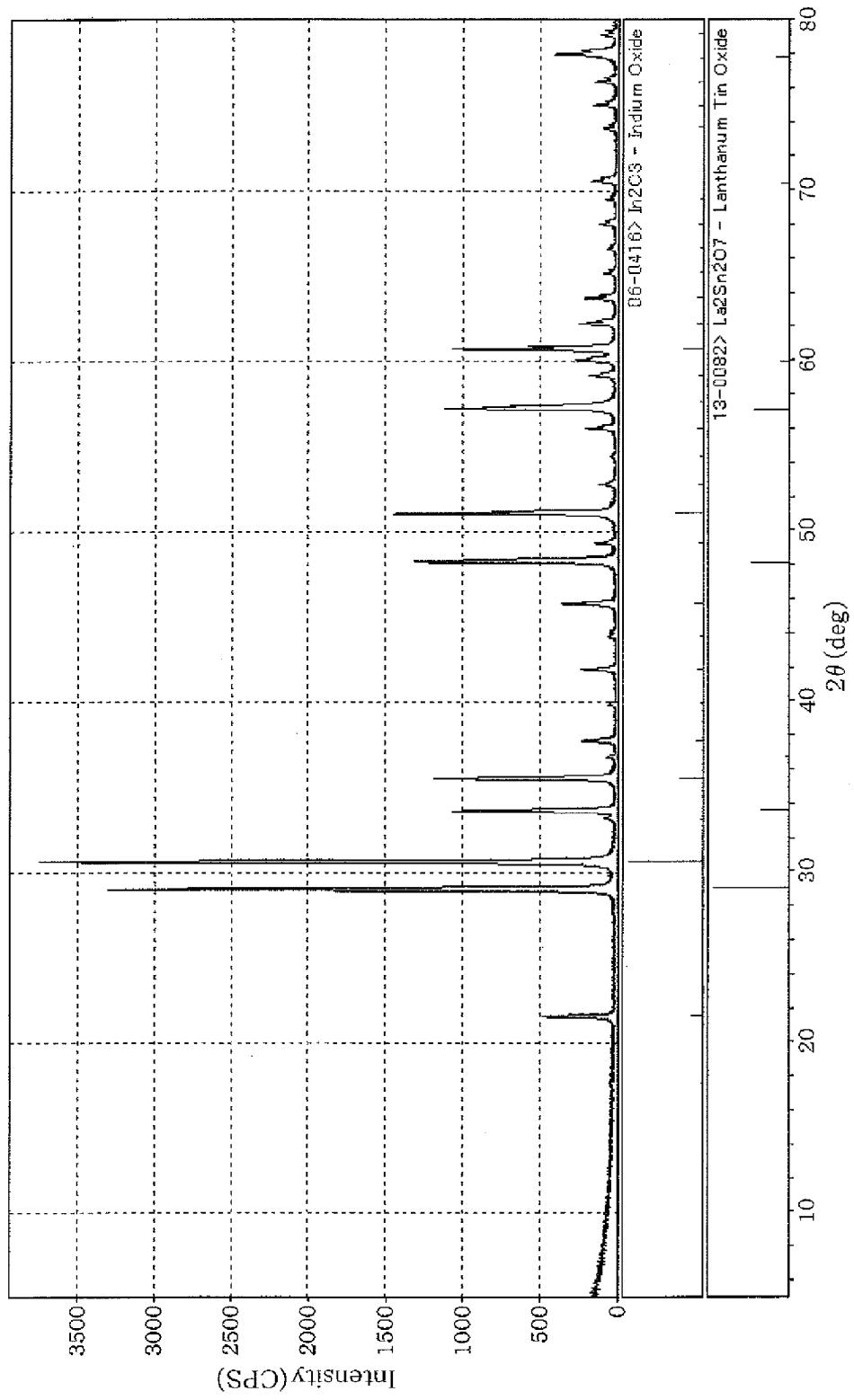
FIG. 6 is the X-ray chart of the target prepared in Example 1-6.
Figure 7:
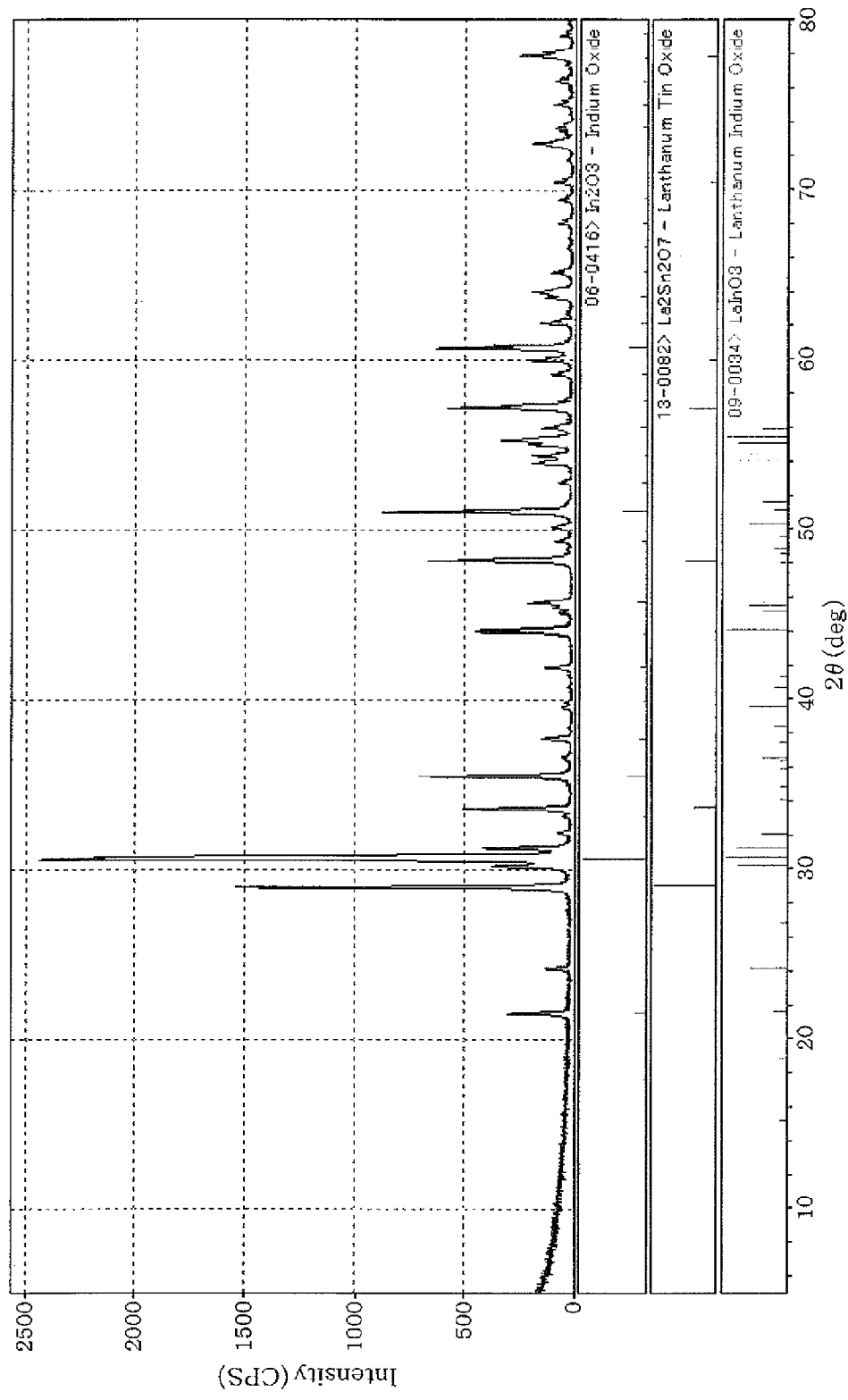
FIG. 7 is the X-ray chart of the target prepared in Example 1-7.
Figure 8:
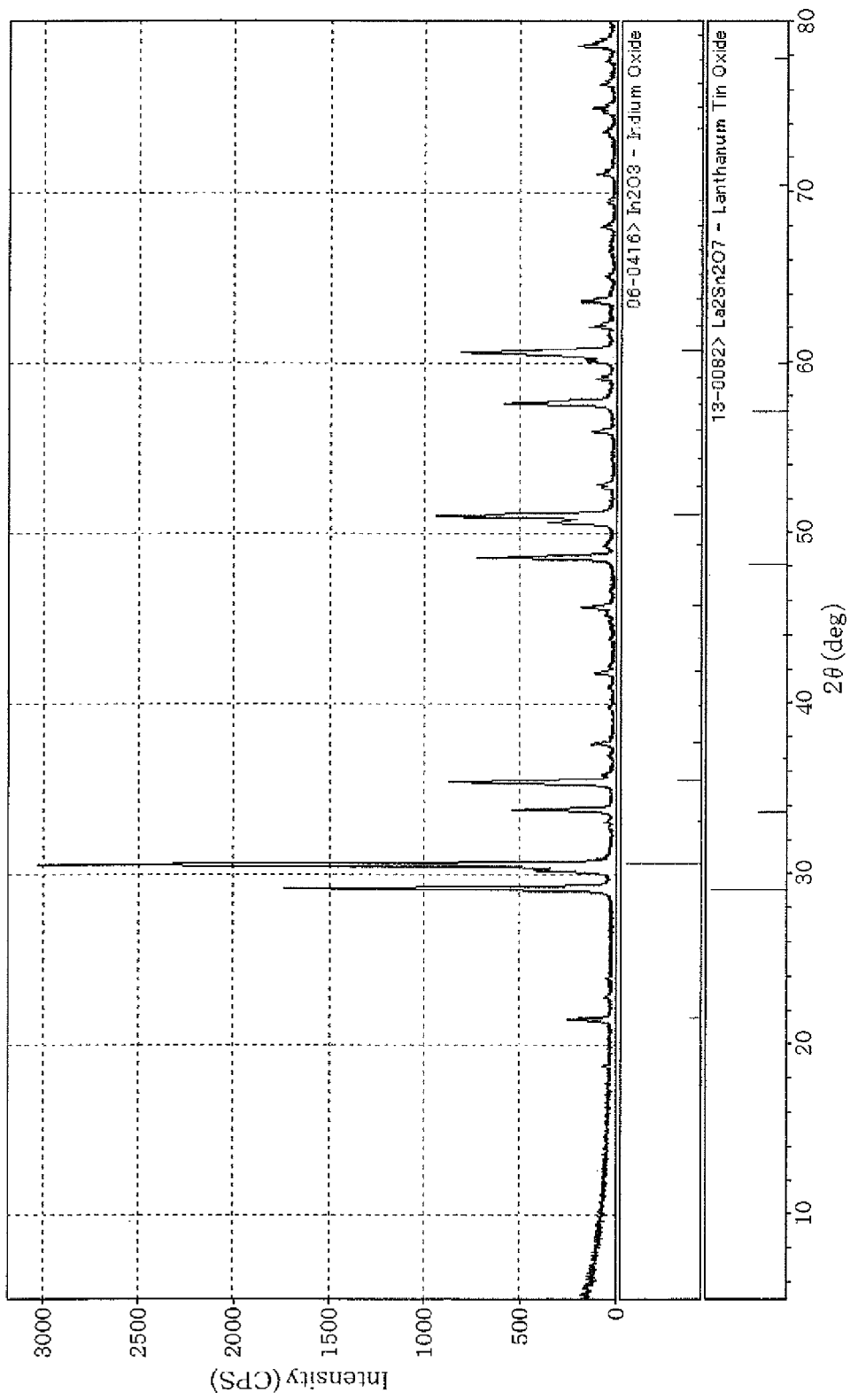
FIG. 8 is the X-ray chart of the target prepared in Example 1-8.
Figure 9:
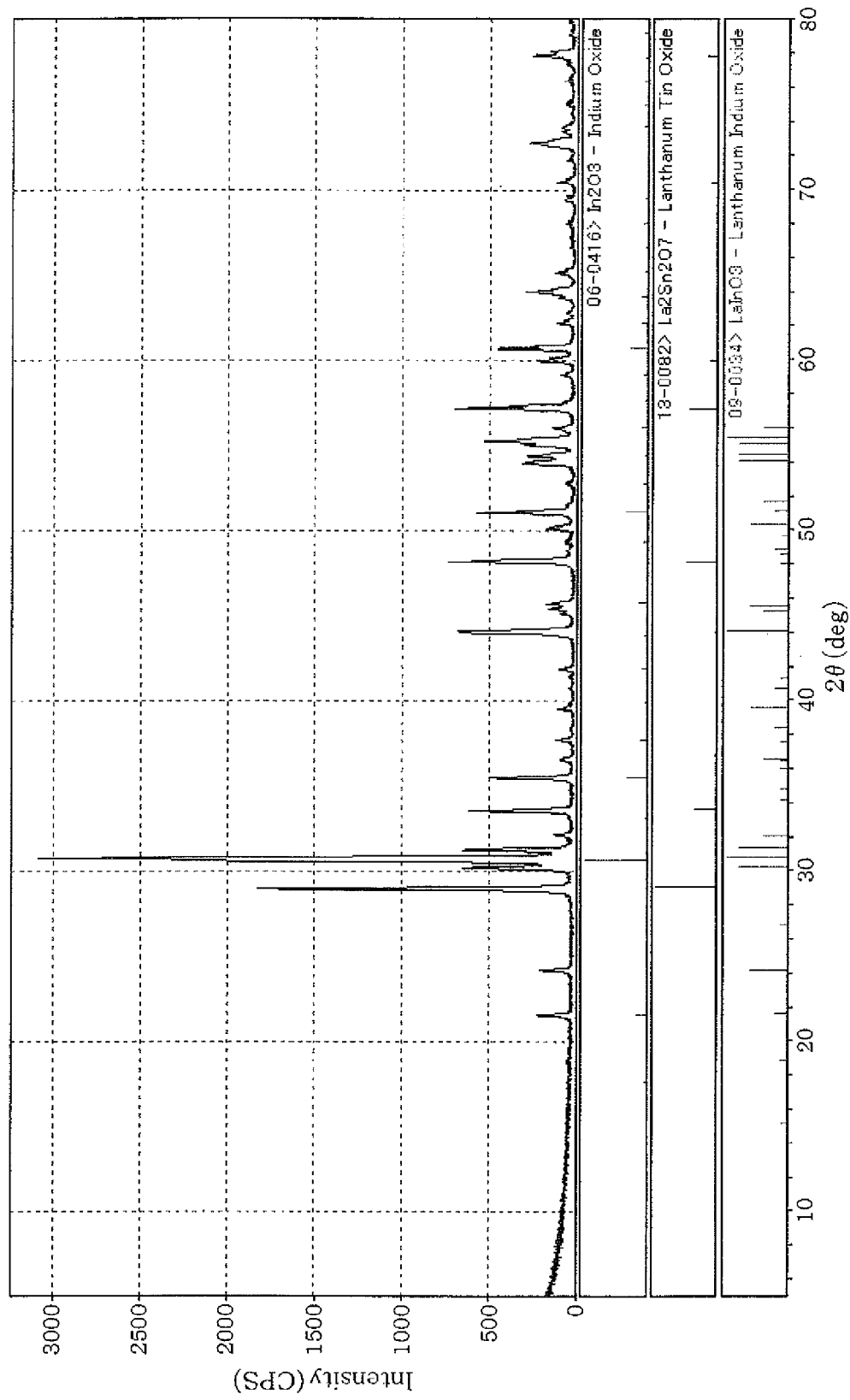
FIG. 9 is the X-ray chart of the target prepared in Example 1-9.
Figure 10:
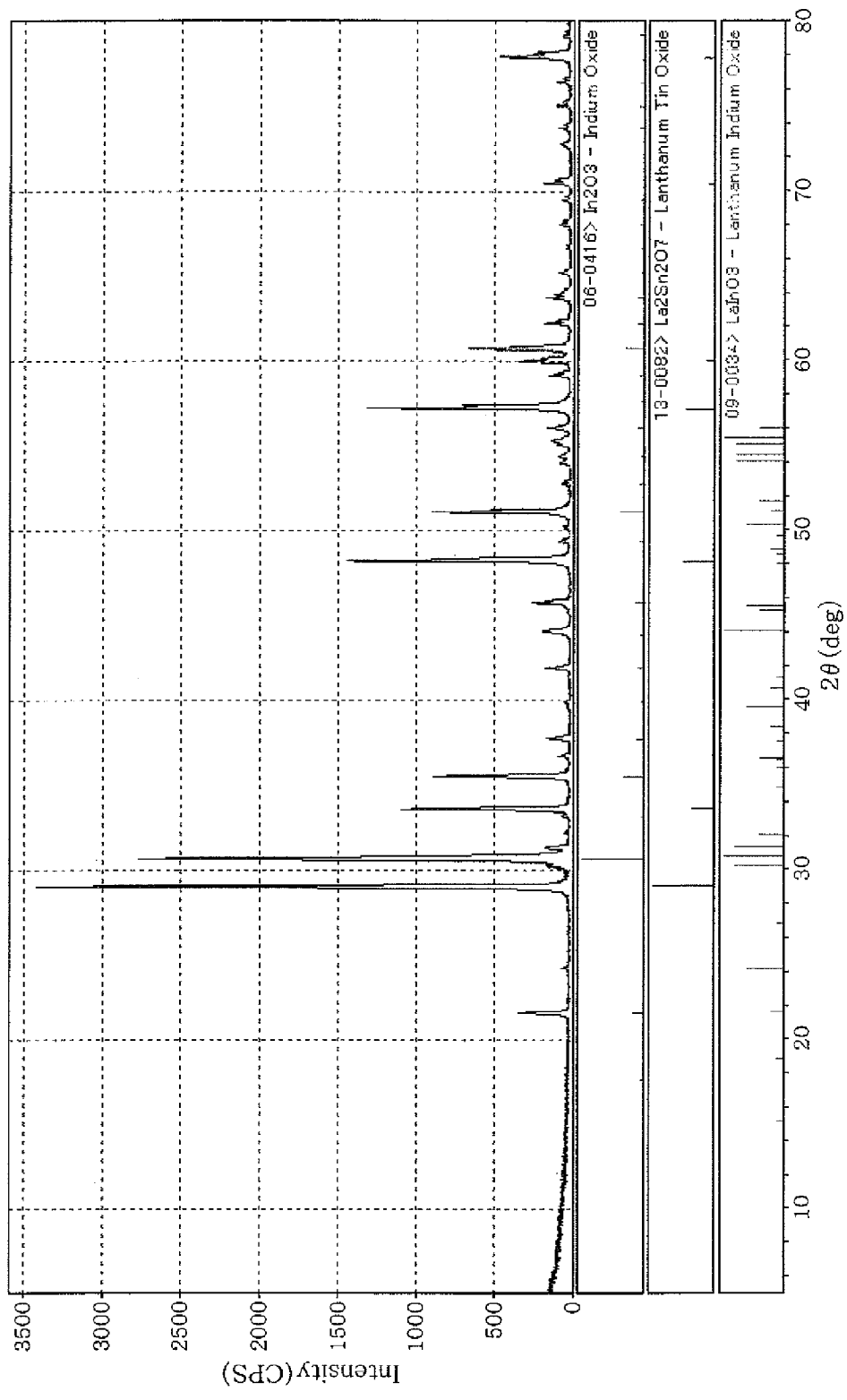
FIG. 10 is the X-ray chart of the target prepared in Example 1-10.
Figure 11:
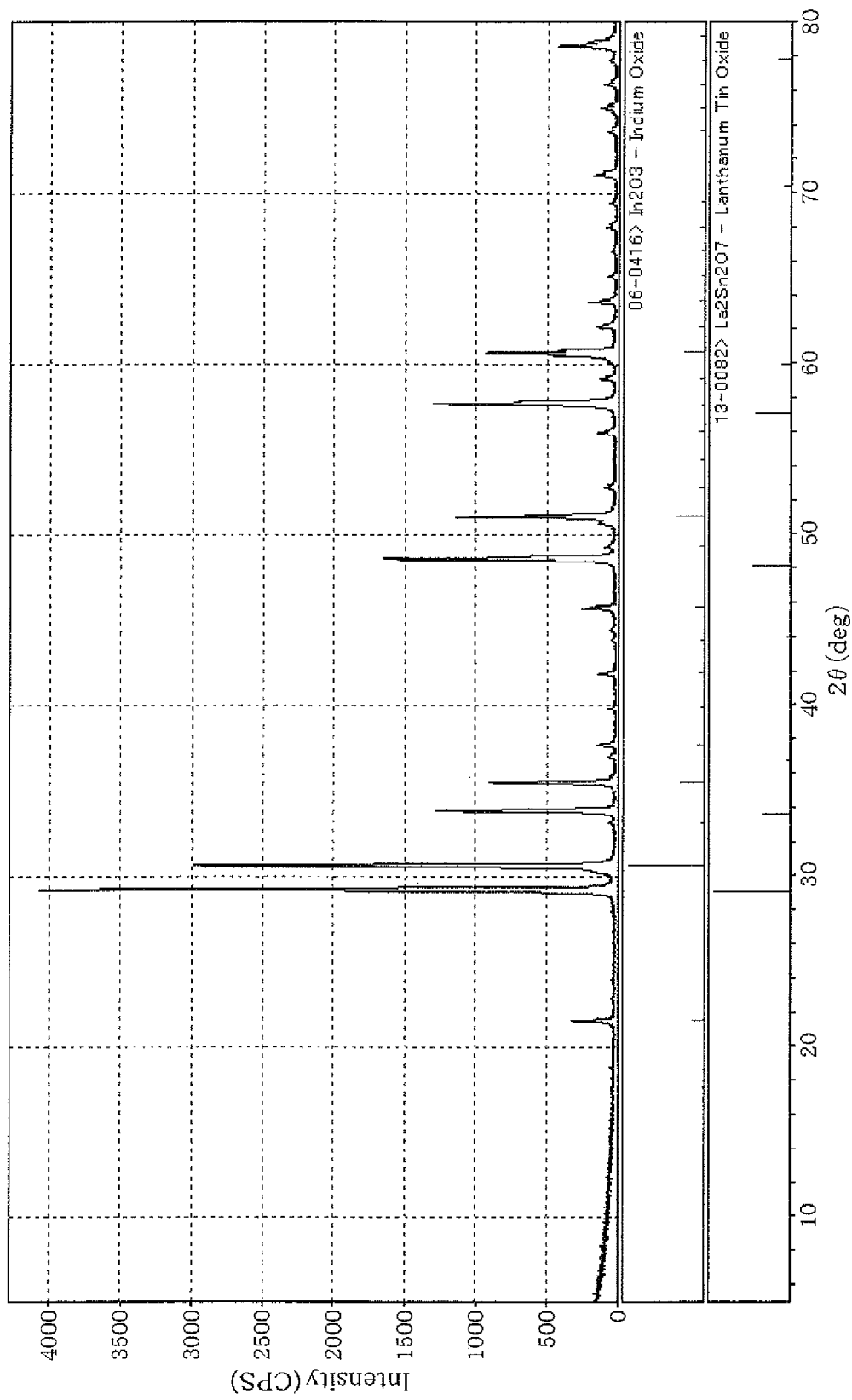
FIG. 11 is the X-ray chart of the target prepared in Example 1-11.
Figure 12:
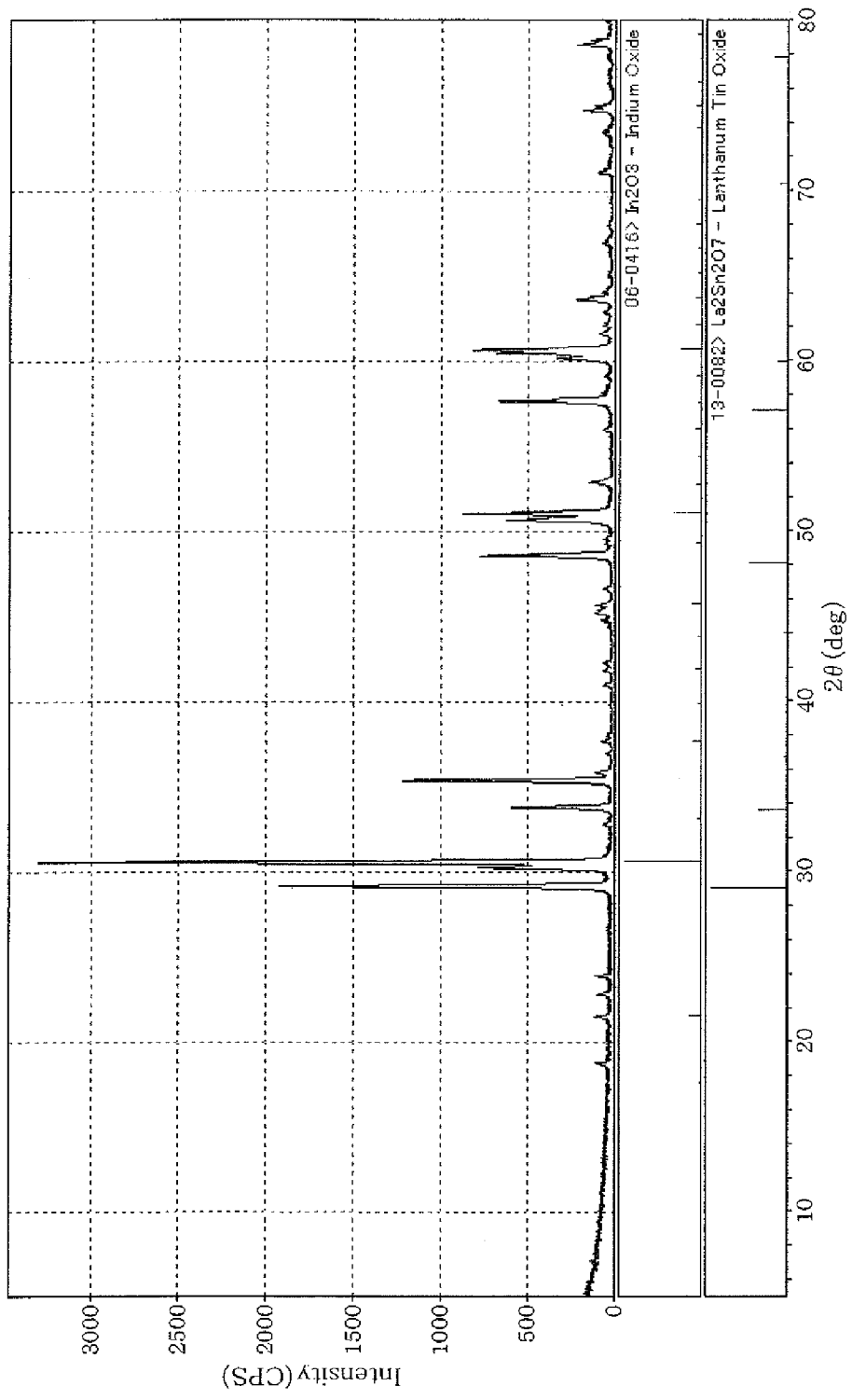
FIG. 12 is the X-ray chart of the target prepared in Example 1-12.

| Example | Results of ICP analysis*¹ | | | Results of X-ray diffractometry*² | | | | | X-ray chart | EPMA Uniformity | Density g/cm³ | Resistance Ωcm |
|---------|------|------|------|-----------|--------|-----------|------------|---------|----------|-----------|---------|----------|
|         | In   | Sn   | La   | $In_2O_3$ | $SnO_2$ | $La_2O_3$ | $La_2Sn_2O$ | $LaInO_3$ | | | | |
| 1-3     | 0.82 | 0.09 | 0.09 | ○ | X | X | ○ | Δ | FIG. 3  | Good | 6.71 | 0.014 |
| 1-4     | 0.72 | 0.09 | 0.19 | ○ | X | X | ○ | ○ | FIG. 4  | Good | 6.62 | 0.027 |
| 1-5     | 0.72 | 0.19 | 0.09 | ○ | X | X | ○ | X | FIG. 5  | Good | 6.68 | 0.003 |
| 1-6     | 0.61 | 0.09 | 0.30 | ○ | X | X | ○ | X | FIG. 6  | Good | 6.87 | 0.016 |
| 1-7     | 0.60 | 0.21 | 0.19 | ○ | X | X | ○ | ○ | FIG. 7  | Good | 6.66 | 0.090 |
| 1-8     | 0.60 | 0.29 | 0.11 | ○ | X | X | ○ | X | FIG. 8  | Good | 6.68 | 0.008 |
| 1-9     | 0.50 | 0.11 | 0.39 | ○ | X | X | ○ | ○ | FIG. 9  | Good | 6.84 | 0.065 |
| 1-10    | 0.49 | 0.19 | 0.32 | ○ | X | X | ○ | ○ | FIG. 10 | Good | 6.82 | 0.085 |
| 1-11    | 0.50 | 0.30 | 0.20 | ○ | X | X | ○ | X | FIG. 11 | Good | 6.65 | 0.024 |
| 1-12    | 0.51 | 0.38 | 0.11 | ○ | X | X | ○ | X | FIG. 12 | Good | 6.63 | 0.012 |

*¹Each value in the table is the ratio of each atom to (In + Sn + La) (atomic amount ratio).
*²Results of X-ray diffractometry: ○ The compound was identified. Δ: A minor peak was observed. X: No peak was observed.

TABLE 3

| Example | Amount of raw materials wt % | | |
|---|---|---|---|
| | $In_2O_3$ | $SnO_2$ | $Gd_2O_3$ |
| 2-1 | 80 | 5 | 15 |
| 2-2 | 70 | 10 | 20 |
| 2-3 | 70 | 20 | 10 |
| 2-4 | 60 | 10 | 30 |
| 2-5 | 60 | 20 | 20 |
| 2-6 | 60 | 30 | 10 |
| 2-7 | 50 | 10 | 40 |
| 2-8 | 50 | 20 | 30 |
| 2-9 | 50 | 30 | 20 |
| 2-10 | 50 | 40 | 10 |

As a result of the X-ray diffraction measurement, the target obtained by the above process was confirmed to be composed of an oxide containing $In_2O_3$, $Gd_2Sn_2O_7$ and $GdInO_3$ as the main components. FIGS. 14 to 23 show the X-ray charts of the targets prepared in Examples 2-1 to 2-10.

Table 4 shows the results of the X-ray diffraction measurement, the results of the ICP analysis of the target, the results of the in-plane elemental distribution measurement of the sintered body by means of EPMA conducted to examine the dispersion state of In and Gd, the density and the bulk resistance.

TABLE 4

Figure 14:
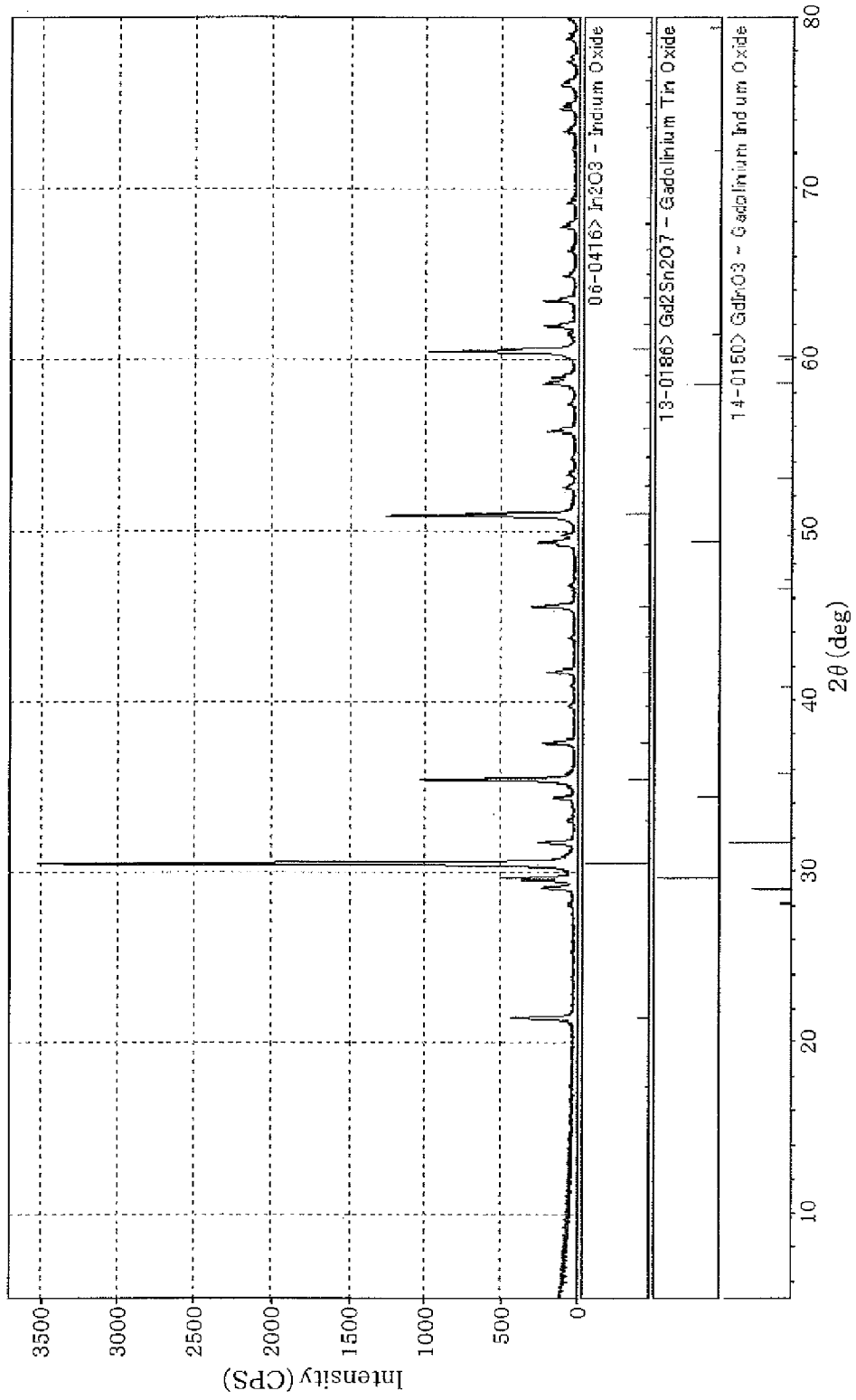
FIG. 14 is the X-ray chart of the target prepared in Example 2-1.
Figure 15:
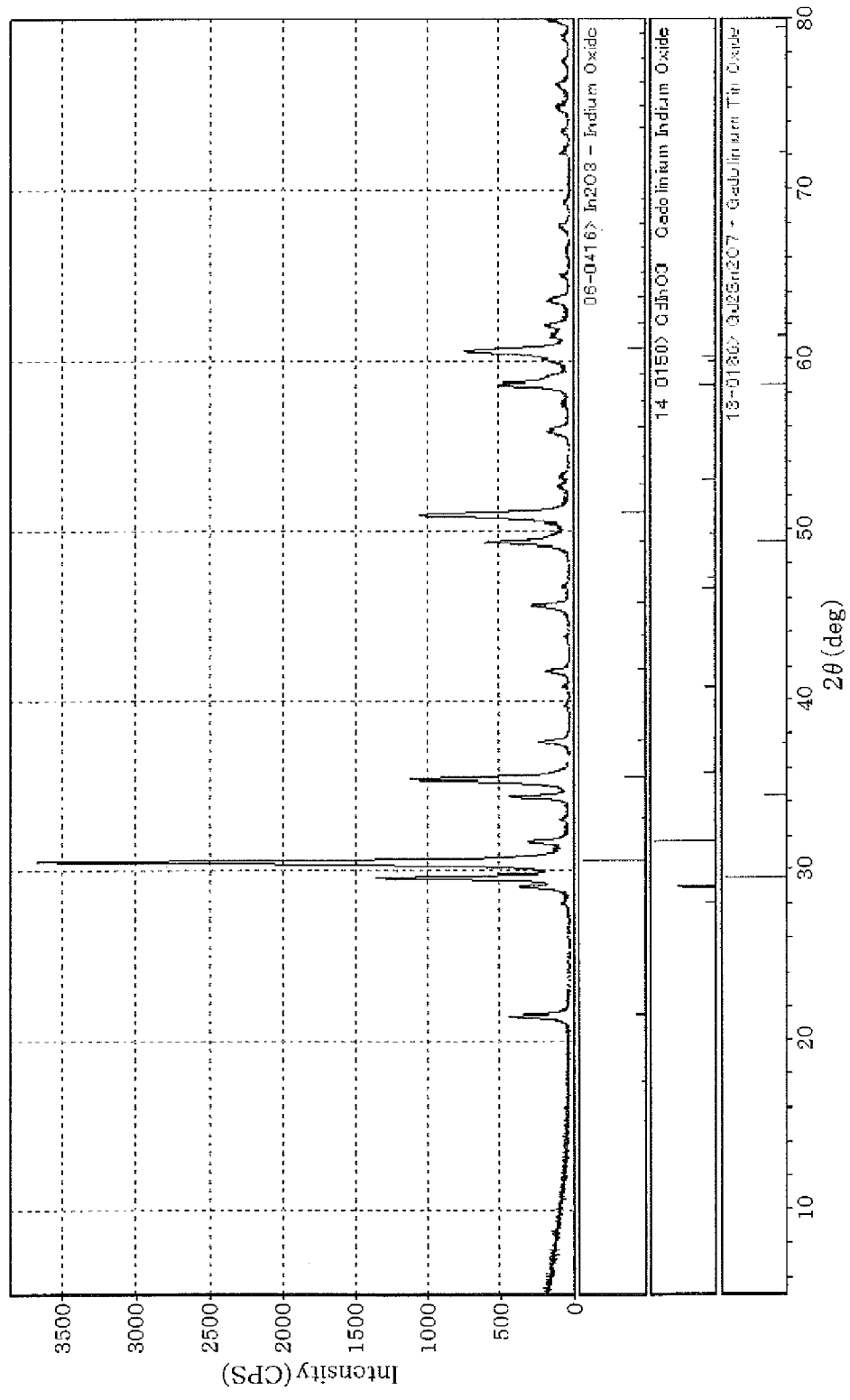
FIG. 15 is the X-ray chart of the target prepared in Example 2-2.
Figure 16:
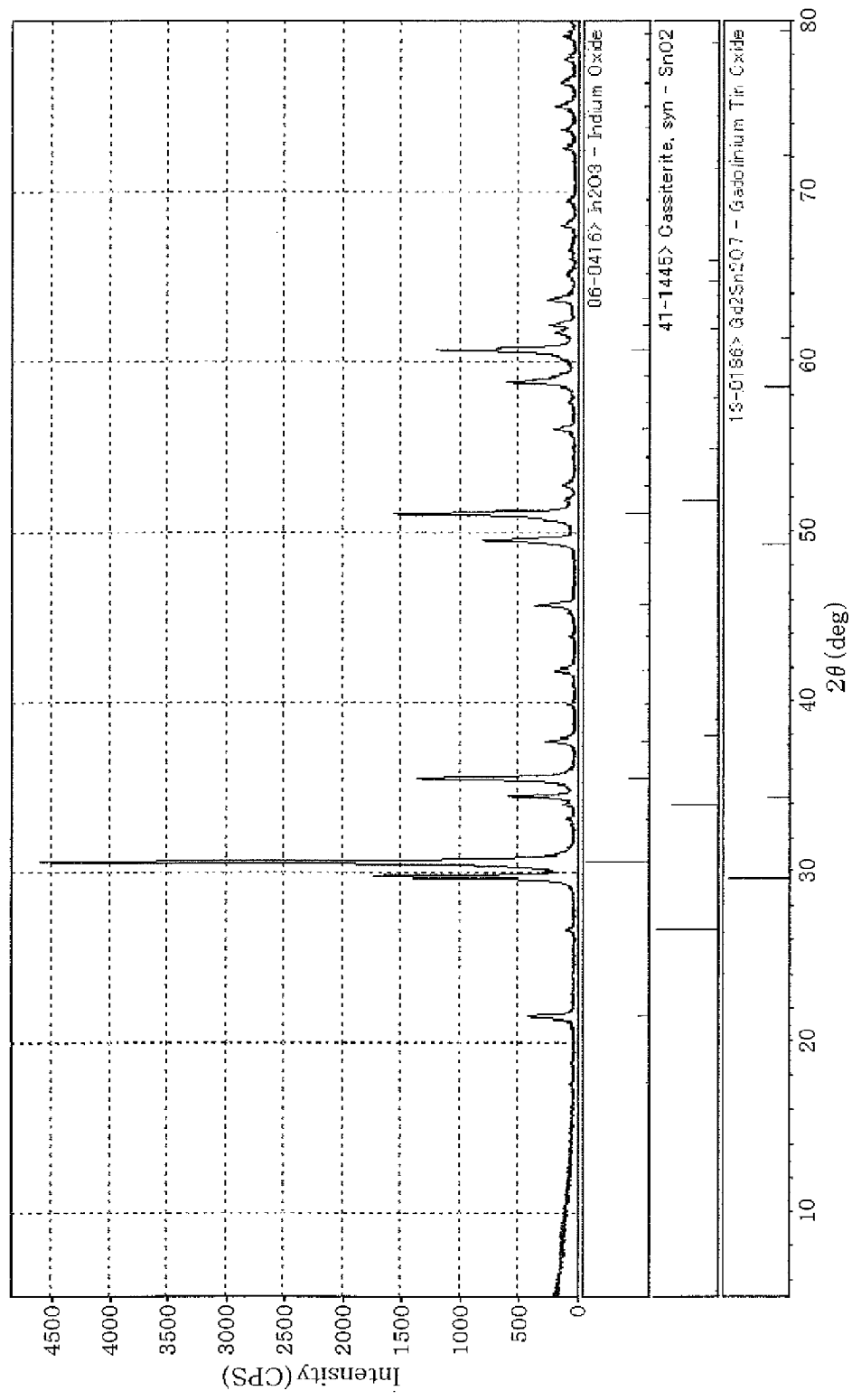
FIG. 16 is the X-ray chart of the target prepared in Example 2-3.
Figure 17:
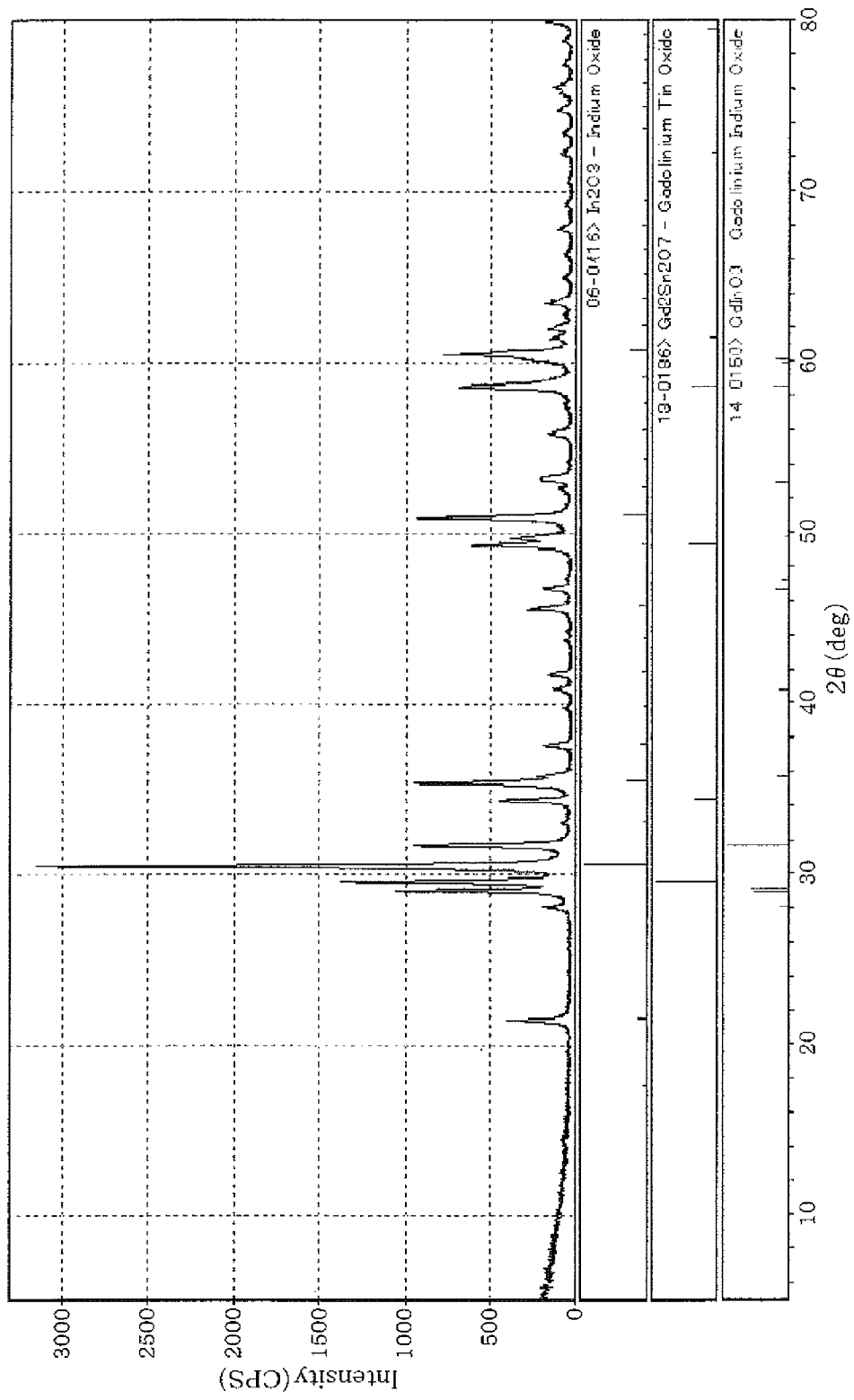
FIG. 17 is the X-ray chart of the target prepared in Example 2-4.
Figure 18:
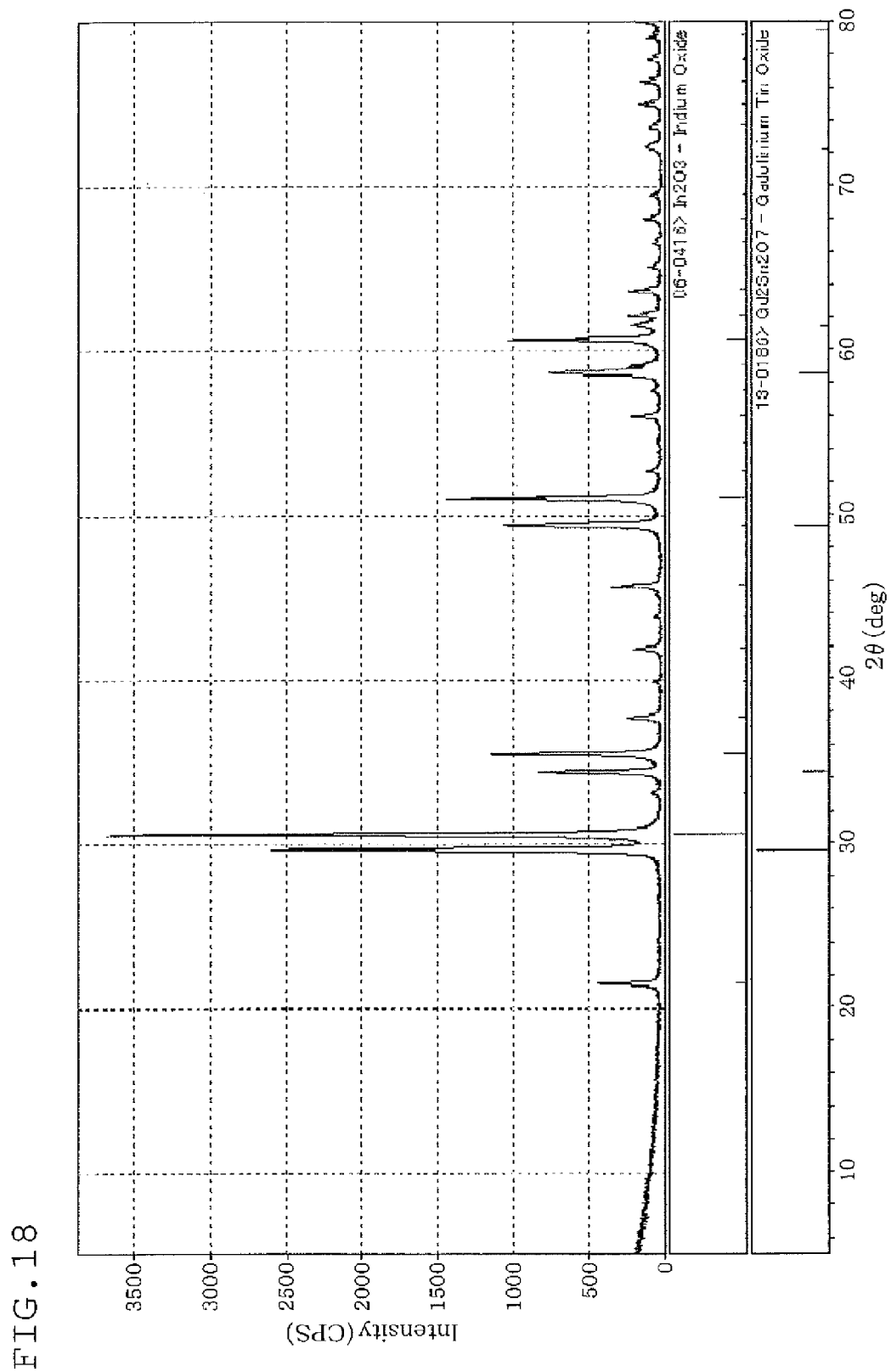
FIG. 18 is the X-ray chart of the target prepared in Example 2-5.
Figure 19:
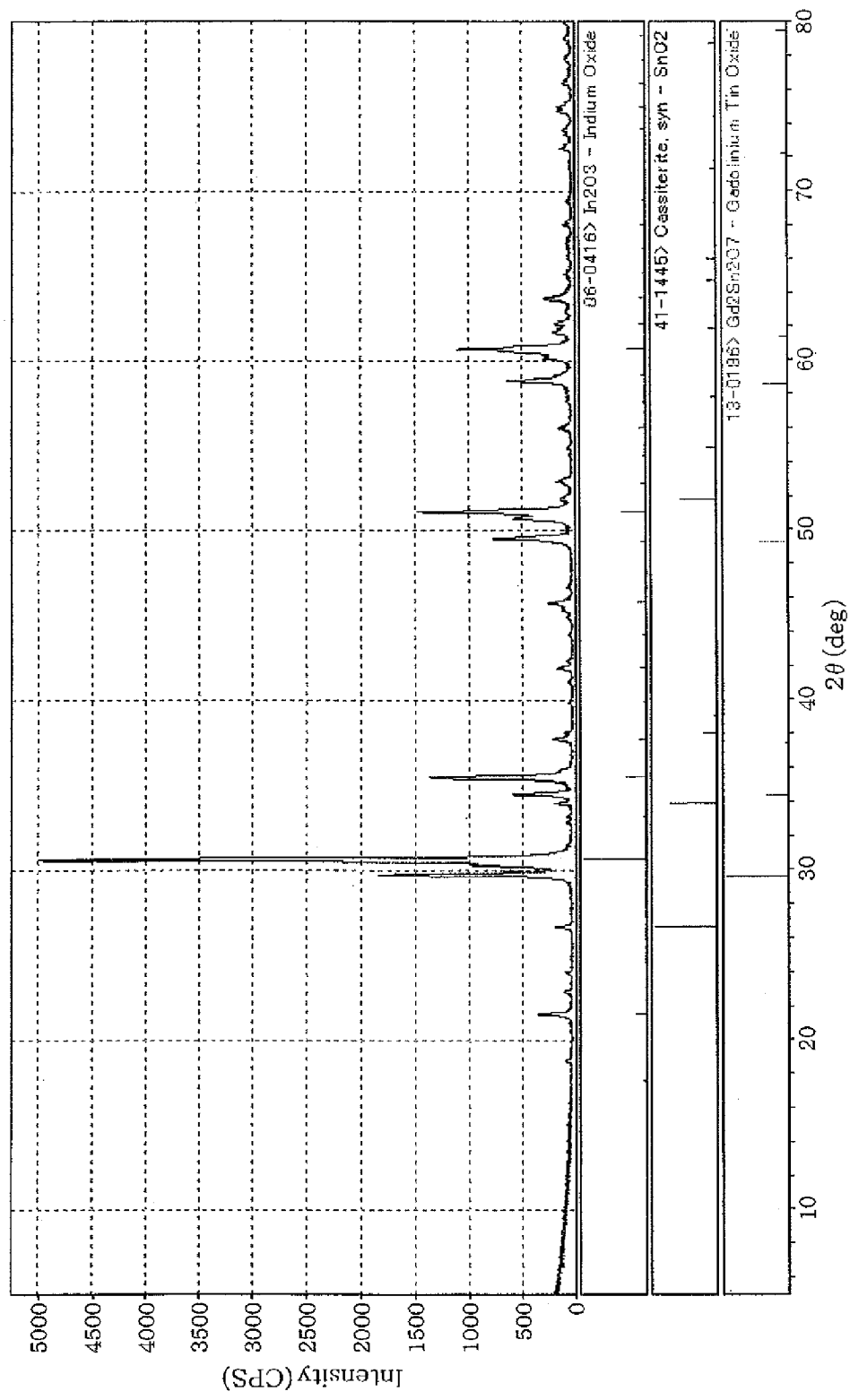
FIG. 19 is the X-ray chart of the target prepared in Example 2-6.
Figure 20:
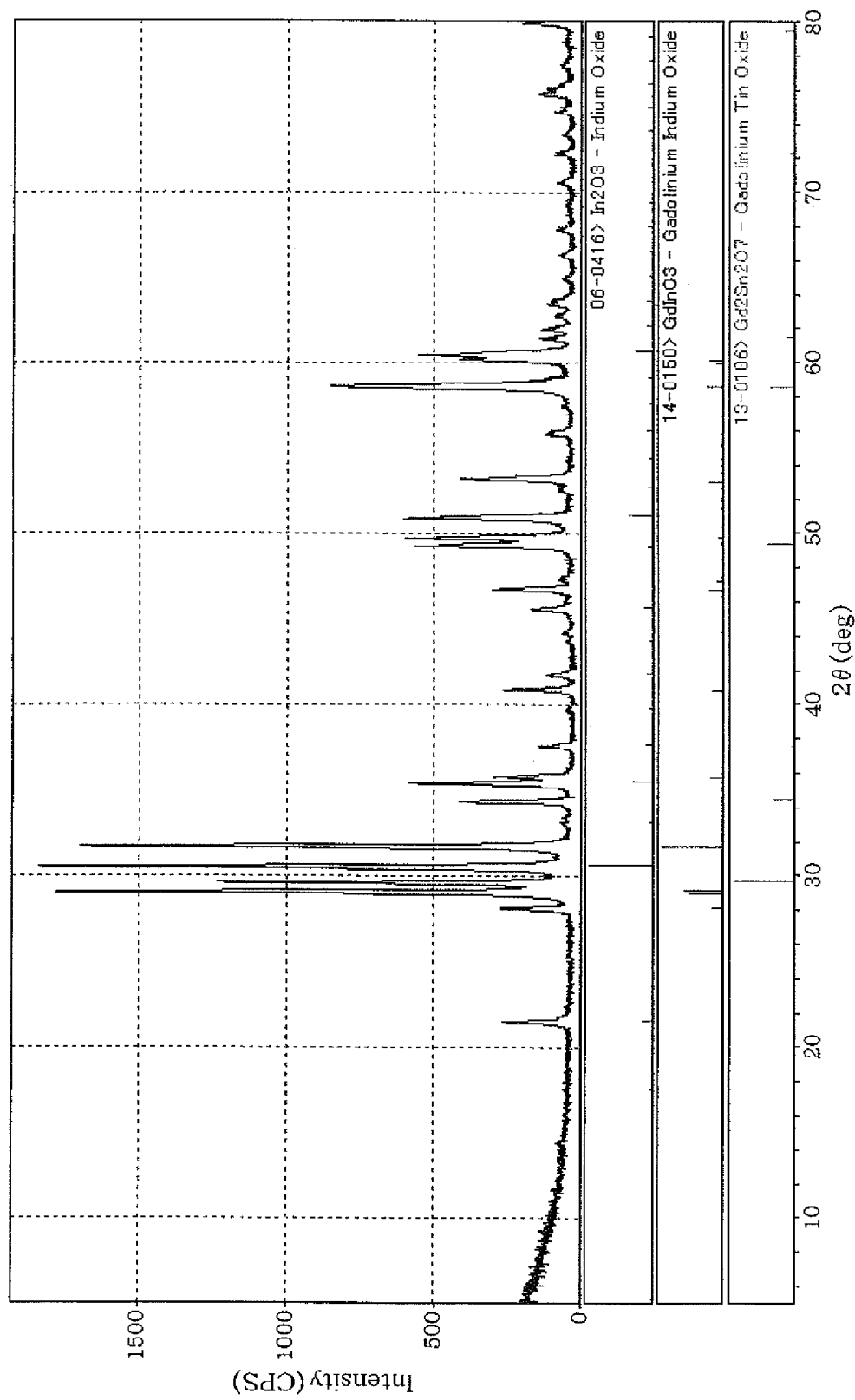
FIG. 20 is the X-ray chart of the target prepared in Example 2-7.
Figure 21:
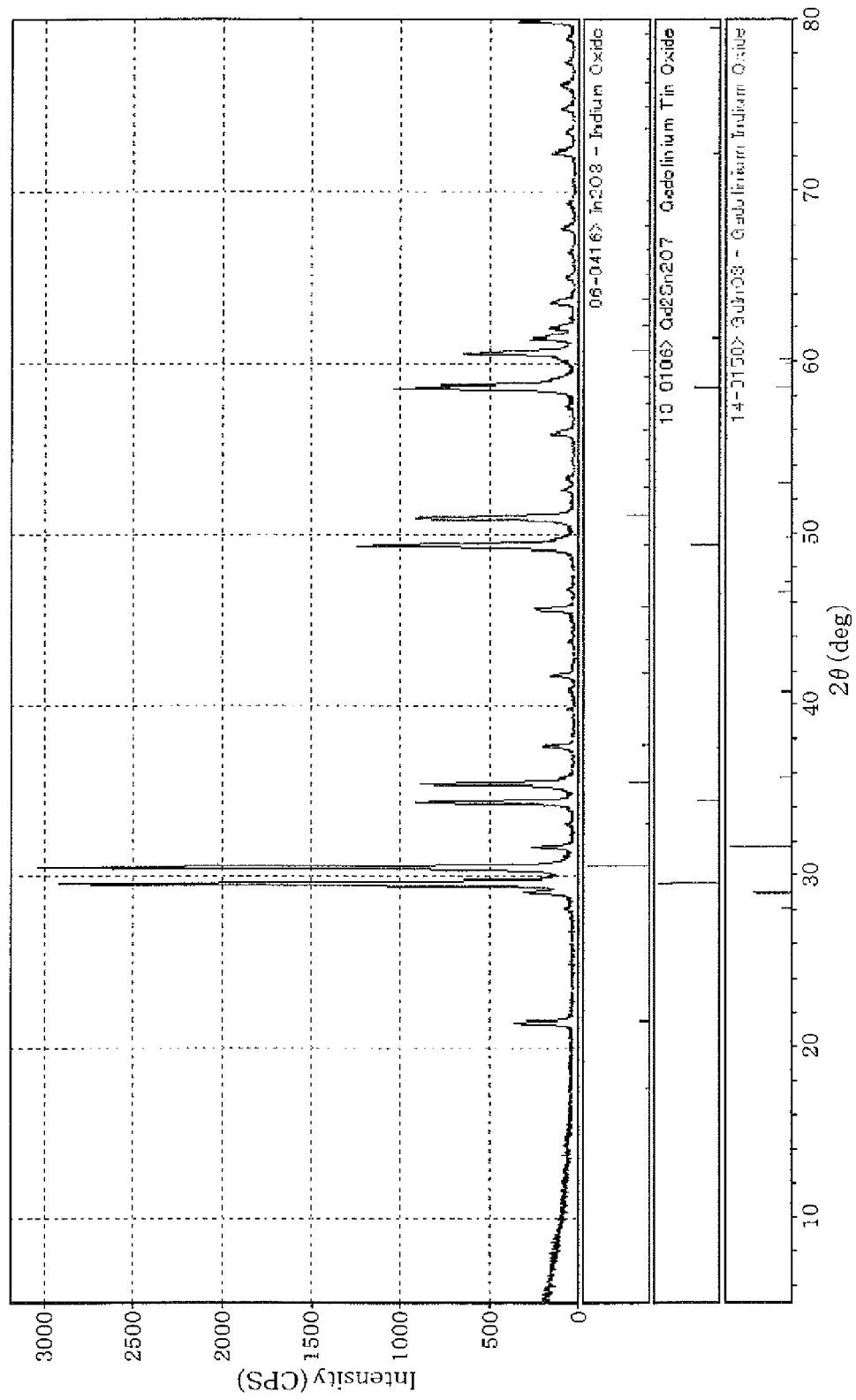
FIG. 21 is the X-ray chart of the target prepared in Example 2-8.
Figure 22:
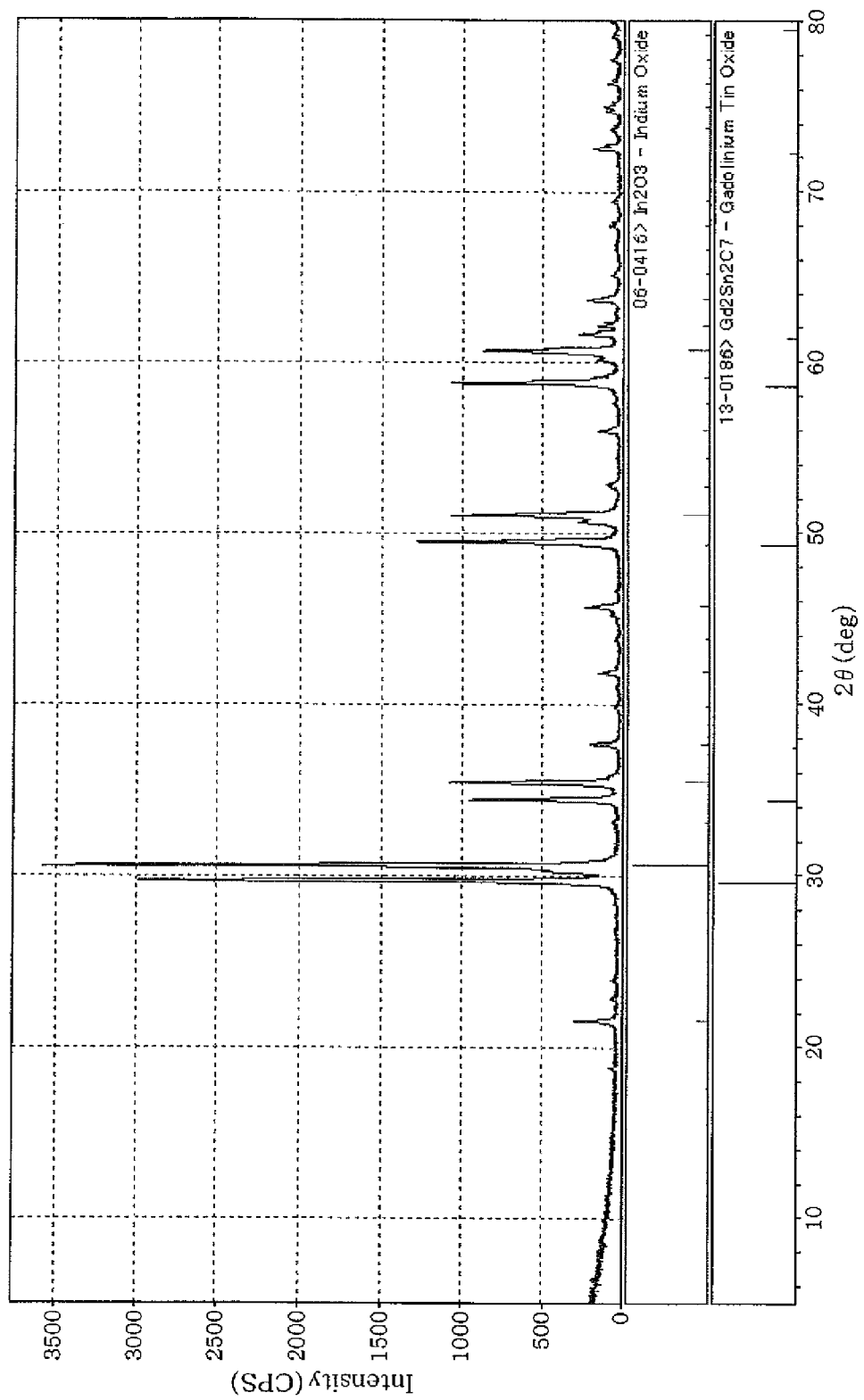
FIG. 22 is the X-ray chart of the target prepared in Example 2-9.
Figure 23:
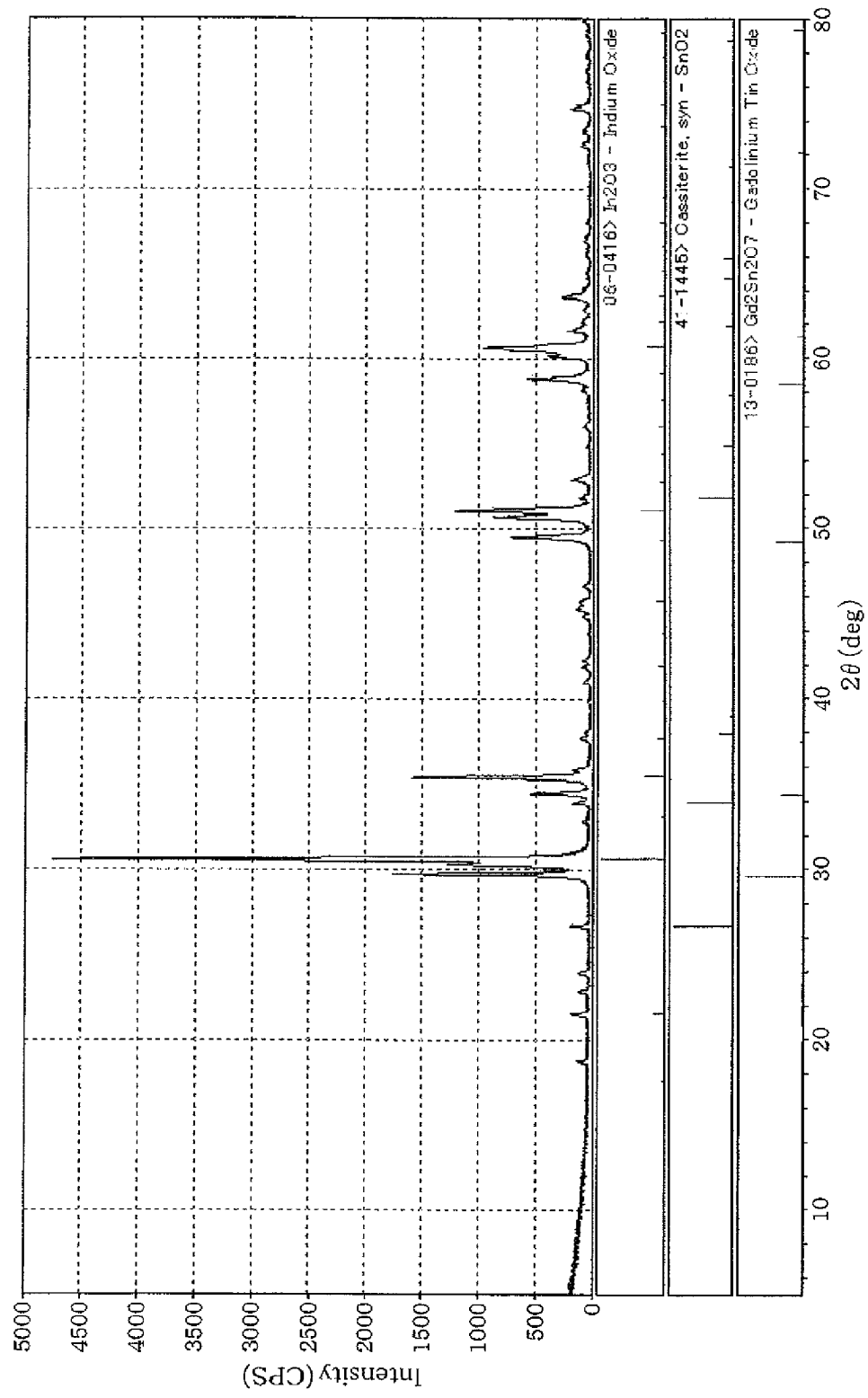
FIG. 23 is the X-ray chart of the target prepared in Example 2-10.

| | Results of ICP analysis*[1] | | | Results of X-ray diffractometry*[2] | | | | | X-ray chart | EPMA Uniformity | Density g/cm³ | Resistance Ωcm |
|---|---|---|---|---|---|---|---|---|---|---|---|---|
| Example | In | Sn | Gd | $In_2O_3$ | $SnO_2$ | $Gd_2O_3$ | $Gd_2Sn_2O_7$ | $GdInO_3$ | | | | |
| 2-1 | 0.82 | 0.05 | 0.12 | ○ | X | X | ○ | ○ | FIG. 14 | Good | 6.68 | 0.0003 |
| 2-2 | 0.72 | 0.09 | 0.19 | ○ | X | X | ○ | ○ | FIG. 15 | Good | 6.61 | 0.55 |
| 2-3 | 0.72 | 0.19 | 0.09 | ○ | X | X | ○ | X | FIG. 16 | Good | 6.63 | 0.0014 |
| 2-4 | 0.61 | 0.09 | 0.30 | ○ | X | X | ○ | X | FIG. 17 | Good | 6.78 | 0.0038 |
| 2-5 | 0.60 | 0.21 | 0.19 | ○ | X | X | ○ | ○ | FIG. 18 | Good | 6.62 | 0.0024 |
| 2-6 | 0.60 | 0.29 | 0.11 | ○ | X | X | ○ | X | FIG. 19 | Good | 6.63 | 0.82 |
| 2-7 | 0.50 | 0.11 | 0.39 | ○ | X | X | ○ | ○ | FIG. 20 | Good | 6.82 | 0.025 |
| 2-8 | 0.49 | 0.19 | 0.32 | ○ | X | X | ○ | ○ | FIG. 21 | Good | 6.71 | 0.0065 |
| 2-9 | 0.50 | 0.30 | 0.20 | ○ | X | X | ○ | X | FIG. 22 | Good | 6.63 | 0.26 |
| 2-10 | 0.51 | 0.38 | 0.11 | ○ | X | X | ○ | X | FIG. 23 | Good | 6.68 | 0.88 |

*[1]Each value in the table is the ratio of each atom to (In + Sn + Gd) (atomic amount ratio).
*[2]Results of X-ray diffractometry: ○ The compound was identified. Δ: A minor peak was observed. X: No peak was observed.

Comparative Example 2-1

400 g of indium oxide and 600 g of gadolinium oxide were mixed, and the resultant was pulverized and mixed for about 5 hours by means of a dry-type beads mill.

Subsequently, the resulting powder was placed in a 10 mmφ-die, and subjected to preliminary molding by means of a die pressing machine at a pressure of 100 kg/cm². Subsequently, the resultant was compacted by means of a cold isostatic pressing machine at a pressure of 4 t/cm², followed by sintering at 1350° C. for 10 hours.

The sintered body immediately after being taken out from the furnace had a large number of cracks, and broken. Therefore, this sintered body could not be machined into a target (grinding, polishing, and attaching to a backing plate).

The X-ray diffraction measurement was conducted for this sintered body. The results showed that the sintered body was composed of an oxide containing $GdInO_3$ and $Gd_2O_3$ as the main components.

As a result of the ICP analysis, the atomic ratio [Gd/(Gd+In)] was 0.56.

The dispersion state of In and Gd was confirmed by the in-plane elemental distribution measurement of the sintered body by means of EPMA. The results showed that the composition was substantially non-uniform. This sintered body was a substantially insulating material having a bulk resistance of 2 MΩcm or more.

[Neodymium (Nd)]

Example 3-1

460 g of indium oxide and 540 g of neodymium oxide were mixed, and the resultant was pulverized and mixed for about 5 hours by means of a dry-type beads mill.

Subsequently, the resulting powder was placed in a 10 mmφ-die, and subjected to preliminary molding by means of a die pressing machine at a pressure of 100 kg/cm². Subsequently, the resultant was compacted by means of a cold isostatic pressing machine at a pressure of 4 t/cm², followed by sintering at 1350° C. for 10 hours, whereby a sintered body was obtained. The thus obtained sintered body was machined into a target (grinding, polishing, and attaching to a backing plate).

Figure 24:
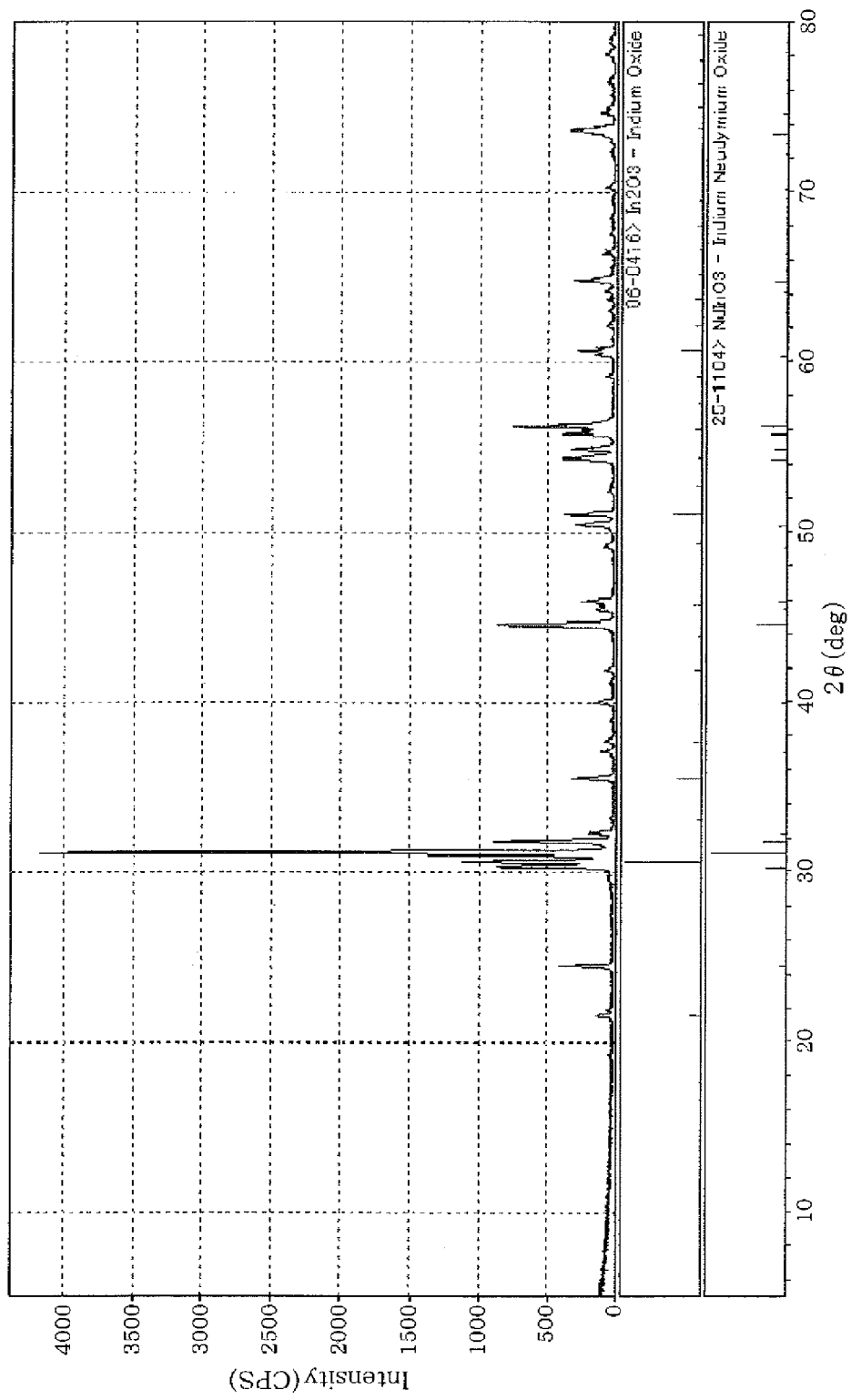
FIG. 24 is the X-ray chart of the target prepared in Example 3-1.

The X-ray diffraction measurement was conducted for the resulting target. The results showed that the target was composed of an oxide containing $NdInO_3$ and $In_2O_3$ as the main components. FIG. 24 shows an X-ray chart of the target prepared.

As a result of the ICP analysis, the atomic ratio [Nd/(Nd+In)] was 0.49.

The dispersion state of In and Nd was confirmed by the in-plane elemental distribution measurement of the target by means of EPMA. The results showed that the composition was substantially uniform.

The target had a density of 6.86 g/cm³ and a bulk resistance of 2 MΩcm or more.

Example 3-2

A target was prepared in the same manner as in Example 3-1, except that 950 g of indium oxide and 50 g of neodymium oxide were mixed.

The X-ray diffraction measurement was conducted for the resulting target. The results showed that the target was composed of an oxide containing $NdInO_3$ and $In_2O_3$ as the main components.

As a result of the ICP analysis, the atomic ratio [Nd/(Nd+In)] was 0.04.

The dispersion state of In and Nd was confirmed by the in-plane elemental distribution measurement of the target by means of EPMA. The results showed that the composition was substantially uniform.

The target had a density of 6.54 g/cm$^3$ and a bulk resistance of 0.026 Ωcm or more.

Example 3-3

480 g of tin oxide and 520 g of neodymium oxide were mixed, and the resultant was pulverized and mixed for about 5 hours by means of a dry-type beads mill.

Subsequently, the resulting powder was placed in a 10 mmφ-die, and subjected to preliminary molding by means of a die pressing machine at a pressure of 100 kg/cm$^2$. Subsequently, the resultant was compacted by means of a cold isostatic pressing machine at a pressure of 4 t/cm$^2$, followed by sintering at 1350° C. for 10 hours, whereby a sintered body was obtained. The thus obtained sintered body was machined into a target.

Figure 25:
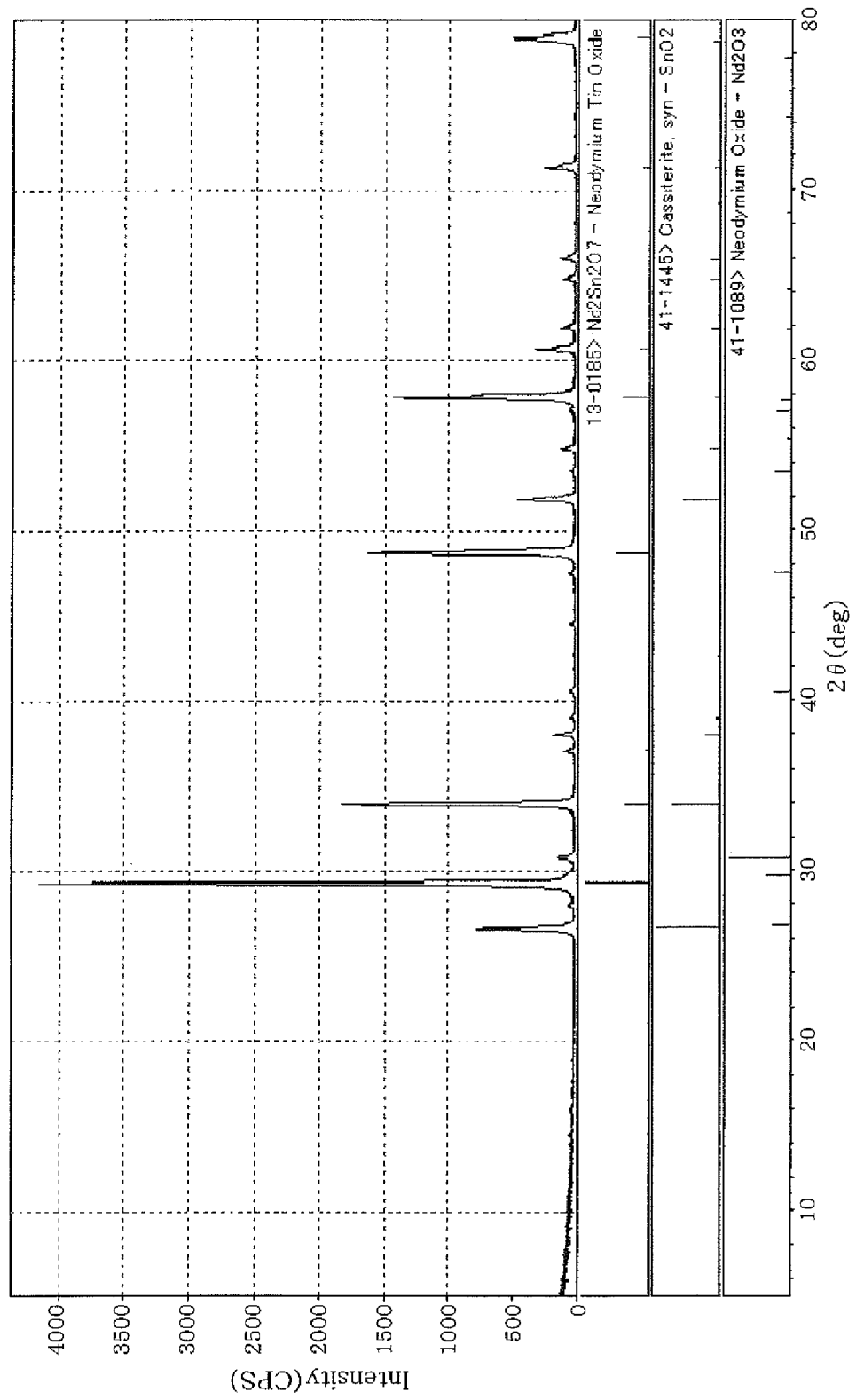
FIG. 25 is the X-ray chart of the target prepared in Example 3-3.

The X-ray diffraction measurement was conducted for the resulting target. The results showed that the target was composed of an oxide containing Nd$_2$Sn$_2$O$_7$ as the main component, SnO$_2$ and a small amount of Nd$_2$O$_3$. FIG. 25 shows an X-ray chart of the target prepared.

As a result of the ICP analysis, the atomic ratio [Nd/(Nd+Sn)] was 0.49.

The dispersion state of Sn and Nd was confirmed by the in-plane elemental distribution measurement of the target by means of EPMA. The results showed that the composition was substantially uniform. The target had a density of 6.96 g/cm$^3$ and a bulk resistance of 2 MΩcm or more.

Examples 3-4 to 3-9

Indium oxide powder, tin oxide powder and neodymium oxide powder were mixed such that the composition shown in Table 5 was attained, and the resultant was pulverized and mixed for about 5 hours by means of a dry-type beads mill.

Subsequently, the resulting powder was placed in a 10 mmφ-die, and subjected to preliminary molding by means of a die pressing machine at a pressure of 100 kg/cm$^2$. Subsequently, the resultant was compacted by means of a cold isostatic pressing machine at a pressure of 4 t/cm$^2$, followed by sintering at 1350° C. for 10 hours, whereby a sintered body was obtained. The thus obtained sintered body was machined into a target.

TABLE 5

| Example | Target composition (Amount) wt % | | |
|---|---|---|---|
| | In$_2$O$_3$ | SnO$_2$ | Nd$_2$O$_3$ |
| 3-4 | 80.0 | 10.0 | 10.0 |
| 3-5 | 70.0 | 20.0 | 10.0 |
| 3-6 | 70.0 | 10.0 | 20.0 |
| 3-7 | 60.0 | 30.0 | 10.0 |
| 3-8 | 60.0 | 20.0 | 20.0 |
| 3-9 | 60.0 | 10.0 | 30.0 |

The X-ray diffraction measurement was conducted for the resulting target. The results showed that the target contained Nd$_2$Sn$_2$O$_7$ and In$_2$O$_3$ as the main components, and NdInO$_3$.

FIGS. 26 to 30 show X-ray charts of the targets prepared in Examples 3-5 to 3-9.

Table 6 shows the results of the ICP analysis of the target, the results of the in-plane elementary distribution measurement by means of EPMA, the density and the bulk resistance.

TABLE 6

Figure 26:
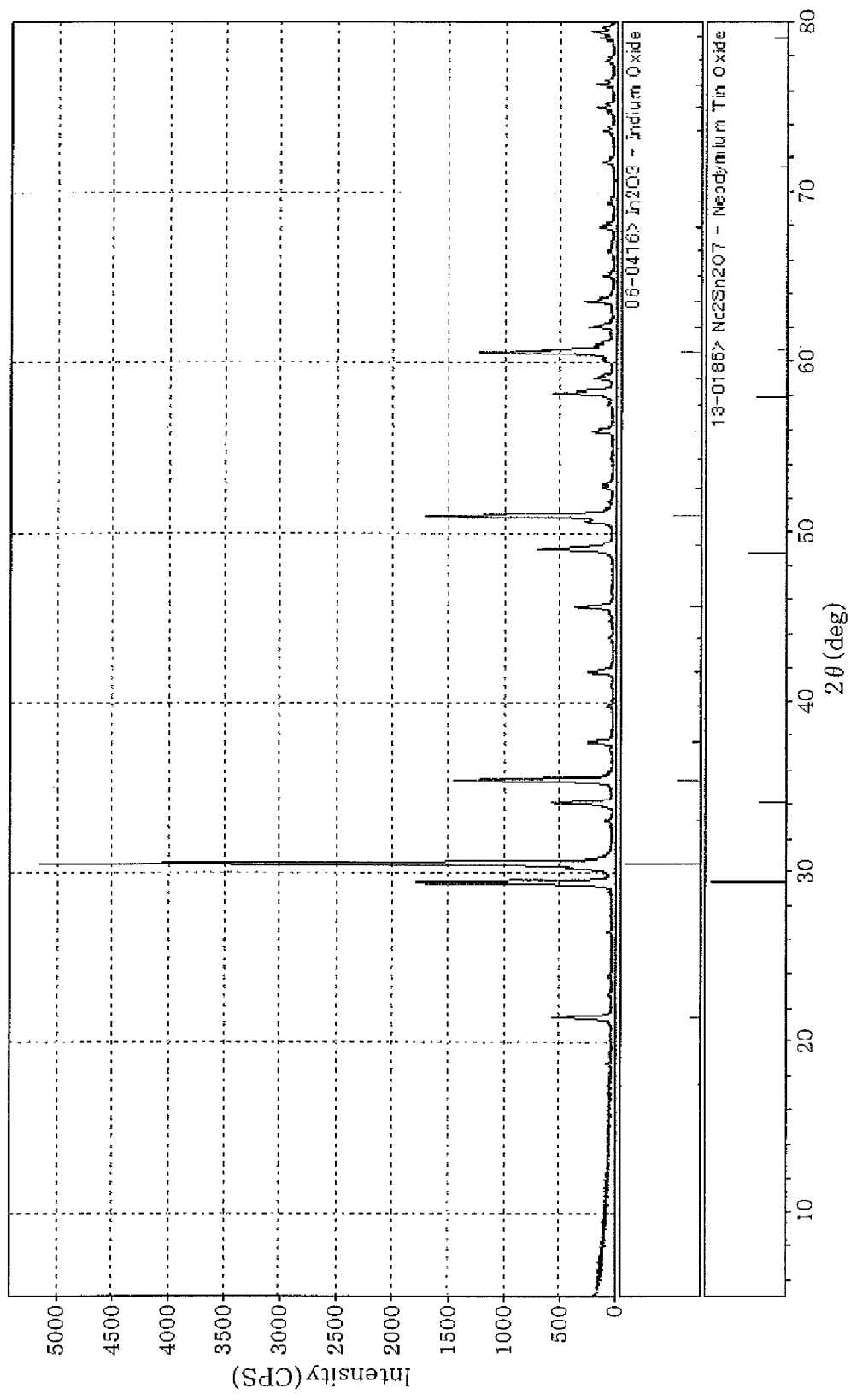
FIG. 26 is the X-ray chart of the target prepared in Example 3-5.
Figure 27:
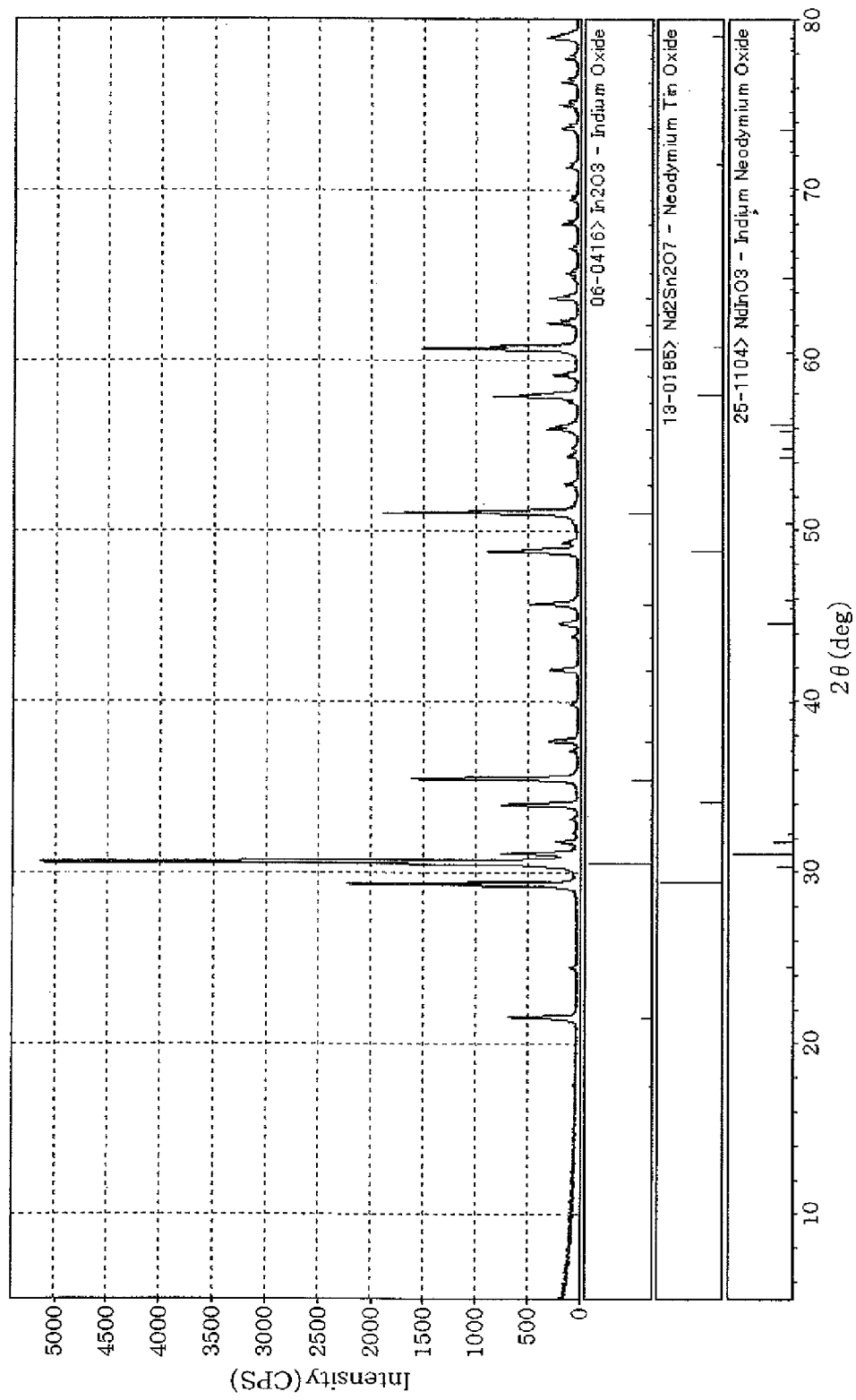
FIG. 27 is the X-ray chart of the target prepared in Example 3-6.
Figure 28:
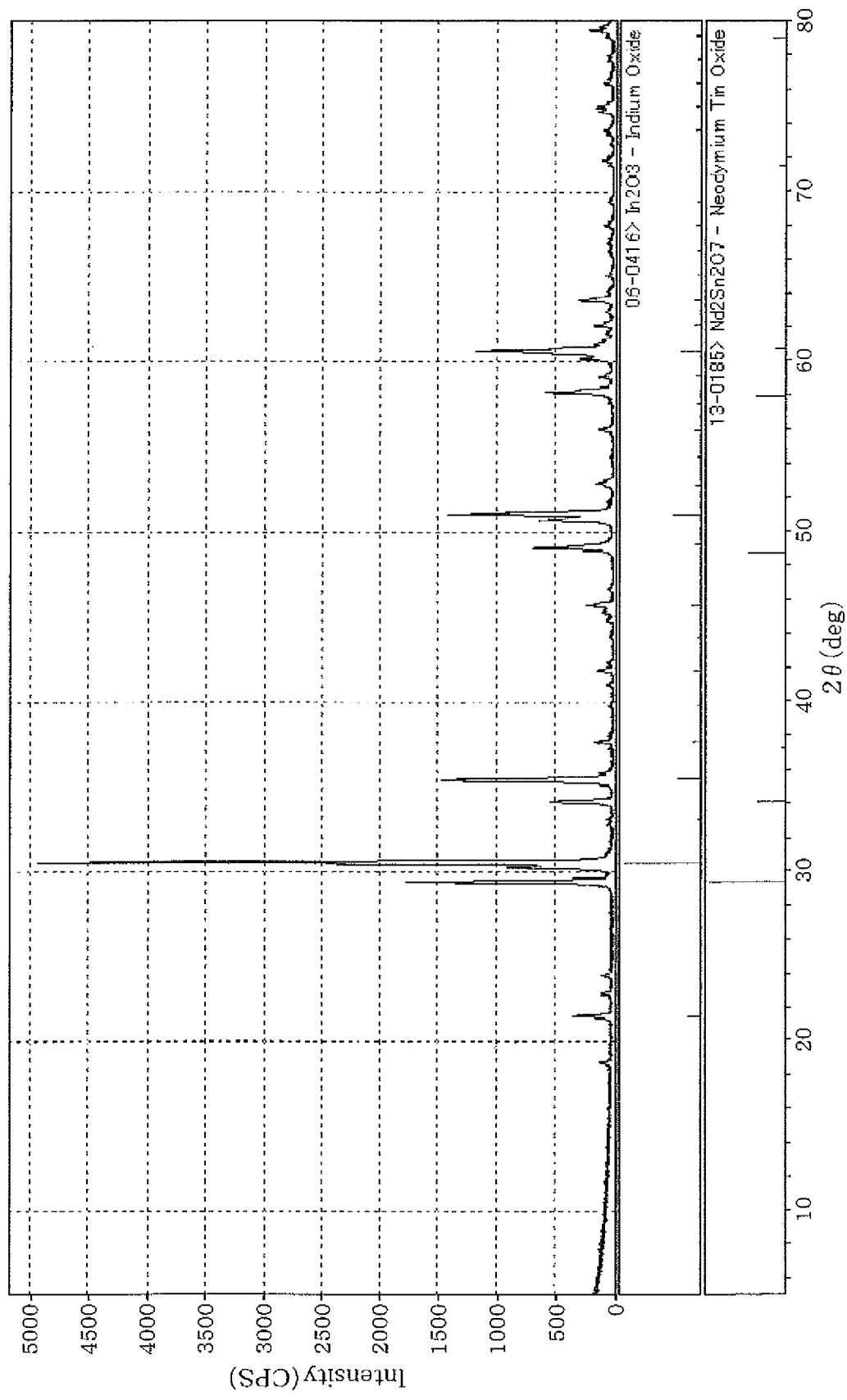
FIG. 28 is the X-ray chart of the target prepared in Example 3-7.
Figure 29:
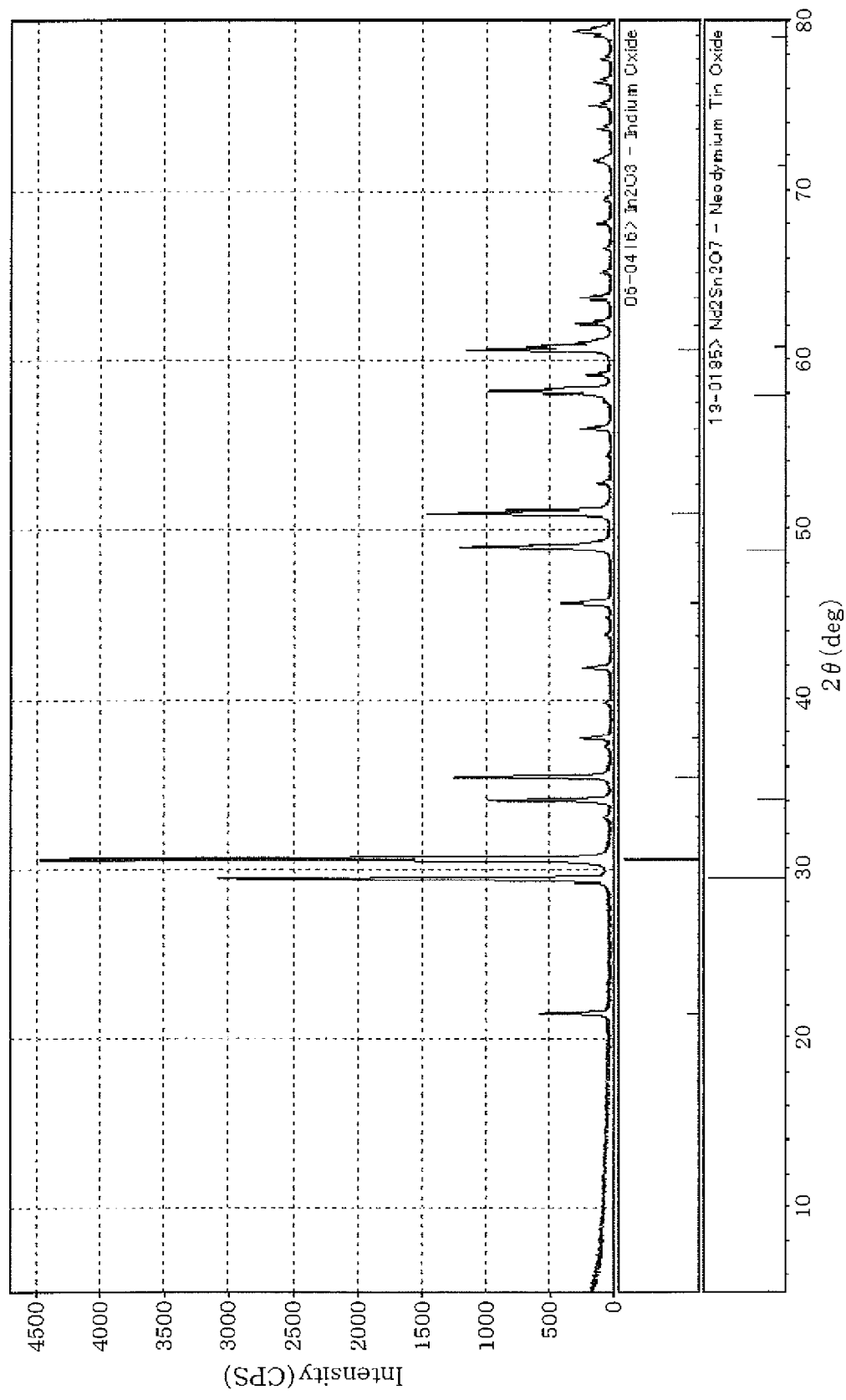
FIG. 29 is the X-ray chart of the target prepared in Example 3-8.
Figure 30:
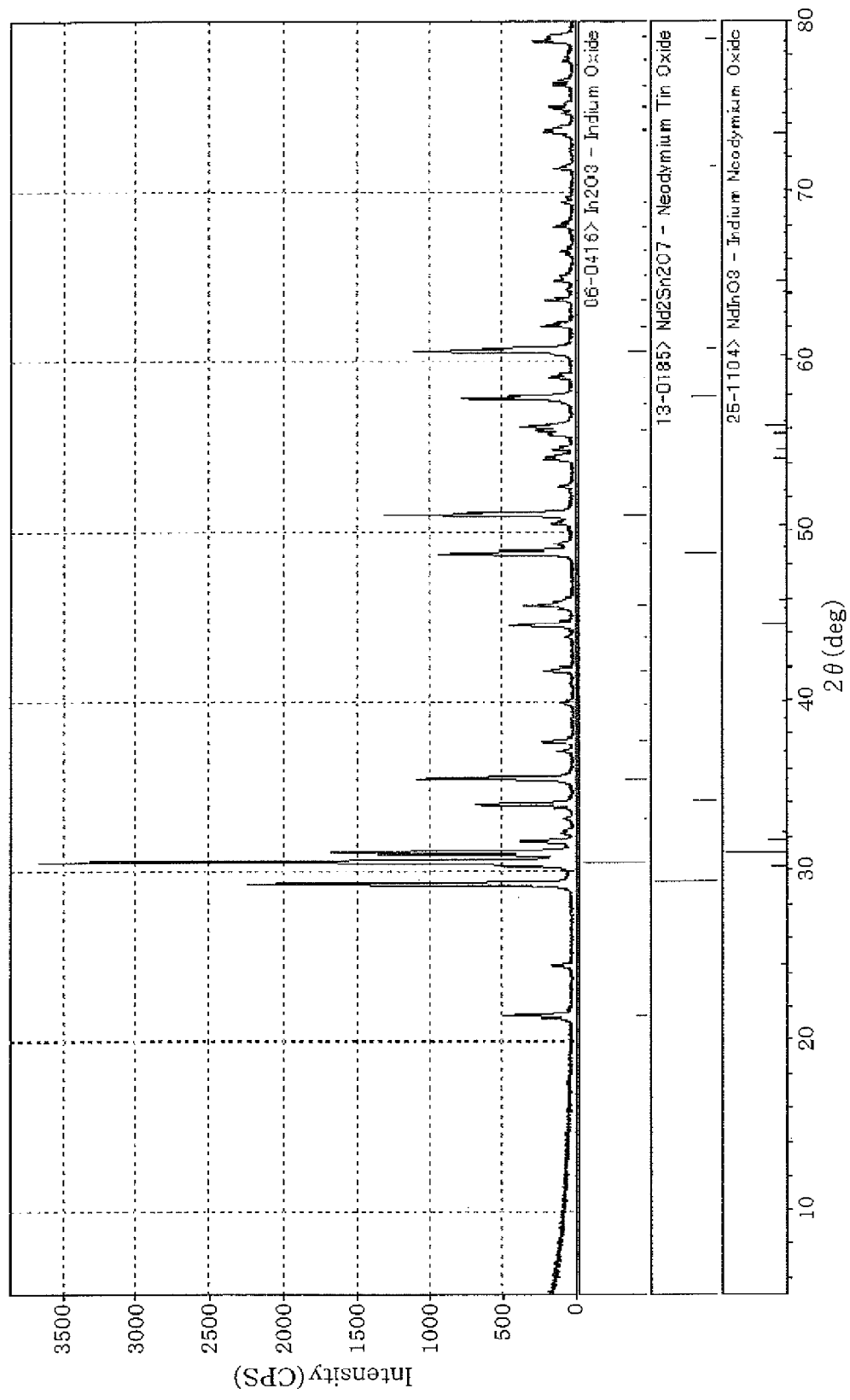
FIG. 30 is the X-ray chart of the target prepared in Example 3-9.

| Example | Results of ICP analysis*[1] | | | Results of X-ray diffractometry*[2] | | | | | X-ray chart | EPMA Uniformity | Density g/cm$^3$ | Resistance Ωcm |
|---|---|---|---|---|---|---|---|---|---|---|---|---|
| | In | Sn | Nd | In$_2$O$_3$ | SnO$_2$ | Nd$_2$O$_3$ | Nd$_2$Sn$_2$O$_7$ | NdInO$_3$ | | | | |
| 3-4 | 0.82 | 0.095 | 0.085 | ○ | X | X | ○ | X | — | Good | 6.91 | 0.005 |
| 3-5 | 0.72 | 0.19 | 0.09 | ○ | X | X | ○ | X | FIG. 26 | Good | 6.85 | 0.002 |
| 3-6 | 0.73 | 0.10 | 0.17 | ○ | X | X | ○ | ○ | FIG. 27 | Good | 6.88 | 0.068 |
| 3-7 | 0.61 | 0.29 | 0.09 | ○ | X | X | ○ | X | FIG. 28 | Good | 6.78 | 0.006 |
| 3-8 | 0.63 | 0.20 | 0.17 | ○ | X | X | ○ | X | FIG. 29 | Good | 6.86 | 0.003 |
| 3-9 | 0.64 | 0.10 | 0.26 | ○ | X | X | ○ | ○ | FIG. 30 | Good | 6.81 | 0.028 |

*[1]Each value in the table is the ratio of each atom to (In + Sn + Nd) (atomic amount ratio).
*[2]Results of X-ray diffractometry: ○ The compound was identified. Δ: A minor peak was observed. X: No peak was observed.

Comparative Example 3-1

150 g of indium oxide powder, 150 g of tin oxide powder and 700 g of neodymium oxide powder were mixed, and the resultant was pulverized and mixed for about 5 hours by means of a dry-type beads mill.

Subsequently, the resulting powder was placed in a 10 mmφ-die, and subjected to preliminary molding by means of a die pressing machine at a pressure of 100 kg/cm$^2$. Subsequently, the resultant was compacted by means of a cold isostatic pressing machine at a pressure of 4 t/cm$^2$, followed by sintering at 1350° C. for 10 hours, whereby a sintered body was obtained. The sintered body could not be machined into a target since it was broken.

The X-ray diffraction measurement was conducted for the thus obtained sintered body. The results showed that the sintered body was composed of an oxide containing NdInO$_3$, Nd$_2$Sn$_2$O$_7$ and Nd$_2$O$_3$ as the main components.

As a result of the ICP analysis, the atomic ratio [Nd/(Nd+In)] was 0.67.

The dispersion state of In and Nd was confirmed by the in-plane elemental distribution measurement of the sintered body by means of EPMA. The results showed that the composition was substantially non-uniform.

This sintered body had a density of 5.64 g/cm³ and a bulk resistance exceeded the measurement limit.

[Ytterbium (Yb)]

Examples 4-1 to 4-9

Indium oxide powder, tin oxide powder and ytterbium oxide powder were mixed such that the composition shown in Table 7 was attained, and the resultant was pulverized and mixed for about 5 hours by means of a dry-type beads mill.

Subsequently, the resulting powder was placed in a 10 mmφ-die, and was subjected to preliminary molding by means of a die pressing machine at a pressure of 100 kg/cm². Subsequently, the resultant was compacted by means of a cold isostatic pressing machine at a pressure of 4 t/cm², followed by sintering at 1350° C. for 10 hours, whereby a sintered body was obtained. The thus obtained sintered body was machined into a target.

TABLE 7

| | Target composition (Amount) wt % | | |
|---|---|---|---|
| | $In_2O_3$ | $SnO_2$ | $Yb_2O_3$ |
| 4-1 | 70.0 | 10.0 | 20.0 |
| 4-2 | 70.0 | 20.0 | 10.0 |
| 4-3 | 60.0 | 10.0 | 30.0 |
| 4-4 | 60.0 | 20.0 | 20.0 |
| 4-5 | 60.0 | 30.0 | 10.0 |
| 4-6 | 50.0 | 10.0 | 40.0 |
| 4-7 | 50.0 | 20.0 | 30.0 |
| 4-8 | 50.0 | 30.0 | 20.0 |
| 4-9 | 50.0 | 40.0 | 10.0 |

The X-ray diffraction measurement was conducted for the resulting target. The results showed that the target was composed mostly of $Yb_2Sn_2O_7$ and $In_2O_3$.

FIGS. 31 to 39 show the X-ray charts of the targets prepared in Examples 4-1 to 4-9.

Table 8 shows the results of the ICP analysis of the target, the results of the in-plane elementary distribution measurement by means of EPMA, the density and the bulk resistance.

TABLE 8

Figure 31:
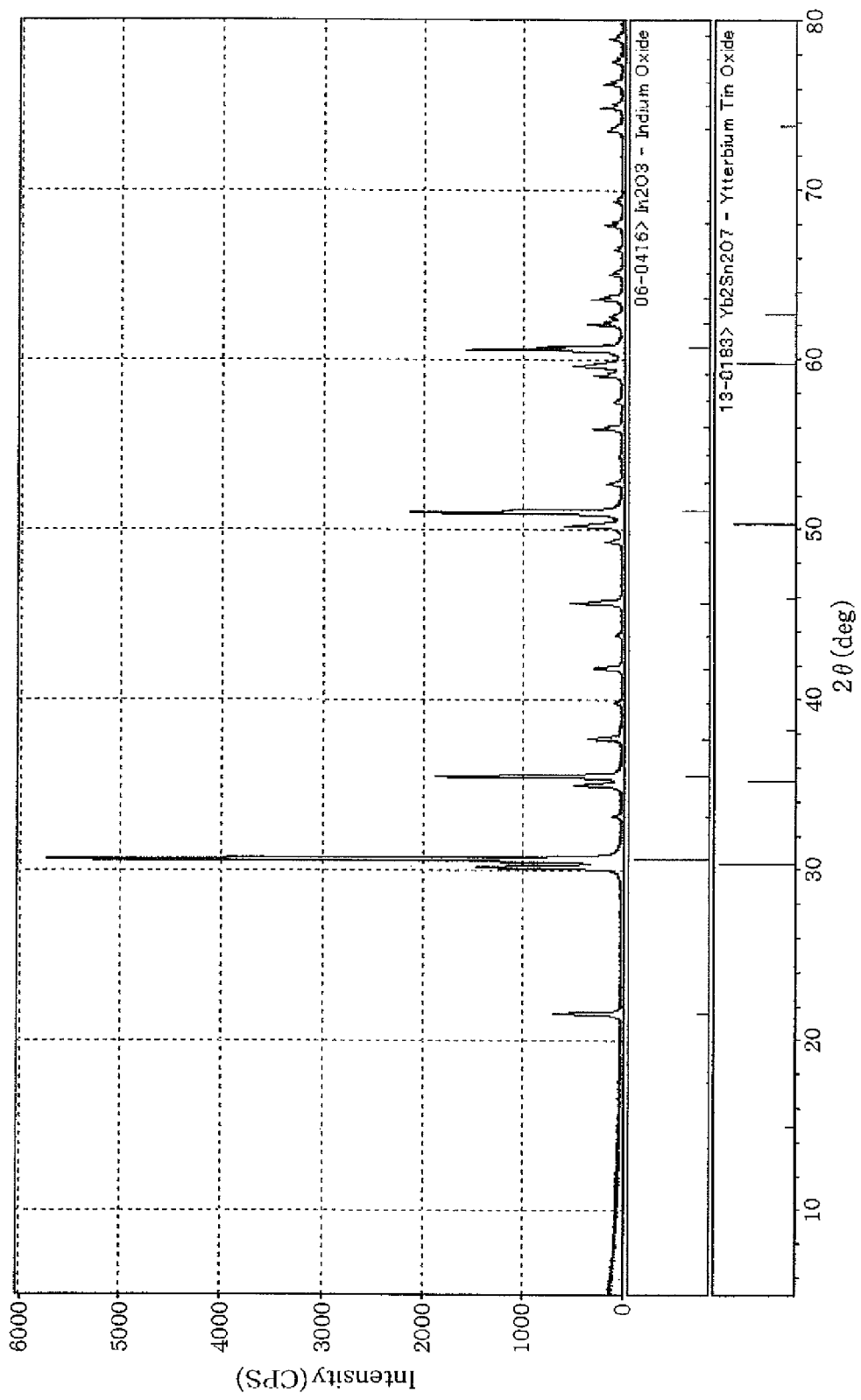
FIG. 31 is the X-ray chart of the target prepared in Example 4-1.
Figure 32:
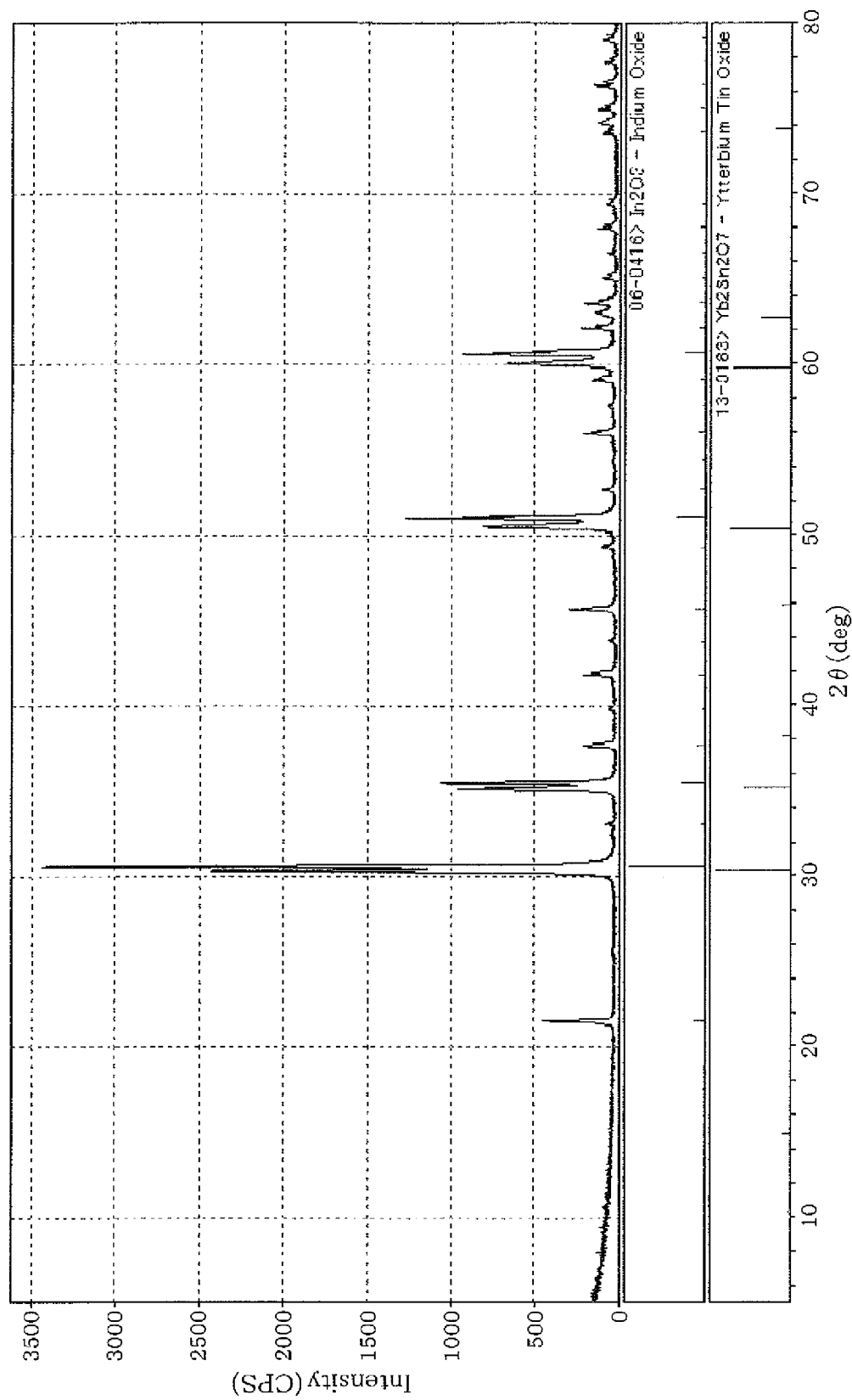
FIG. 32 is the X-ray chart of the target prepared in Example 4-2.
Figure 33:
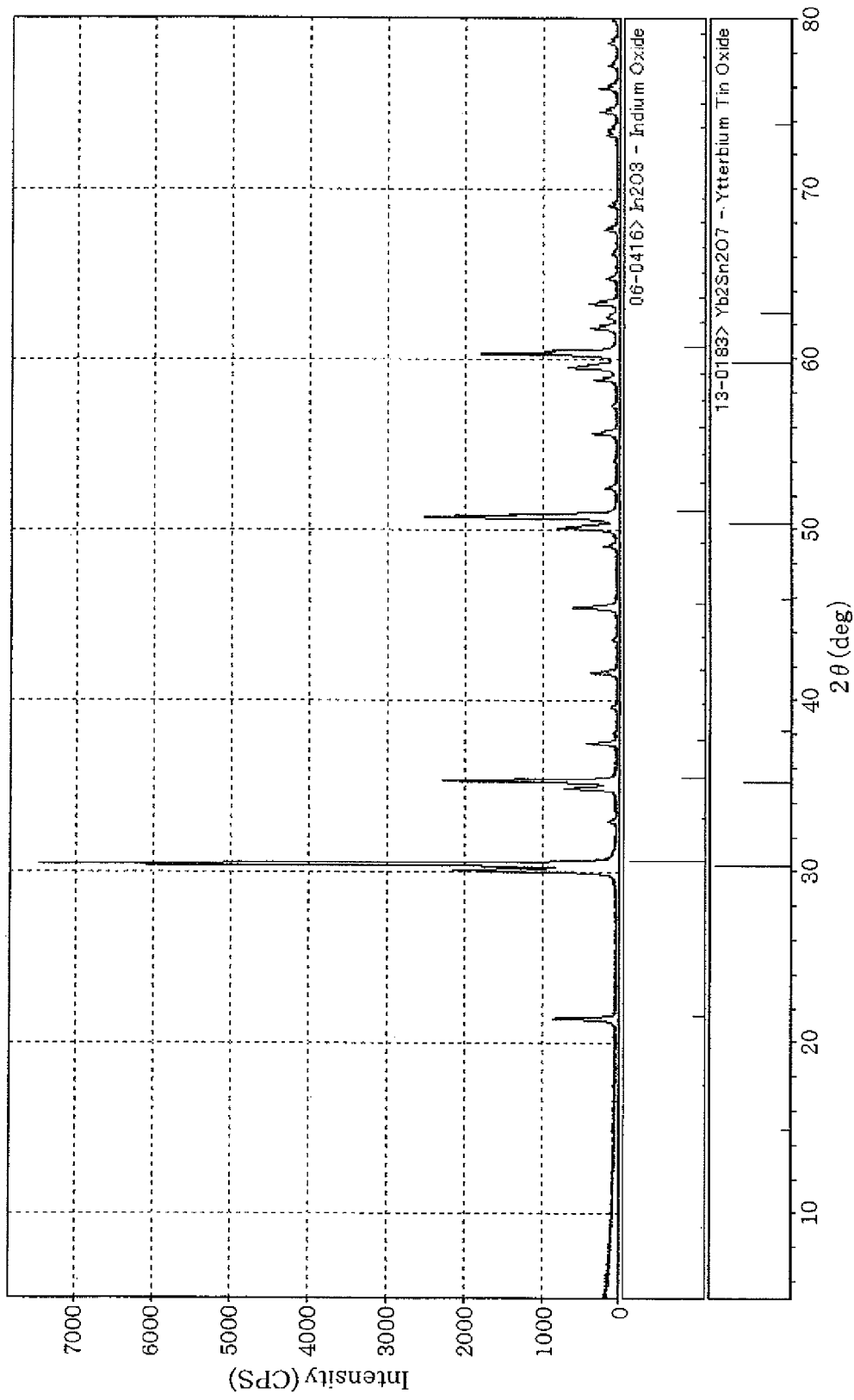
FIG. 33 is the X-ray chart of the target prepared in Example 4-3.
Figure 34:
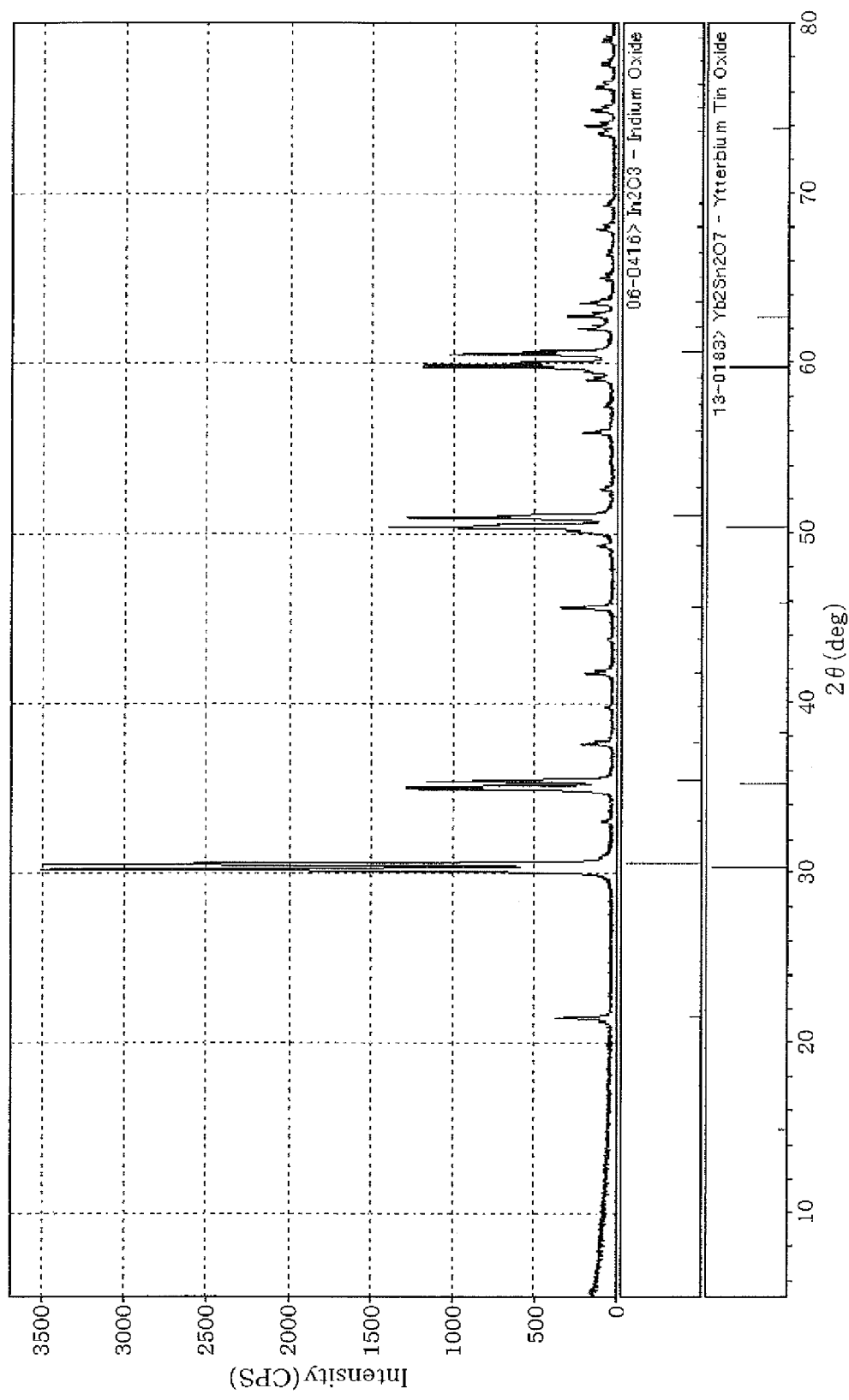
FIG. 34 is the X-ray chart of the target prepared in Example 4-4.
Figure 35:
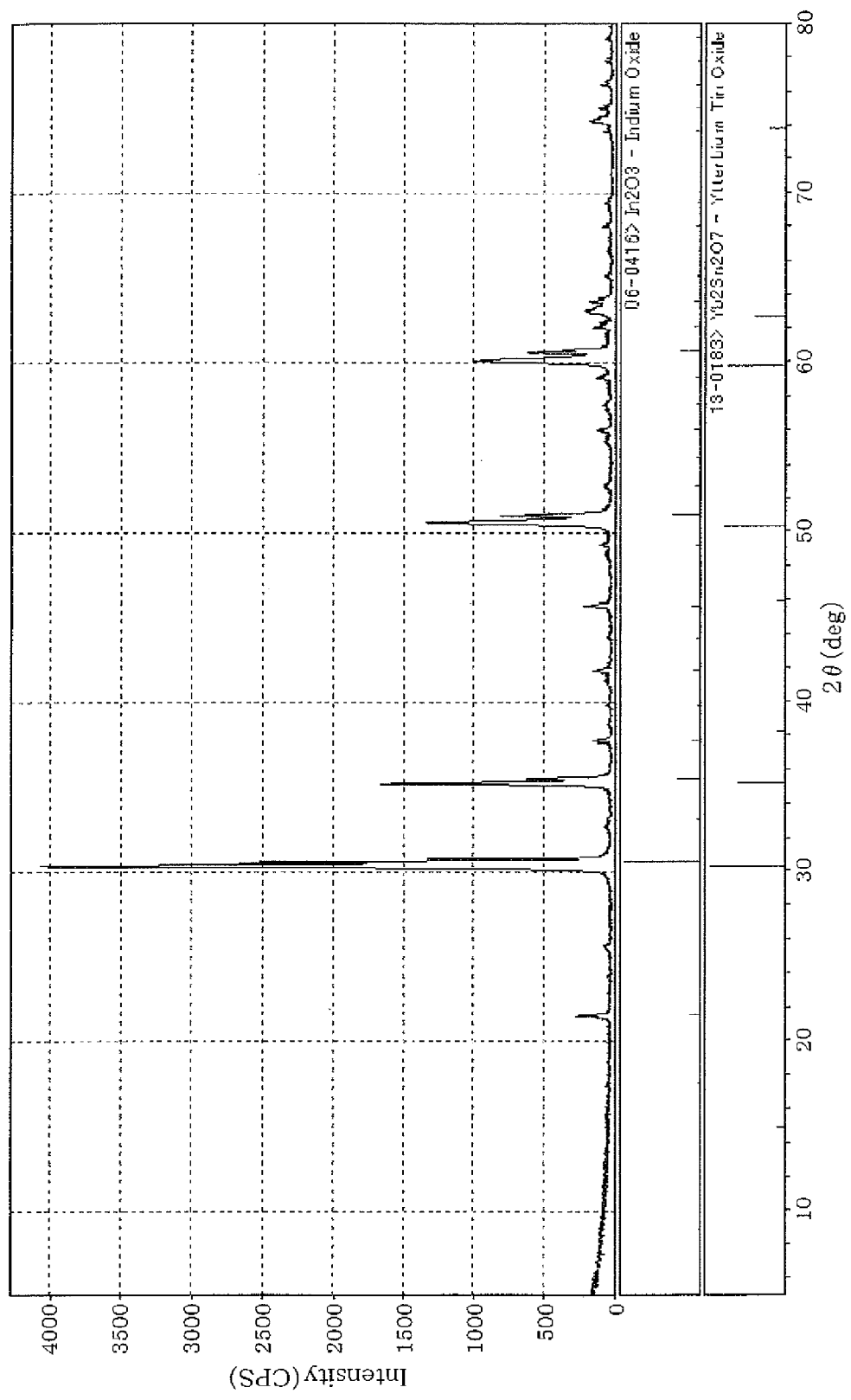
FIG. 35 is the X-ray chart of the target prepared in Example 4-5.
Figure 36:
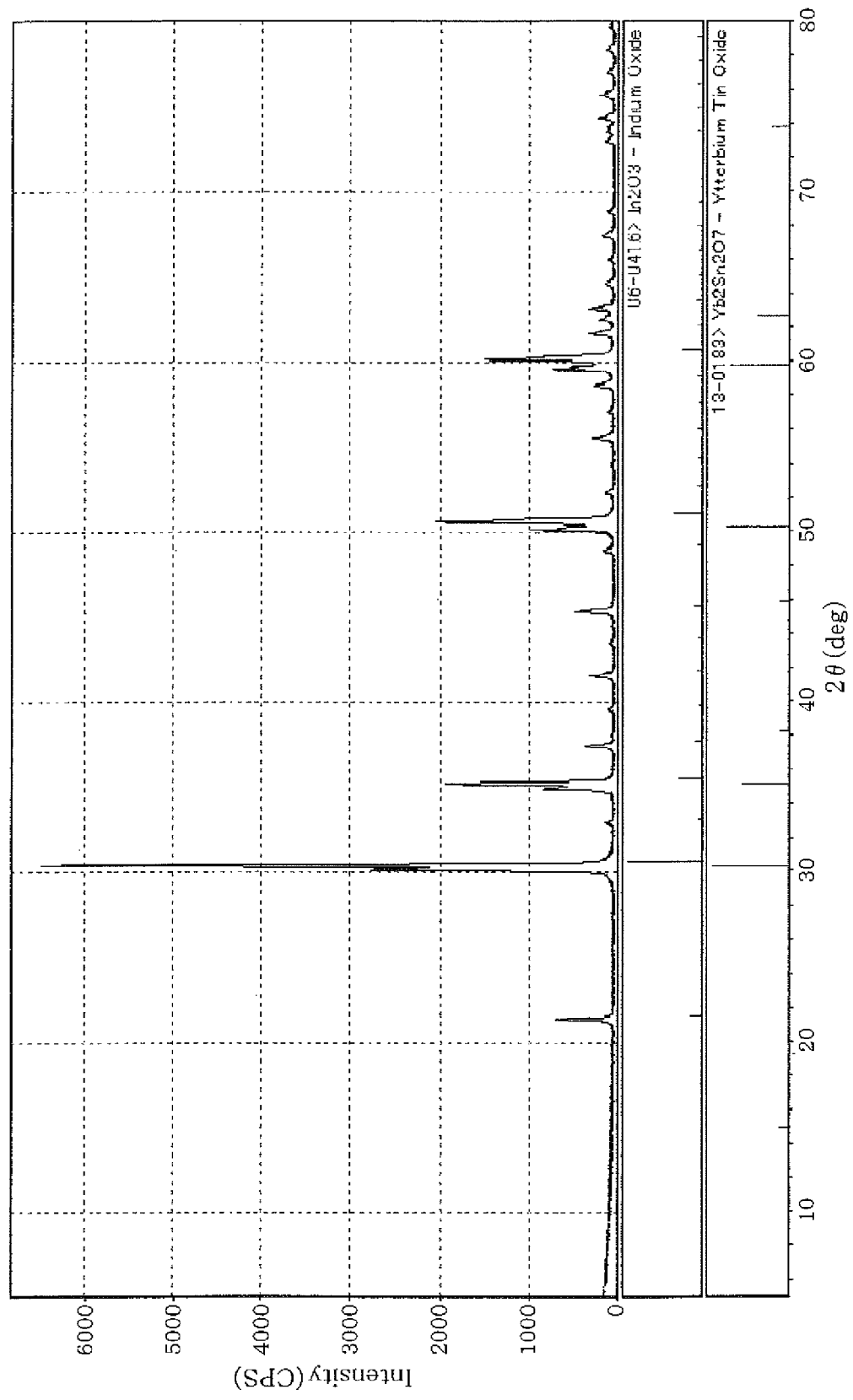
FIG. 36 is the X-ray chart of the target prepared in Example 4-6.
Figure 37:
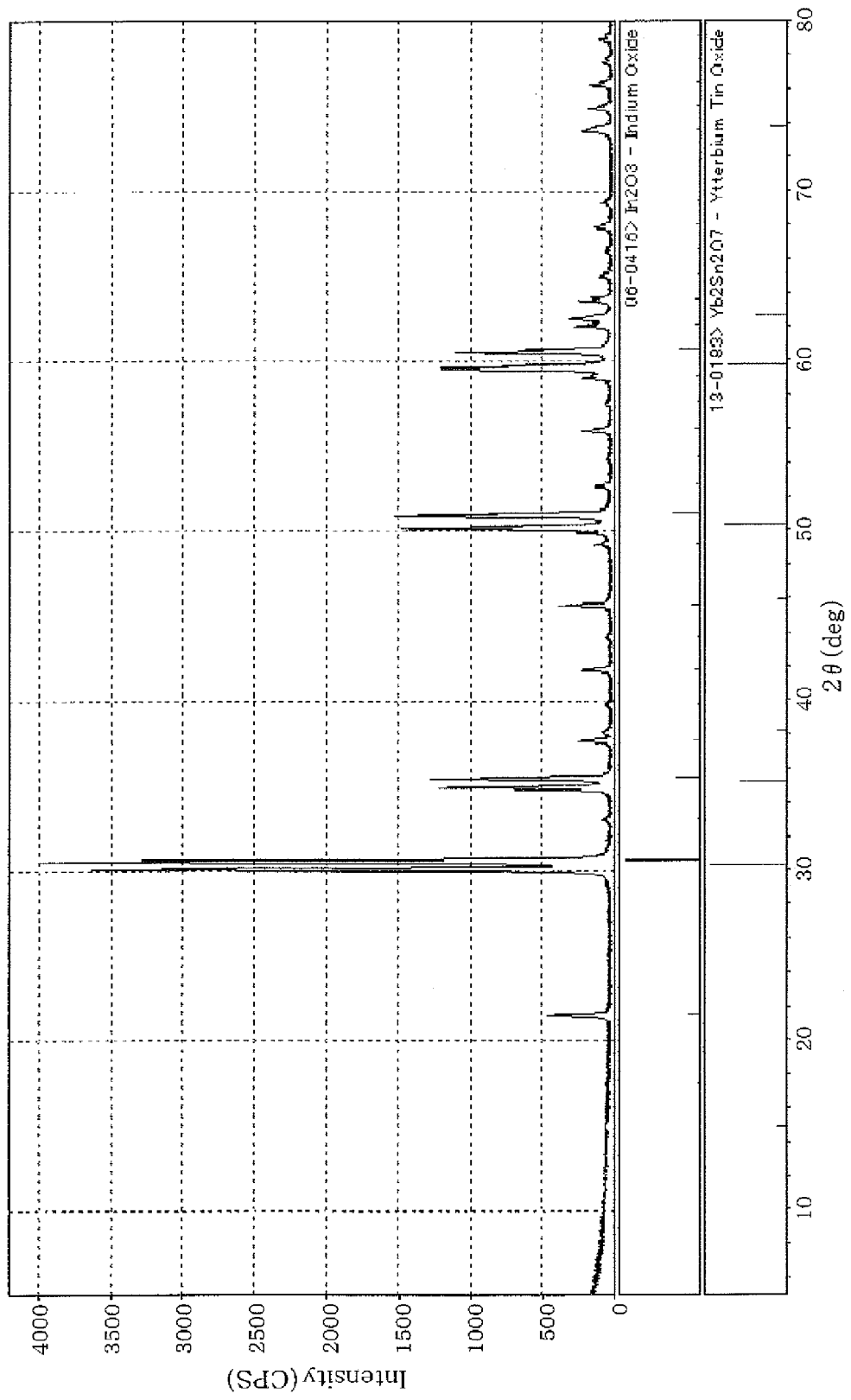
FIG. 37 is the X-ray chart of the target prepared in Example 4-7.
Figure 38:
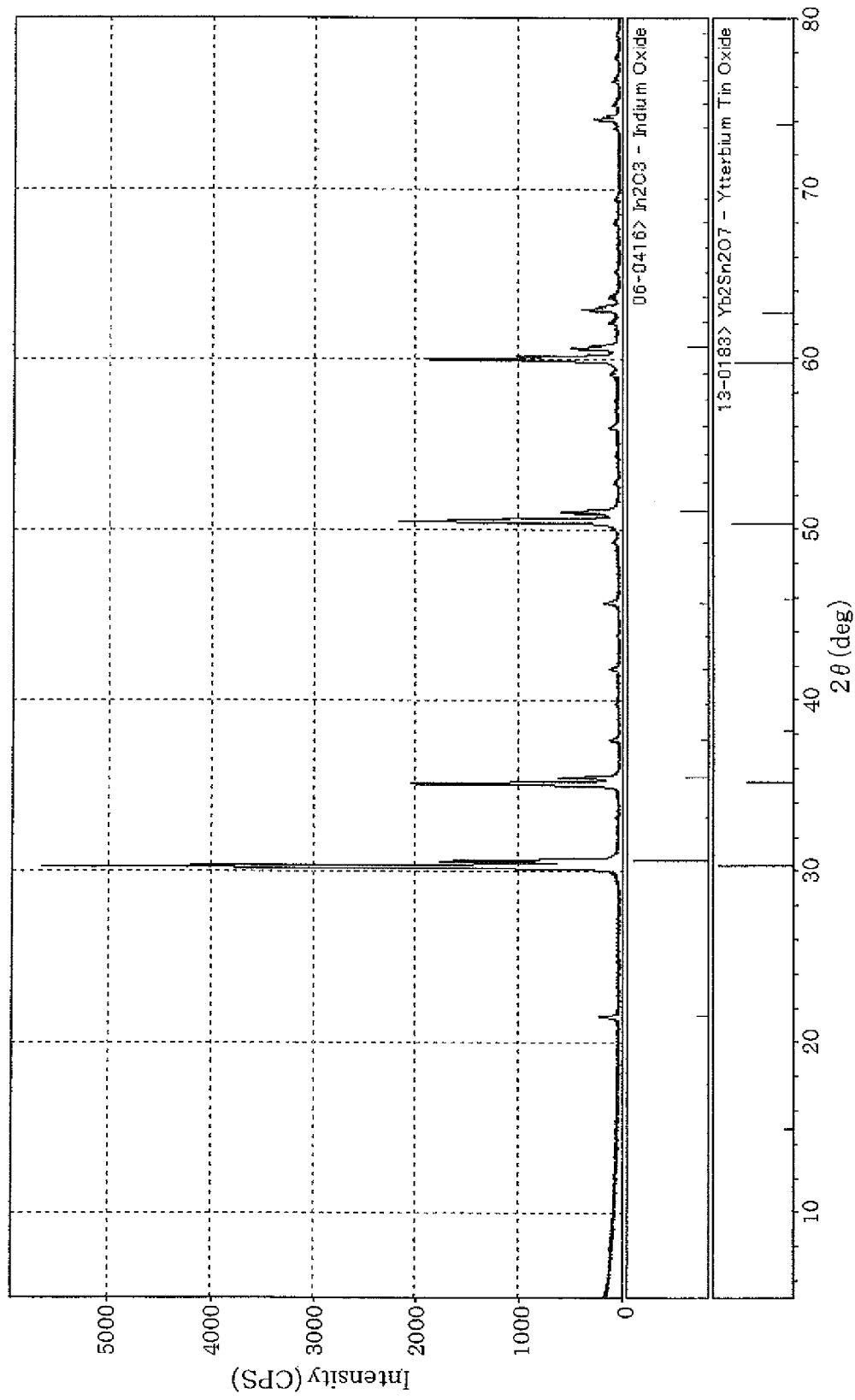
FIG. 38 is the X-ray chart of the target prepared in Example 4-8.
Figure 39:
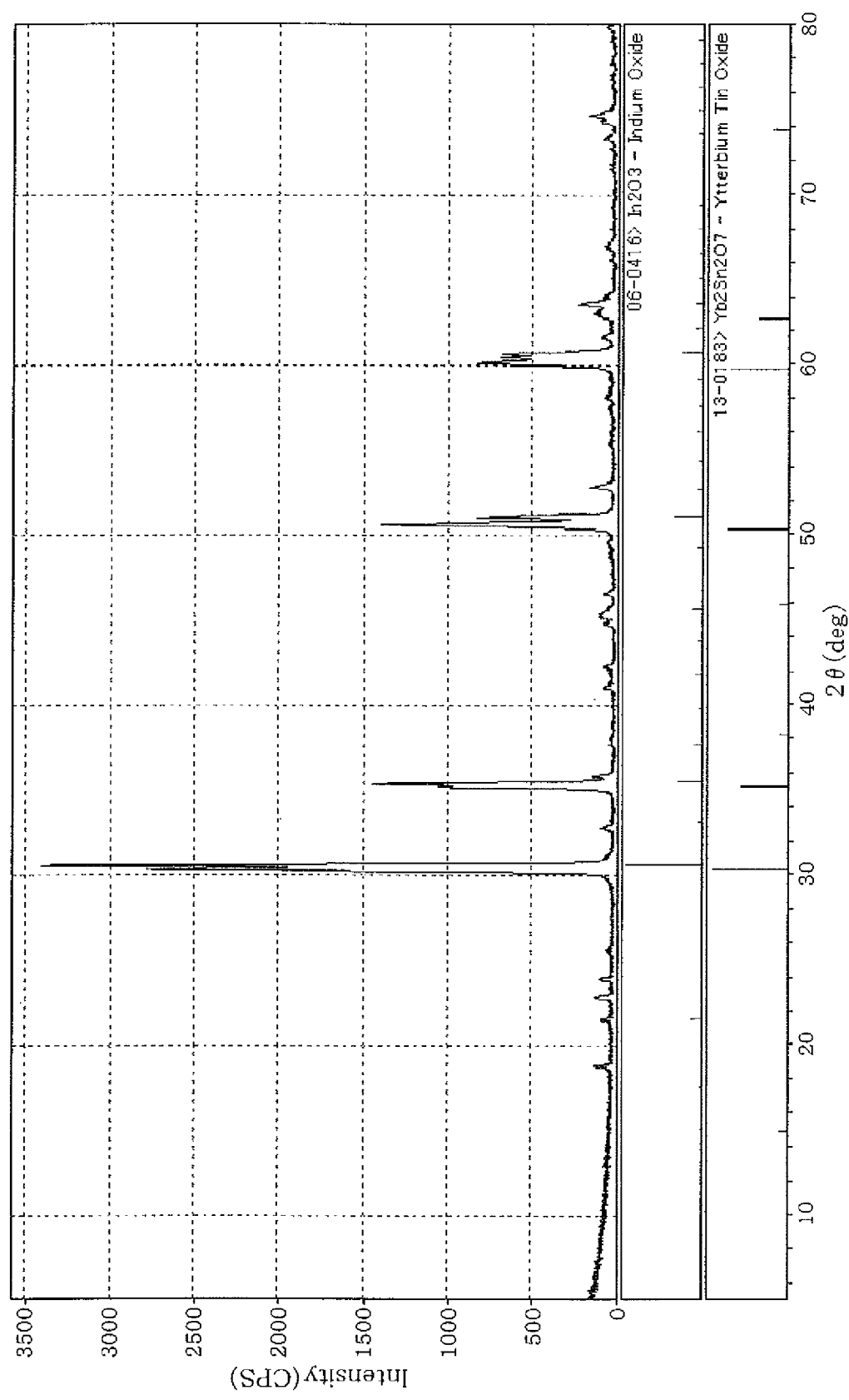
FIG. 39 is the X-ray chart of the target prepared in Example 4-9.

| | Results of ICP analysis*¹ | | | Results of X-ray diffractometry*² | | | | | X-ray chart | EPMA Uniformity | Density g/cm³ | Resistance Ωcm |
|---|---|---|---|---|---|---|---|---|---|---|---|---|
| Example | In | Sn | Yb | $In_2O_3$ | $SnO_2$ | $Yb_2O_3$ | $Yb_2Sn_2O_7$ | $YbInO_3$ | | | | |
| 4-1 | 0.75 | 0.10 | 0.15 | ○ | X | X | ○ | X | FIG. 31 | Good | 6.56 | 0.2 |
| 4-2 | 0.73 | 0.19 | 0.08 | ○ | X | X | ○ | X | FIG. 32 | Good | 6.62 | 0.011 |
| 4-3 | 0.66 | 0.10 | 0.24 | ○ | X | X | ○ | X | FIG. 33 | Good | 6.58 | 2.2 |
| 4-4 | 0.65 | 0.20 | 0.15 | ○ | X | X | ○ | X | FIG. 34 | Good | 6.75 | 0.048 |
| 4-5 | 0.63 | 0.29 | 0.08 | ○ | X | X | ○ | X | FIG. 35 | Good | 6.76 | 0.037 |
| 4-6 | 0.57 | 0.11 | 0.32 | ○ | X | X | ○ | X | FIG. 36 | Good | 6.68 | 1M |
| 4-7 | 0.56 | 0.21 | 0.23 | ○ | X | X | ○ | X | FIG. 37 | Good | 6.62 | 0.3 |
| 4-8 | 0.54 | 0.30 | 0.16 | ○ | X | X | ○ | X | FIG. 38 | Good | 6.57 | 0.072 |
| 4-9 | 0.53 | 0.39 | 0.08 | ○ | X | X | ○ | X | FIG. 39 | Good | 6.56 | 0.22 |

*¹Each value in the table is the ratio of each atom to (In + Sn + Yb) (atomic amount ratio).
*²Results of X-ray diffractometry: ○ The compound was identified. X: No peak was observed.

Comparative Example 4-1

150 g of indium oxide and 850 g of ytterbium oxide were mixed, and the resultant was pulverized and mixed for about 5 hours by means of a wet-type beads mill, followed by drying by means of a spray dryer.

Subsequently, the resulting powder was placed in a 10 mmφ-die, and subjected to preliminary molding by means of a die pressing machine at a pressure of 100 kg/cm². Subsequently, the resultant was compacted by means of a cold isostatic pressing machine at a pressure of 4 t/cm², followed by sintering at 1350° C. for 10 hours.

The sintered body immediately after being taken out from the furnace had a large number of cracks, and broken. Therefore, this sintered body could not be machined into a target (grinding, polishing, and attaching to a backing plate).

The X-ray diffraction measurement was conducted for this sintered body. The results showed that the sintered body was composed mostly of ytterbium oxide ($Yb_2O_3$).

As a result of the ICP analysis, the atomic ratio [Yb/(Yb+In)] was 0.81.

The dispersion state of In and Yb was confirmed by the in-plane elemental distribution measurement of the sintered body by means of EPMA. The results showed that the composition was substantially non-uniform. This sintered body was an almost insulating material having a bulk resistance of 2 MΩcm or more.

[Erbium (Er)]

Example 5-1

450 g of indium oxide and 550 g of erbium oxide were mixed and the resultant was pulverized and mixed for about 5 hours by means of a wet-type beads mill, followed by drying and granulation, to obtain fine particles with a diameter of 0.1 to several mm.

Subsequently, the resulting powder was placed in a 10 mmφ-die, and subject to a preliminary molding by means of a die pressing machine at a pressure of 100 kg/cm². Subsequently, the resultant was compacted by means of a cold isostatic pressing machine at a pressure of 4 t/cm², followed by sintering at 1350° C. for 10 hours, whereby a sintered body was obtained. The sintered body was machined into a target (grinding, polishing, and attaching to a backing plate).

The X-ray diffraction measurement was conducted for the resulting target. The results showed that the target was composed of an oxide containing $ErInO_3$ and $In_2O_3$ as the main components.

Figure 40:
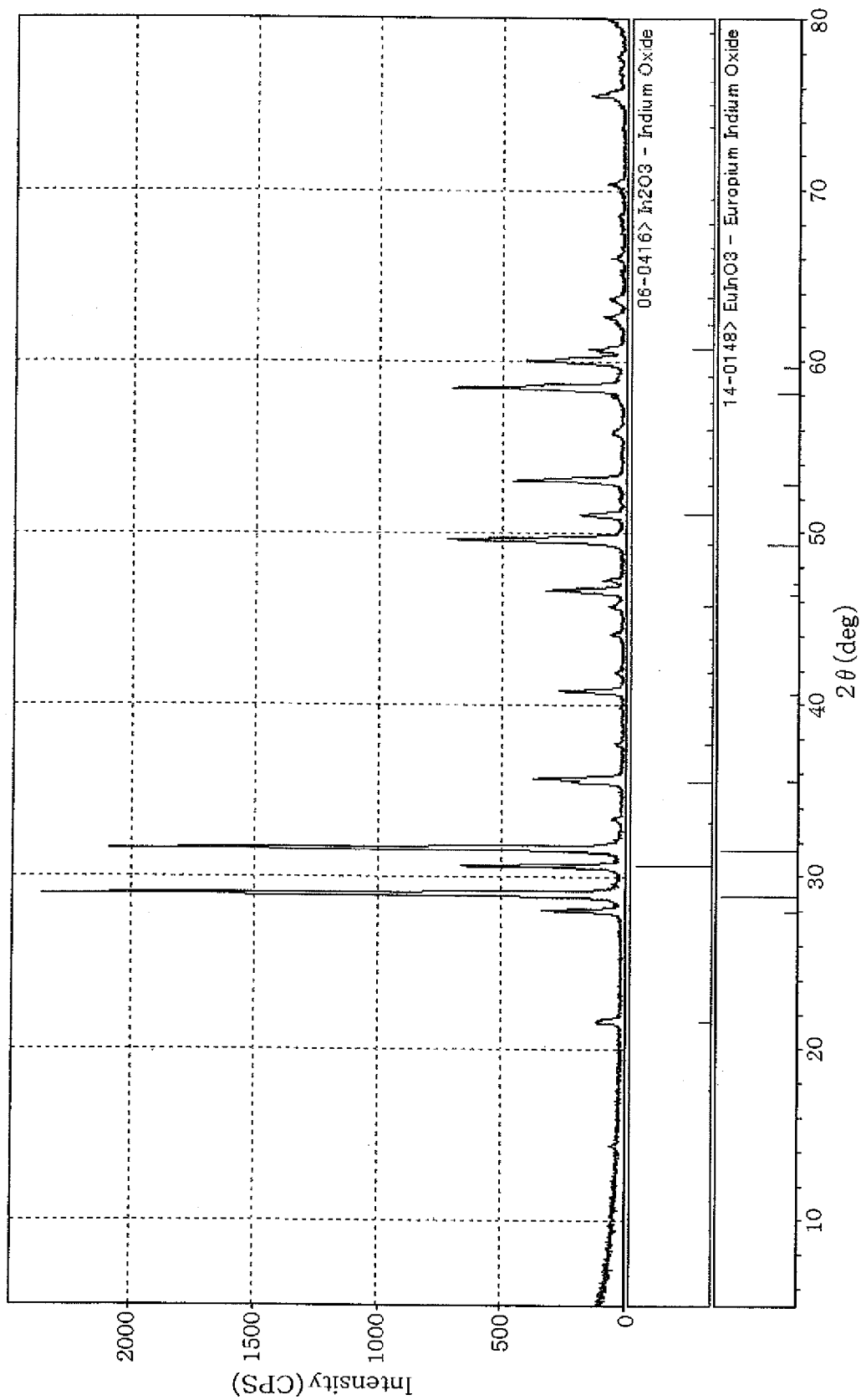
FIG. 40 is the X-ray chart of the target prepared in Example 5-1.

FIG. 40 shows the X-ray chart of the target.

As a result of the ICP analysis, the atomic ratio [Er/(Er+In)] was 0.47.

The dispersion state of In and Er was confirmed by the in-plane elemental distribution measurement of the sintered body by means of EPMA. The results showed that the composition was substantially uniform.

The target had a density of 4.63 g/cm² and a bulk resistance of 1.8 MΩcm.

Example 5-2

450 g of tin oxide and 550 g of erbium oxide were mixed and the resultant was pulverized and mixed for about 5 hours by means of a wet-type beads mill, followed by drying and granulation.

Subsequently, the resulting powder was placed in a 10 mmφ-die, and subjected to preliminary molding by means of a die pressing machine at a pressure of 100 kg/cm². Subsequently, the resultant was compacted by means of a cold isostatic pressing machine at a pressure of 4 t/cm², followed by sintering at 1350° C. for 10 hours, whereby a sintered body was obtained. The sintered body was machined into a target.

The X-ray diffraction measurement was conducted for the resulting target. The results showed that the target was composed of an oxide containing $Er_2Sn_2O_7$ and $SnO_2$ as the main components.

Figure 41:
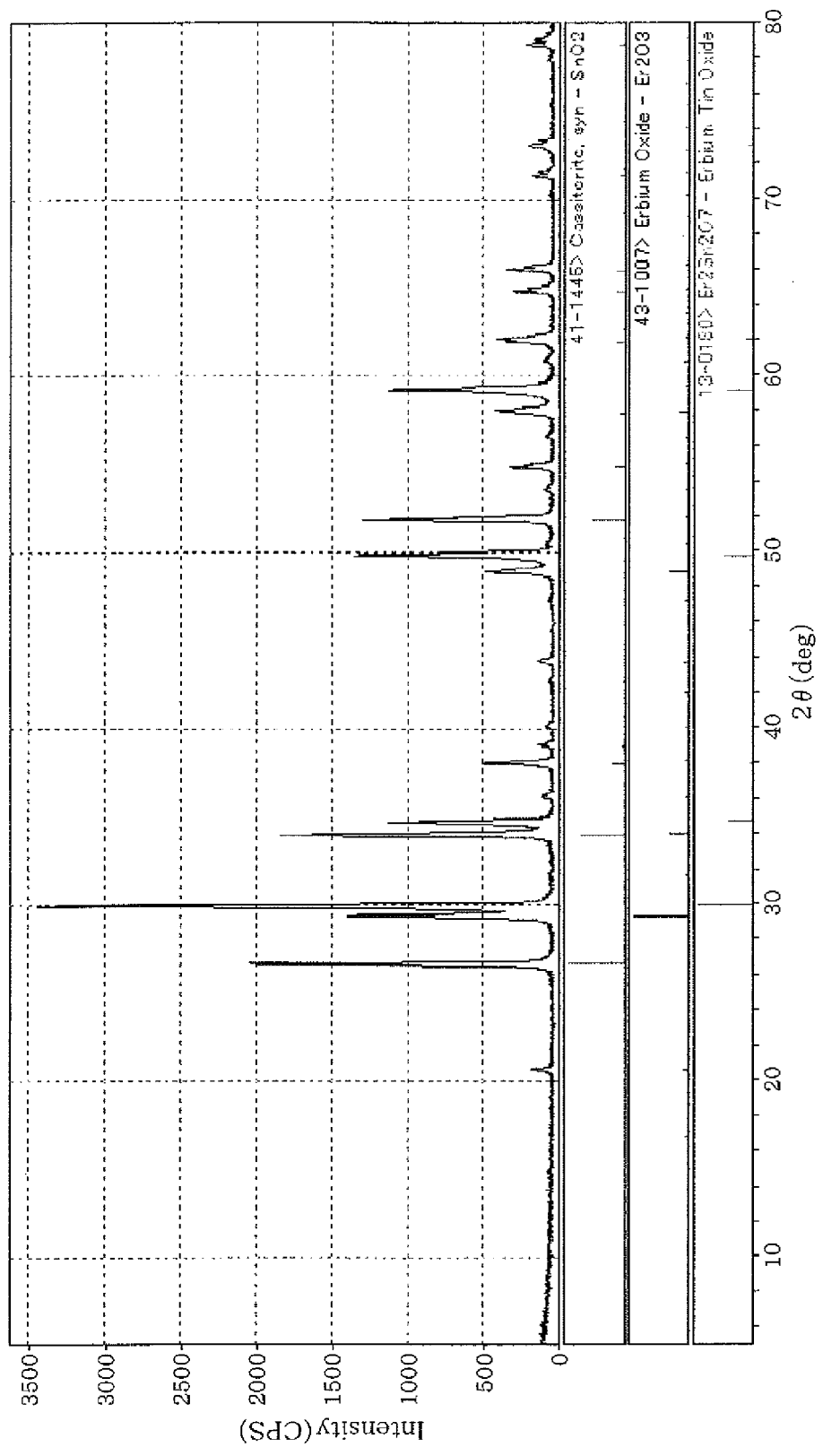
FIG. 41 is the X-ray chart of the target prepared in Example 5-2.

FIG. 41 shows the X-ray chart of the target.

As a result of the ICP analysis, the atomic ratio [Er/(Er+Sn)] was 0.49.

The dispersion state of Sn and Er was confirmed by the in-plane elemental distribution measurement of the sintered body by means of EPMA. The results showed that the composition was substantially uniform. The target had a density of 4.52 g/cm³ and a bulk resistance of 1.9 MΩcm.

Examples 5-3 to 5-12

Indium oxide powder, tin oxide powder and erbium oxide powder were mixed such that the composition shown in Table 9 was attained, and the resultant was pulverized and mixed for about 5 hours by means of a wet-type beads mill, followed by drying and granulation.

Subsequently, the resulting powder was placed in a 10 mmφ-die, and subjected to preliminary molding by means of a die pressing machine at a pressure of 100 kg/cm². Subsequently, the resultant was compacted by means of a cold isostatic pressing machine at a pressure of 4 t/cm², followed by sintering at 1350° C. for 10 hours, whereby a sintered body was obtained. The thus obtained sintered body was machined into a target.

TABLE 9

| | Target composition (Amount) wt % | | |
|---|---|---|---|
| Example | $In_2O_3$ | $SnO_2$ | $Er_2O_3$ |
| 5-1 | 45.0 | 0.0 | 55.0 |
| 5-2 | 0.0 | 45.0 | 55.0 |
| 5-3 | 80.0 | 5.0 | 15.0 |
| 5-4 | 70.0 | 10.0 | 20.0 |
| 5-5 | 70.0 | 20.0 | 10.0 |
| 5-6 | 60.0 | 10.0 | 30.0 |
| 5-7 | 60.0 | 20.0 | 20.0 |
| 5-8 | 60.0 | 30.0 | 10.0 |
| 5-9 | 50.0 | 10.0 | 40.0 |
| 5-10 | 50.0 | 20.0 | 30.0 |
| 5-11 | 50.0 | 30.0 | 20.0 |
| 5-12 | 50.0 | 40.0 | 10.0 |

The X-ray diffraction measurement was conducted for the resulting target. The results showed that the target was composed mostly of $Er_2Sn_2O_7$ and $In_2O_3$.

FIGS. 42 to 51 show X-ray charts of the targets prepared in Examples 5-3 to 5-12.

Table 10 shows the results of the ICP analysis of the target, the results of the in-plane elementary distribution measurement by means of EPMA, the density and the bulk resistance.

TABLE 10

Figure 42:
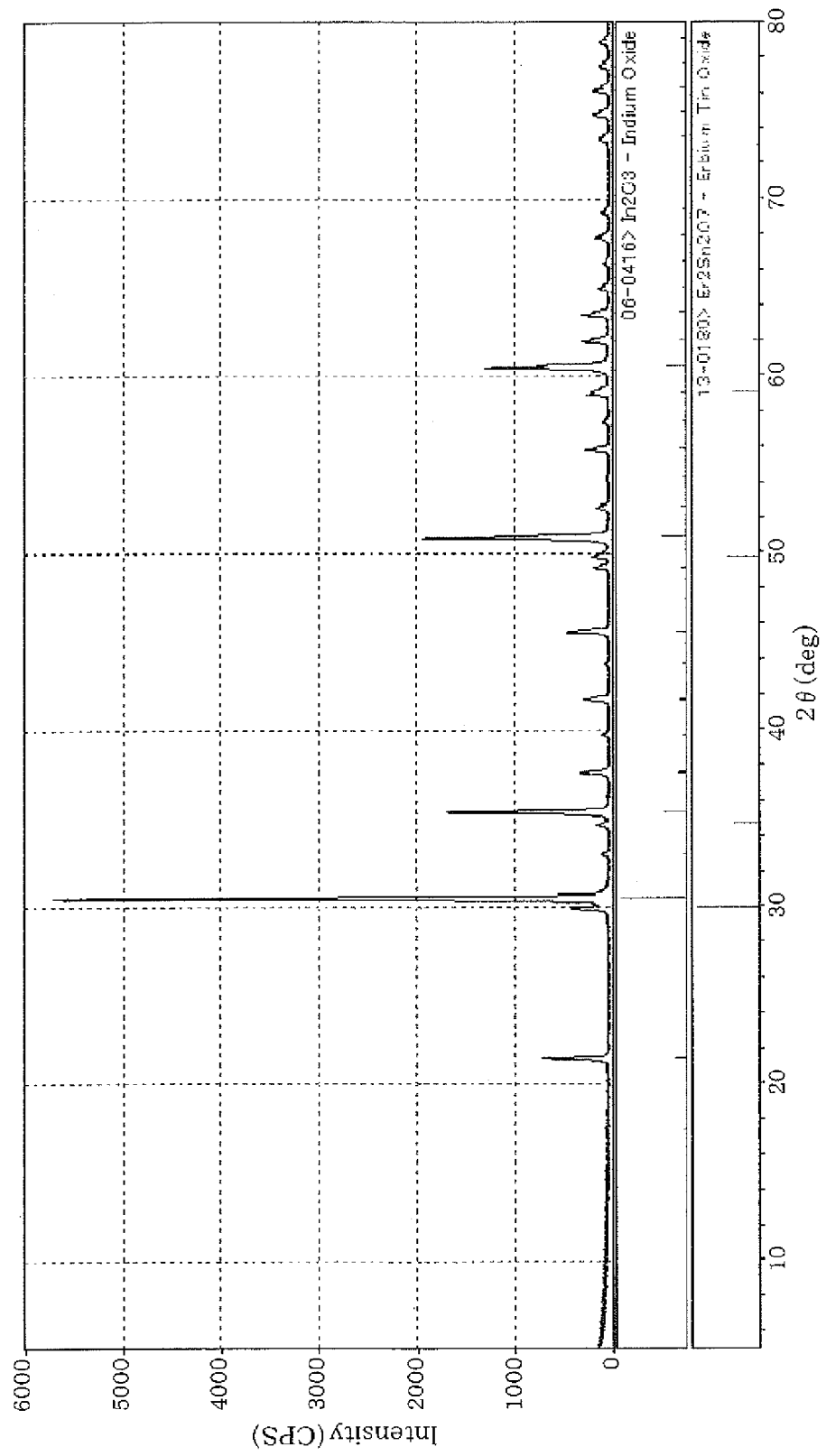
FIG. 42 is the X-ray chart of the target prepared in Example 5-3.
Figure 43:
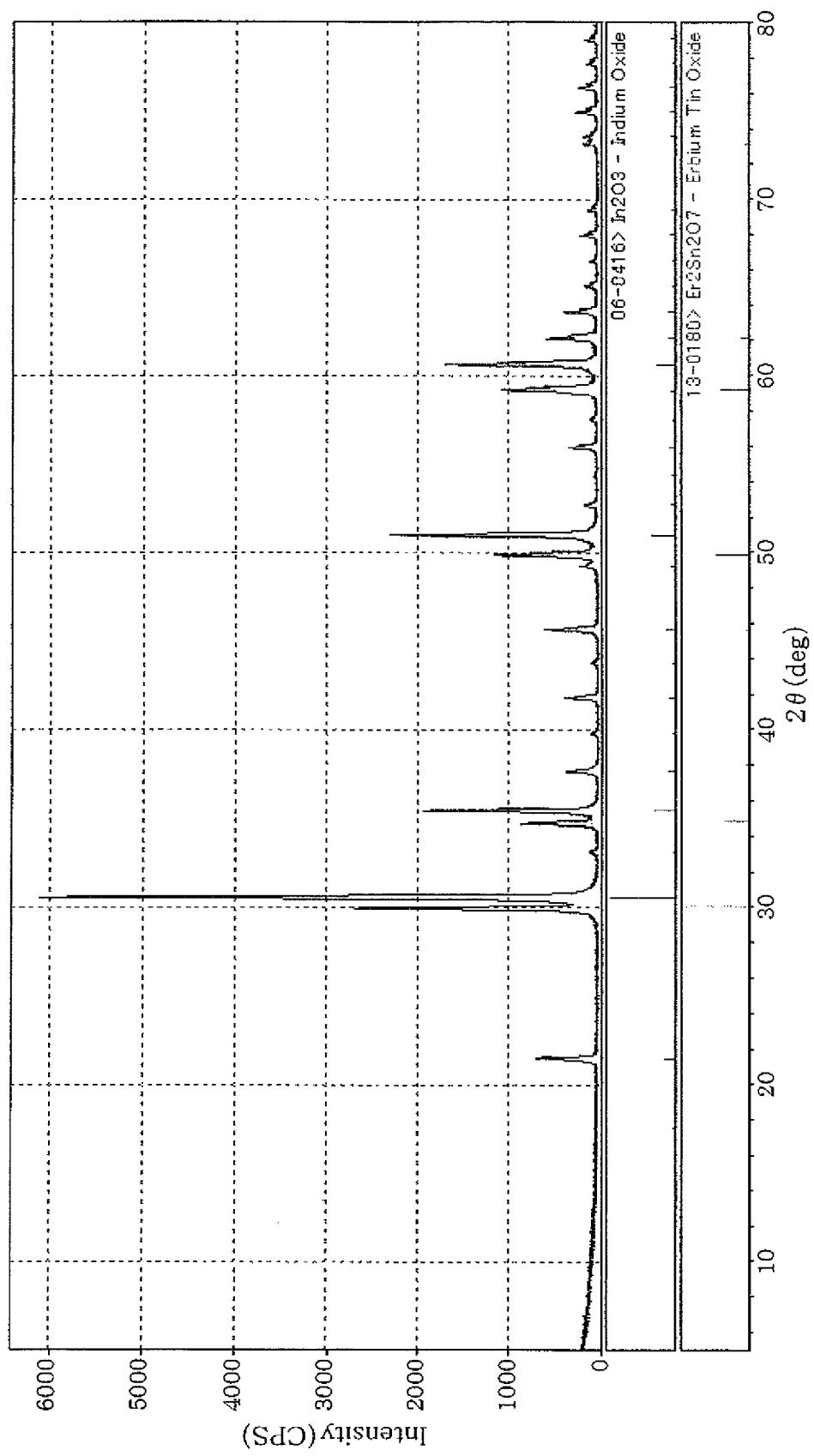
FIG. 43 is the X-ray chart of the target prepared in Example 5-4.
Figure 44:
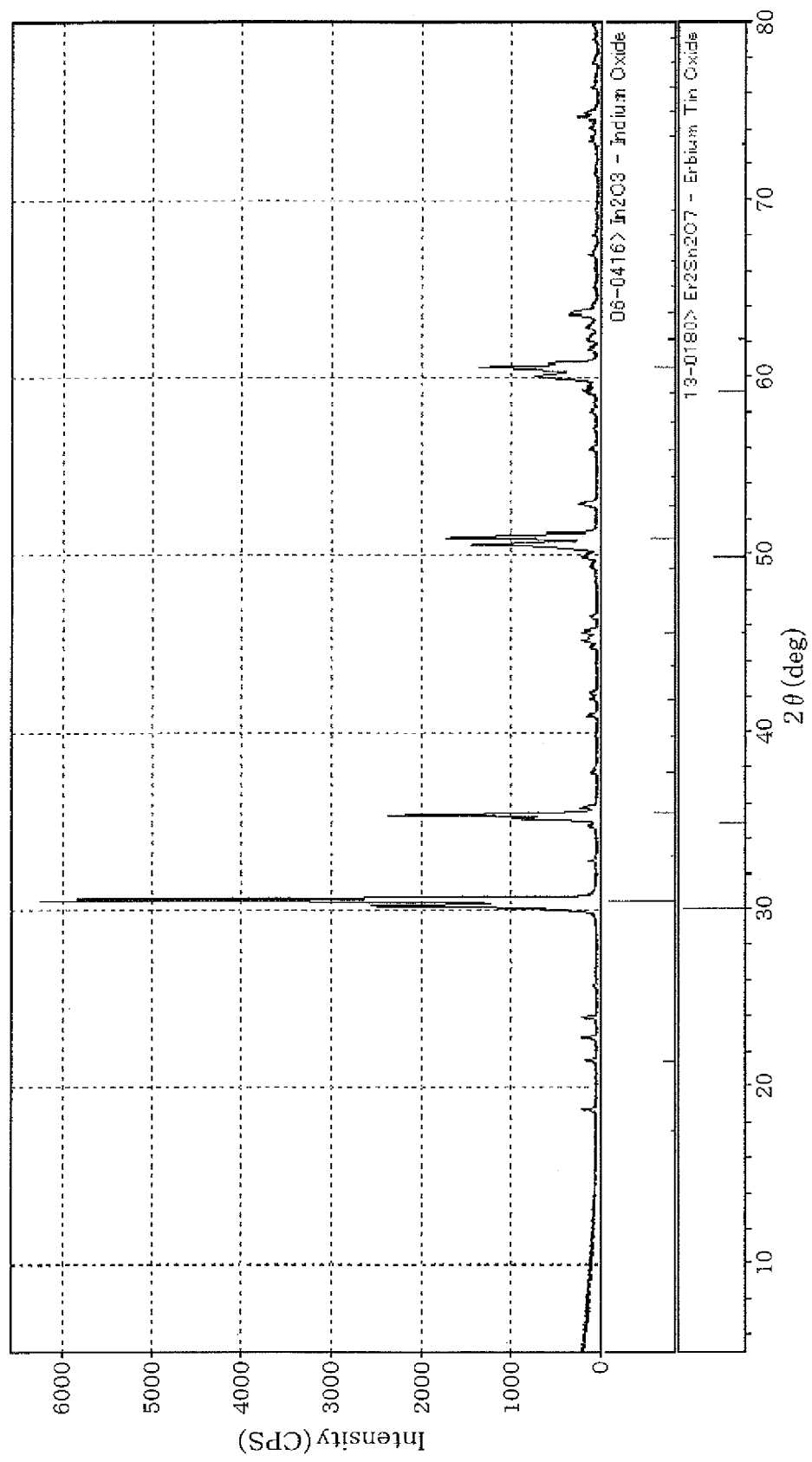
FIG. 44 is the X-ray chart of the target prepared in Example 5-5.
Figure 45:
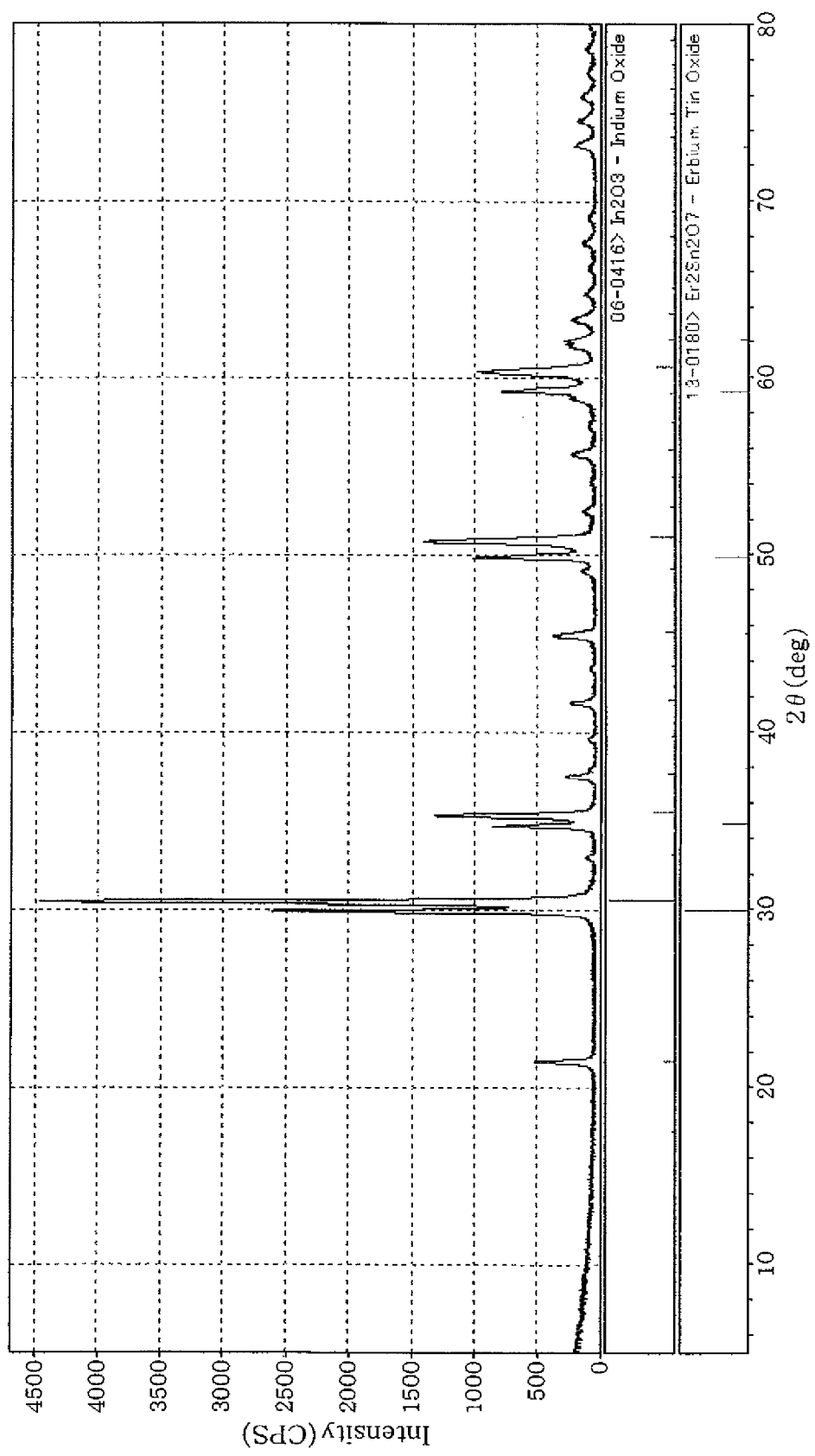
FIG. 45 is the X-ray chart of the target prepared in Example 5-6.
Figure 46:
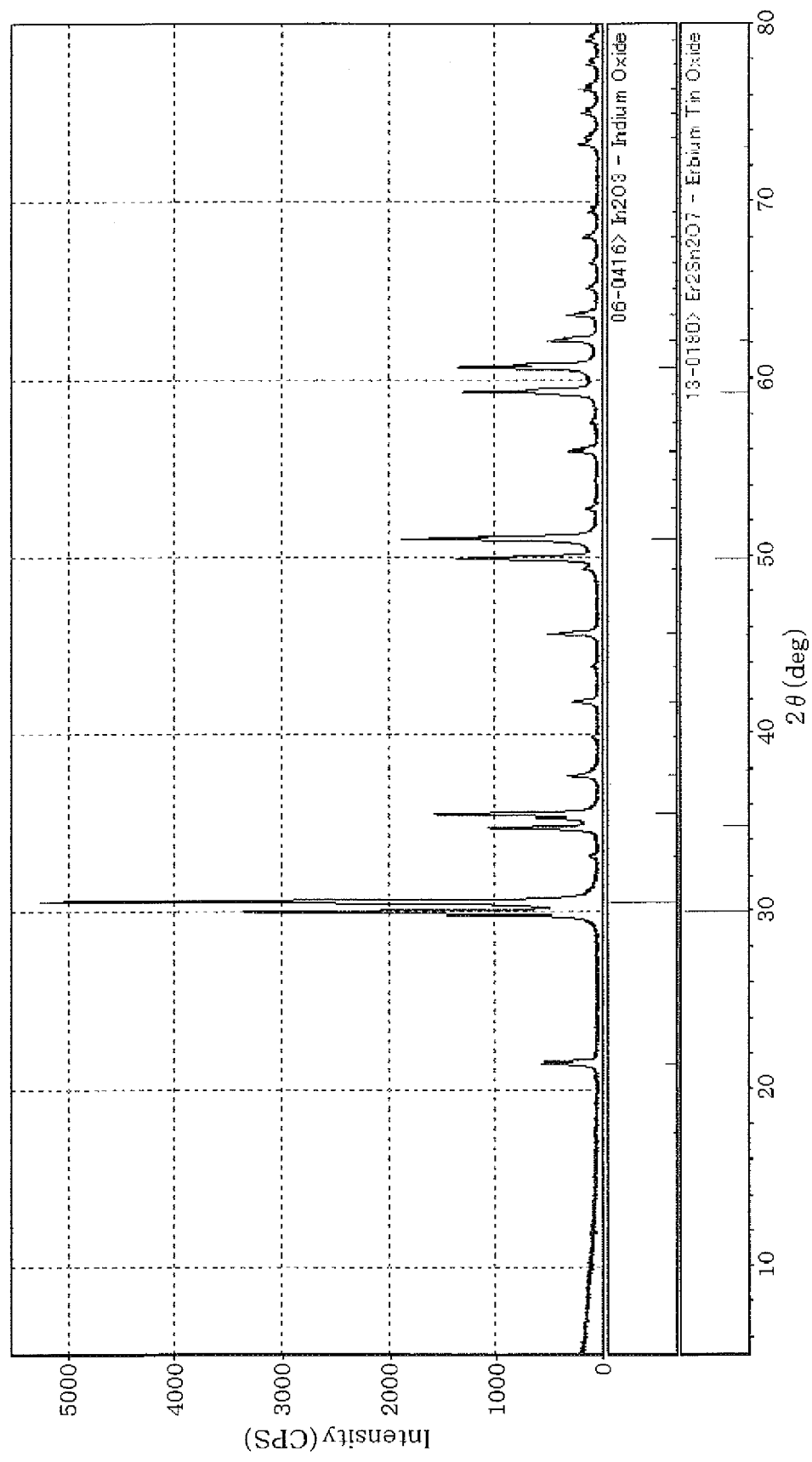
FIG. 46 is the X-ray chart of the target prepared in Example 5-7.
Figure 47:
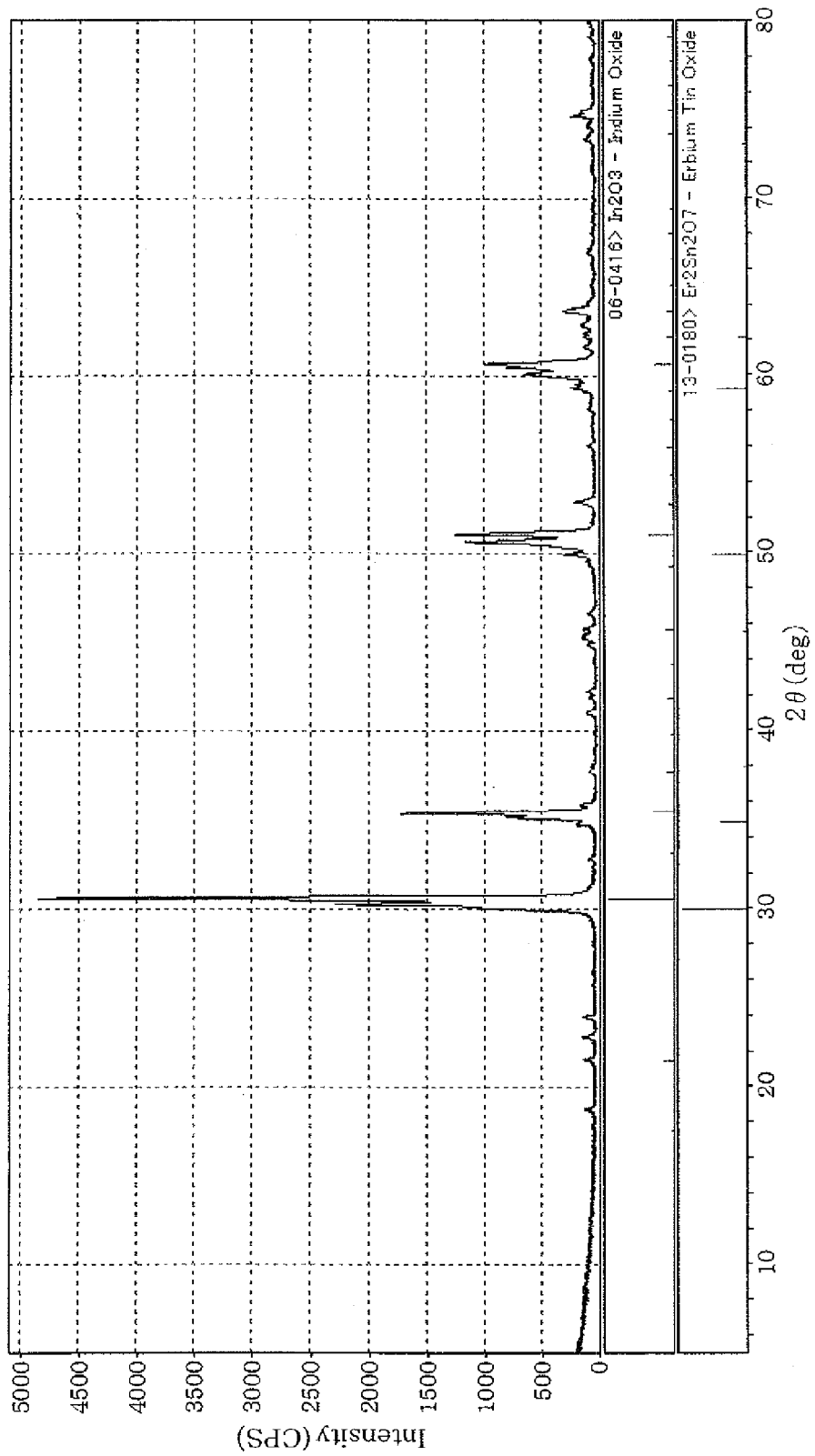
FIG. 47 is the X-ray chart of the target prepared in Example 5-8.
Figure 48:
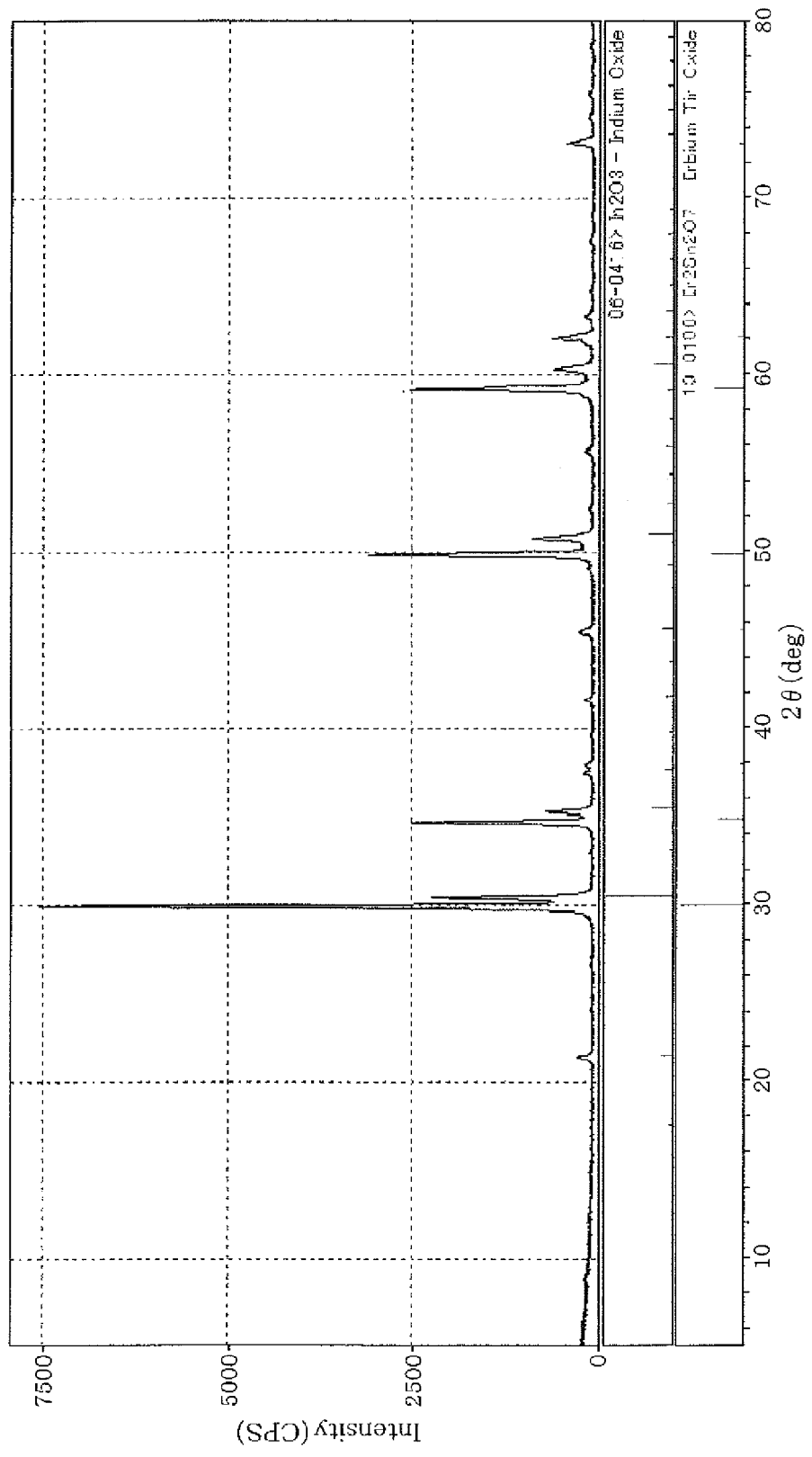
FIG. 48 is the X-ray chart of the target prepared in Example 5-9.
Figure 49:
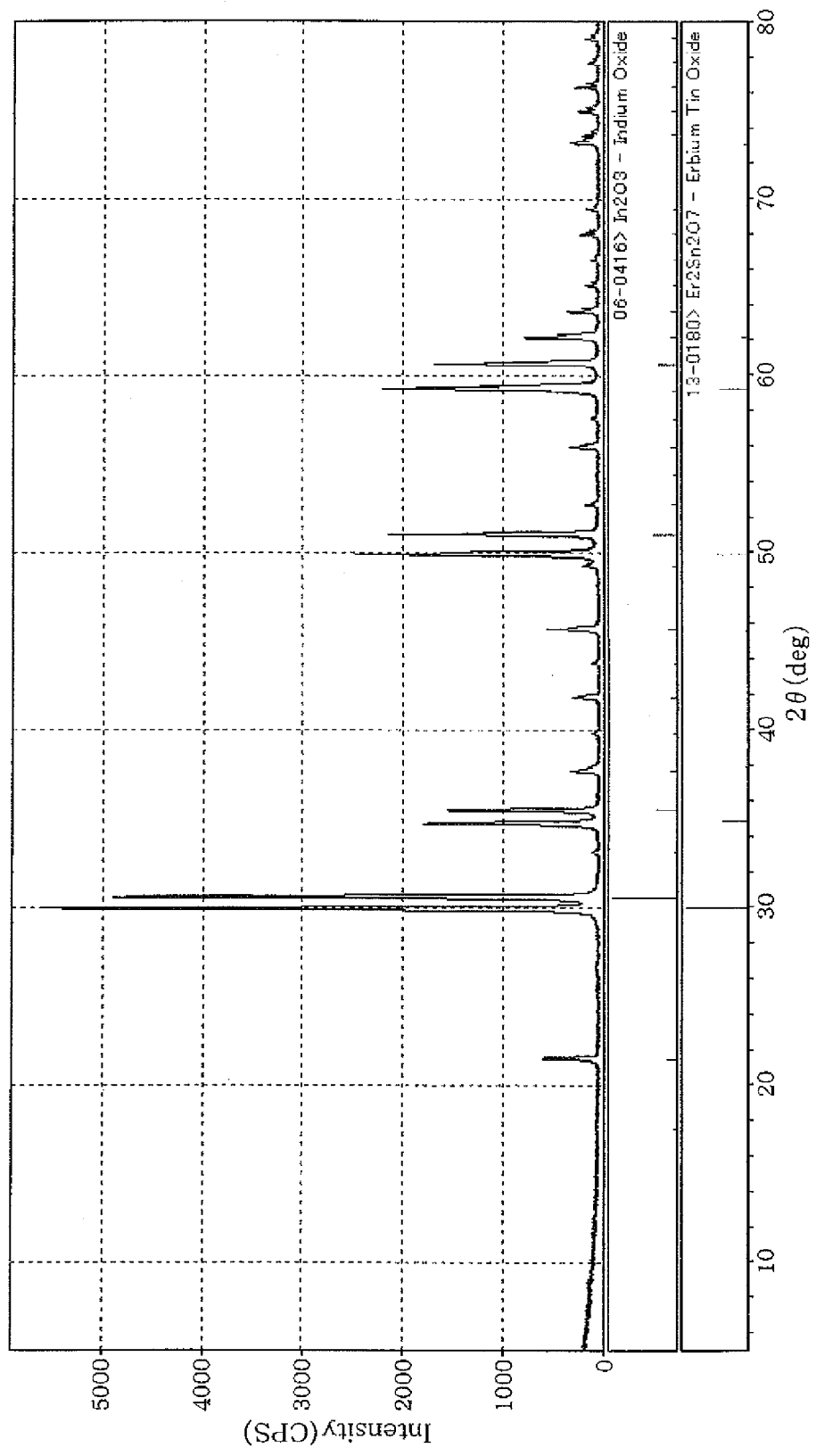
FIG. 49 is the X-ray chart of the target prepared in Example 5-10.
Figure 50:
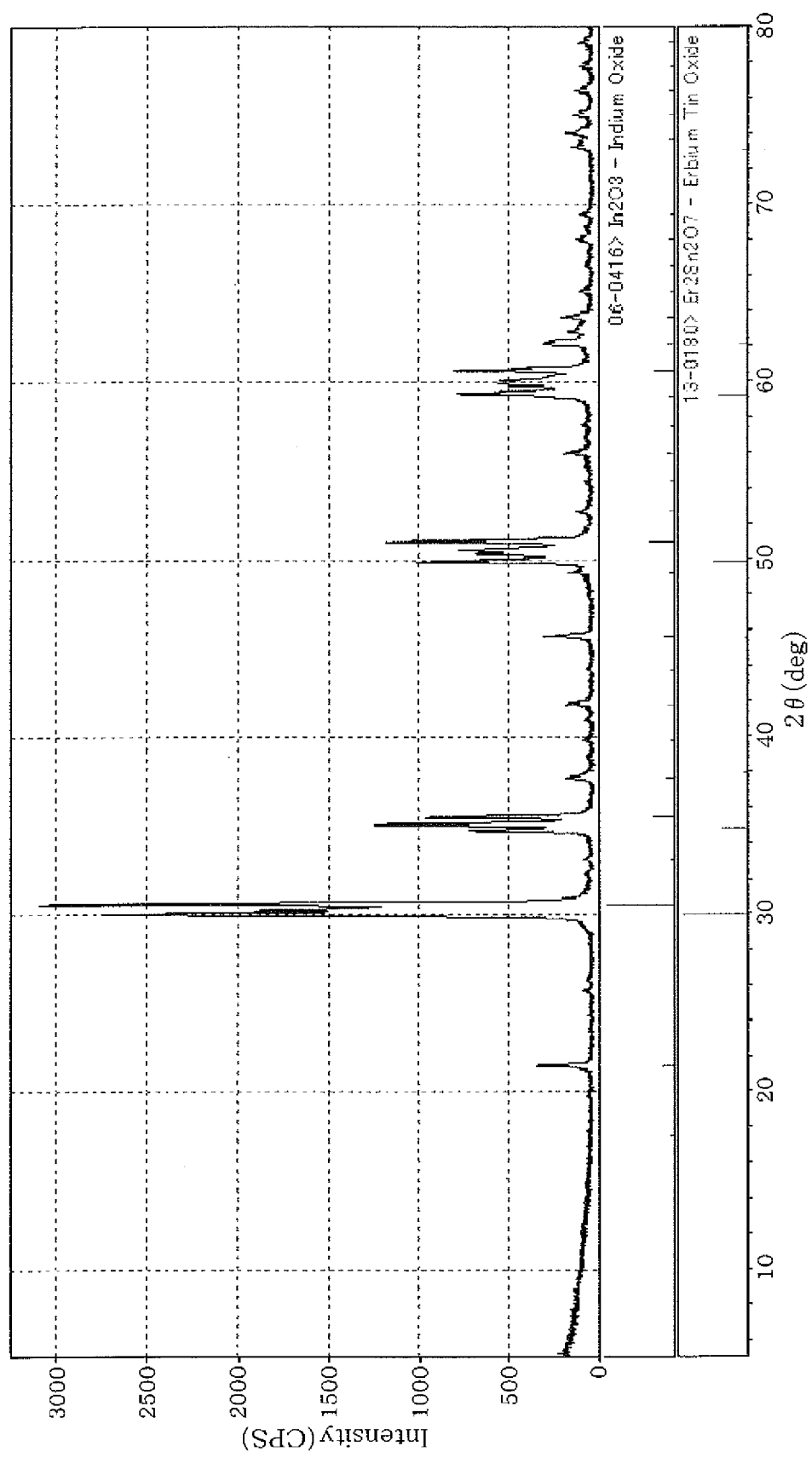
FIG. 50 is the X-ray chart of the target prepared in Example 5-11.
Figure 51:
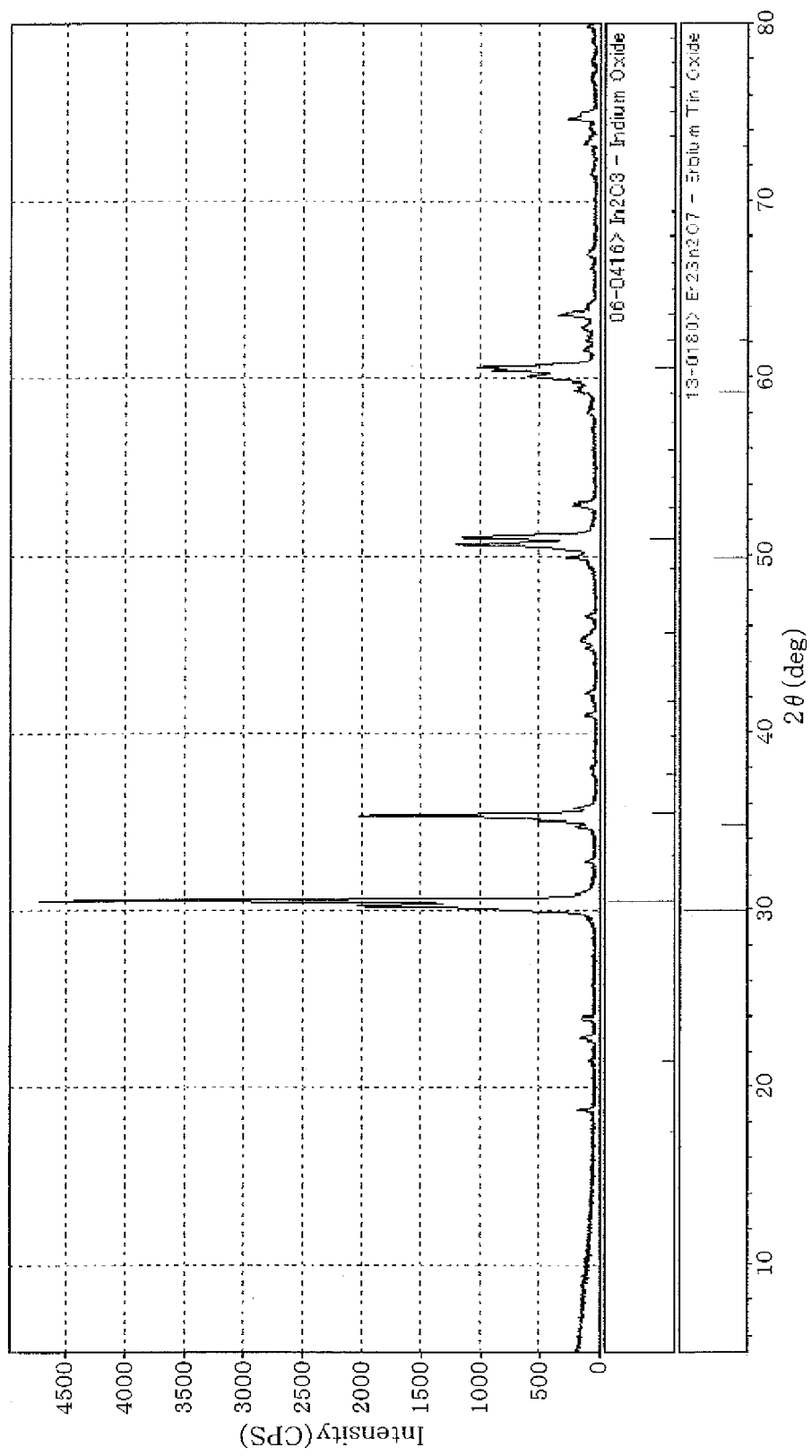
FIG. 51 is the X-ray chart of the target prepared in Example 5-12.

| | Results of ICP analysis*1 | | | Results of X-ray diffractometry*2 | | | | | X-ray chart | EPMA Uniformity | Density g/cm³ | Resistance Ωcm |
|---|---|---|---|---|---|---|---|---|---|---|---|---|
| Example | In | Sn | Er | $In_2O_3$ | $SnO_2$ | $Er_2O_3$ | $Er_2Sn_2O_7$ | $ErInO_3$ | | | | |
| 5-1 | 0.53 | 0.0 | 0.47 | ○ | X | X | X | ○ | FIG. 40 | Good | 4.63 | 1.8M |
| 5-2 | 0.0 | 0.51 | 0.49 | X | ○ | Δ | ○ | X | FIG. 41 | Good | 4.52 | 1.9M |
| 5-3 | 0.85 | 0.04 | 0.11 | ○ | X | X | ○ | X | FIG. 42 | Good | 5.26 | 1.3 |
| 5-4 | 0.75 | 0.10 | 0.15 | ○ | X | X | ○ | X | FIG. 43 | Good | 5.51 | 0.072 |
| 5-5 | 0.73 | 0.19 | 0.08 | ○ | X | X | ○ | X | FIG. 44 | Good | 5.61 | 0.006 |
| 5-6 | 0.66 | 0.10 | 0.24 | ○ | X | X | ○ | X | FIG. 45 | Good | 5.54 | 0.290 |
| 5-7 | 0.64 | 0.20 | 0.16 | ○ | X | X | ○ | X | FIG. 46 | Good | 5.62 | 0.005 |
| 5-8 | 0.63 | 0.29 | 0.08 | ○ | X | X | ○ | X | FIG. 47 | Good | 5.77 | 0.060 |
| 5-9 | 0.57 | 0.10 | 0.33 | ○ | X | X | ○ | X | FIG. 48 | Good | 5.69 | 1.7 |
| 5-10 | 0.55 | 0.20 | 0.25 | ○ | X | X | ○ | X | FIG. 49 | Good | 5.62 | 1.0 |
| 5-11 | 0.54 | 0.30 | 0.16 | ○ | X | X | ○ | X | FIG. 50 | Good | 5.71 | 0.048 |
| 5-12 | 0.53 | 0.39 | 0.08 | ○ | X | X | ○ | X | FIG. 51 | Good | 5.65 | 0.085 |

*1Each value in the table is the ratio of each atom to (In + Sn + Er) (atomic amount ratio).
*2Results of X-ray diffractometry: ○ The compound was identified. Δ: A minor peak was observed. X: No peak was observed.

Comparative Example 5-1

100 g of indium oxide, 100 g of tin oxide and 800 g of erbium oxide were mixed, and the resultant was pulverized and mixed for about 5 hours by means of a dry-type beads mill.

Subsequently, the resulting powder was placed in a 10 mmφ-die, and subjected to preliminary molding by means of a die pressing machine at a pressure of 100 kg/cm². Subsequently, the resultant was compacted by means of a cold isostatic pressing machine at a pressure of 4 t/cm², followed by sintering at 1350° C. for 10 hours.

The sintered body immediately after being taken out from the furnace had a large number of cracks, and broken. Therefore, this sintered body could not be machined into a target (grinding, polishing, and attaching to a backing plate).

The X-ray diffraction measurement was conducted for this sintered body. The results showed that the sintered body was composed of an oxide containing erbium oxide as the main component.

As a result of the ICP analysis, the atomic ratio [Er/(Er+Sn+In)] was 0.75.

The dispersion state of In, Sn and Er was confirmed by the in-plane elemental distribution measurement of the sintered body by means of EPMA. The results showed that the composition was substantially non-uniform. This sintered body was an insulating material having a bulk resistance of 2 MΩcm or more. [Dysprosium (Dy)]

Example 6-1

450 g of indium oxide and 550 g of dysprosium oxide were mixed, and the resultant was pulverized and mixed for about 5 hours by means of a wet-type beads mill, followed by drying and granulation, to obtain fine particles with a diameter of 0.1 to several mm.

Subsequently, the resulting powder was placed in a 10 mmφ-die, and subjected to preliminary molding by means of a die pressing machine at a pressure of 100 kg/cm². Subsequently, the resultant was compacted by means of a cold isostatic pressing machine at a pressure of 4 t/cm², followed by sintering at 1350° C. for 10 hours, whereby a sintered body was obtained. The sintered body was machined into a target (grinding, polishing, and attaching to a backing plate).

The X-ray diffraction measurement was conducted for the resulting target. The results showed that the target was composed of an oxide containing $DyInO_3$ and $In_2O_3$ as the main components.

Figure 52:
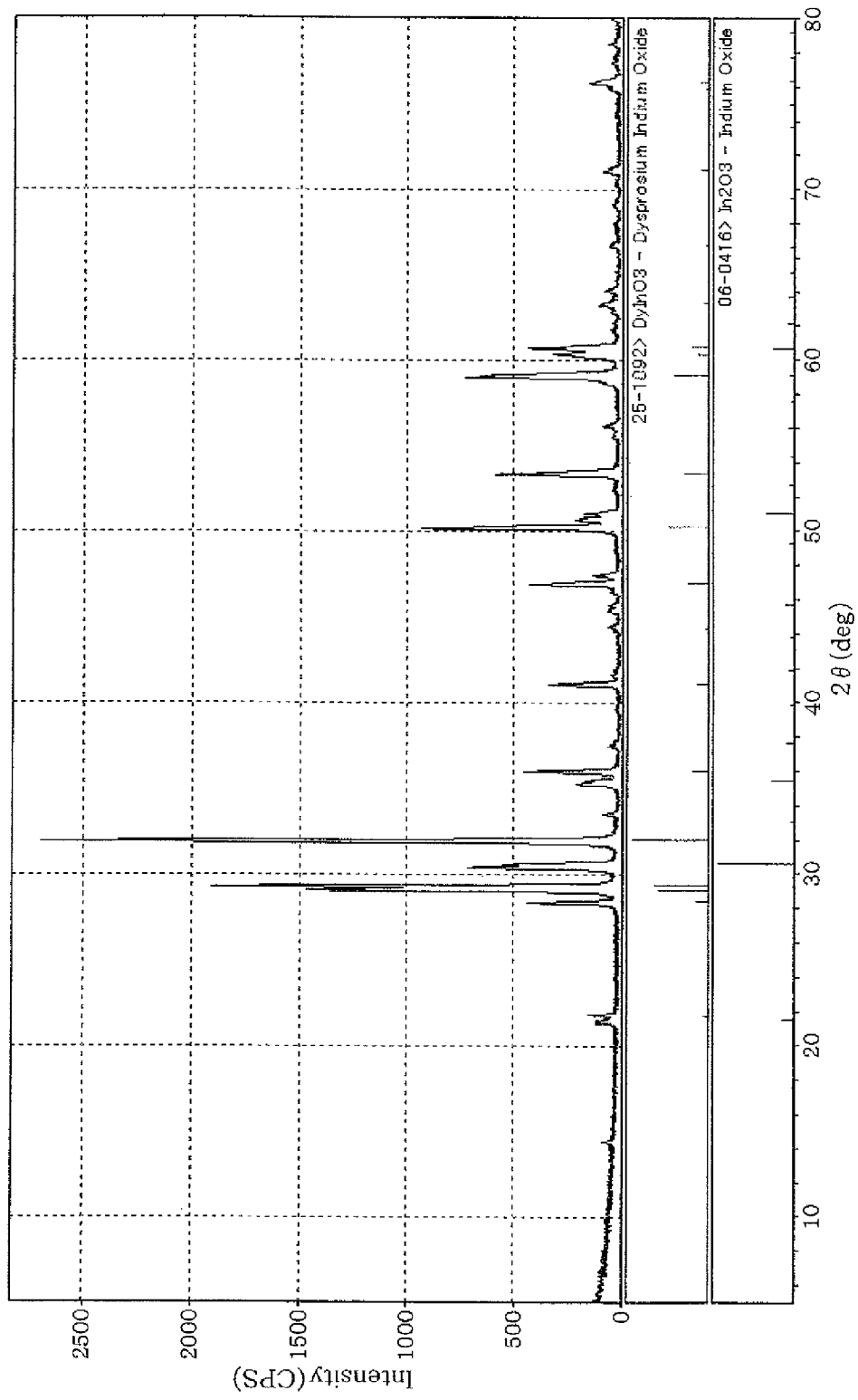
FIG. 52 is the X-ray chart of the target prepared in Example 6-1.

FIG. 52 shows the X-ray chart of the target.

As a result of the ICP analysis, the atomic ratio [Dy/(Dy+In)] was 0.47.

The dispersion state of In and Dy was confirmed by the in-plane elemental distribution measurement of the sintered body of the sintered body by means of EPMA. The results showed that the composition was substantially uniform.

The density of the target was 6.94 g/cm³ and the bulk resistance was 1.6 MΩcm.

Example 6-2

450 g of tin oxide and 550 g of dysprosium oxide were mixed, and the resultant was pulverized and mixed for about 5 hours by means of a wet-type beads mill, followed by drying and granulation.

Subsequently, the resulting powder was placed in a 10 mmφ-die, and subjected to preliminary molding by means of a die pressing machine at a pressure of 100 kg/cm². Subsequently, the resultant was compacted by means of a cold isostatic pressing machine at a pressure of 4 t/cm², followed by sintering at 1350° C. for 10 hours, whereby a sintered body was obtained. The thus obtained sintered body was machined into a target.

The X-ray diffraction measurement was conducted for the resulting target. The results showed that the target was composed of an oxide containing $Dy_2Sn_2O_7$ and $SnO_2$ as the main components.

Figure 53:
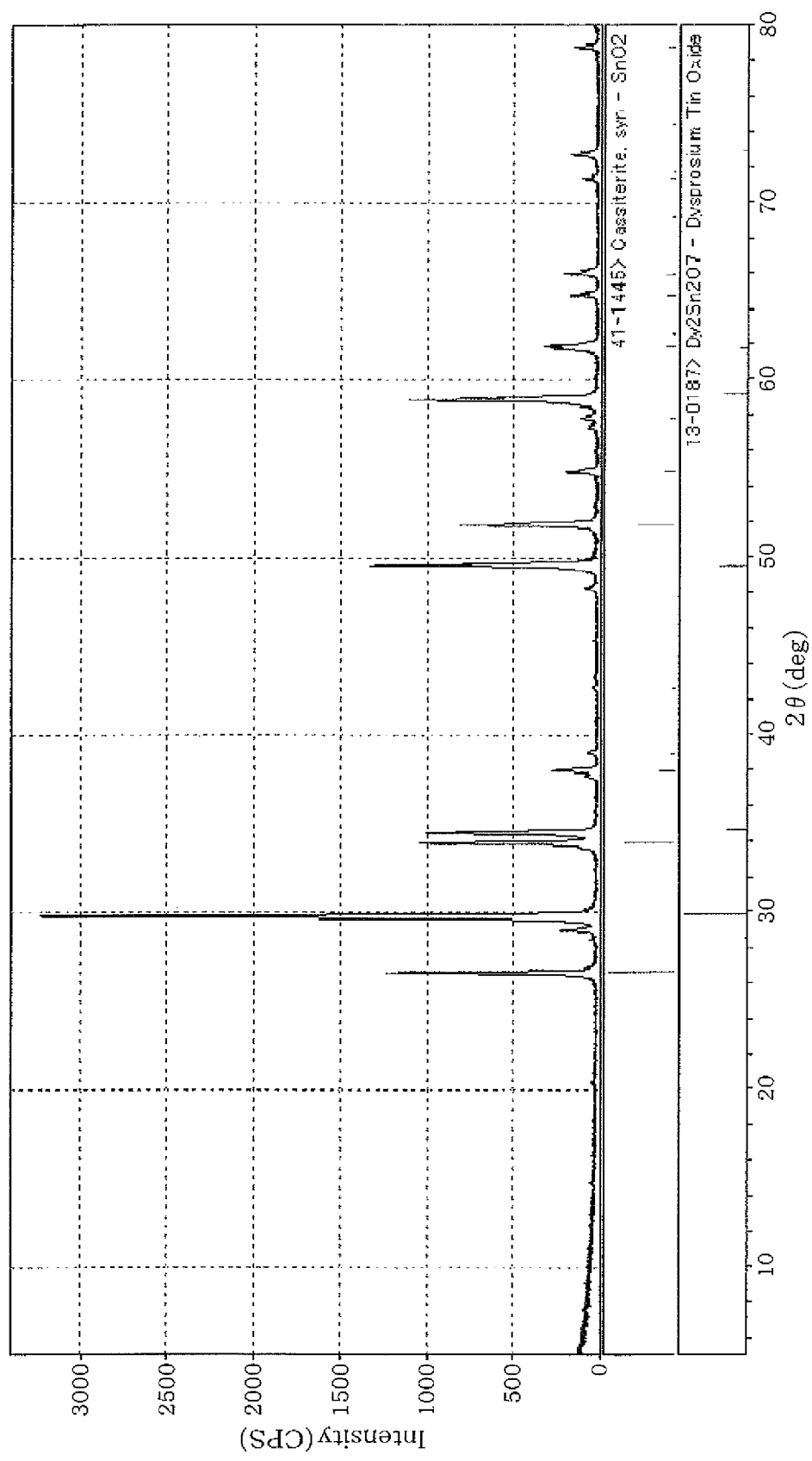
FIG. 53 is the X-ray chart of the target prepared in Example 6-2.

FIG. 53 shows the X-ray chart of the target.

As a result of the ICP analysis, the atomic ratio [Dy/(Dy+Sn)] was 0.49.

The dispersion state of Sn and Dy was confirmed by the in-plane elemental distribution measurement by means of an EPMA. The results showed that the composition was substantially uniform. The target had a density of 6.87 g/cm³ and a bulk resistance of 1.2 MΩcm.

Examples 6-3 to 6-11

Indium oxide powder, tin oxide powder and dysprosium oxide powder were mixed such that the composition shown in Table 11 was attained, and the resultant was pulverized and mixed for about 5 hours by means of a wet-type beads mill, followed by drying and granulation.

Subsequently, the resulting powder was placed in a 10 mmφ-die, and subjected to preliminary molding by means of a die pressing machine at a pressure of 100 kg/cm². Subsequently, the resultant was compacted by means of a cold isostatic pressing machine at a pressure of 4 t/cm², followed by sintering at 1350° C. for 10 hours, whereby a sintered body was obtained. The thus obtained sintered body was machined into a target.

TABLE 11

| Example | Target composition (Amount) wt % | | |
|---|---|---|---|
| | $In_2O_3$ | $SnO_2$ | $Dy_2O_3$ |
| 6-1 | 45.0 | 0.0 | 55.0 |
| 6-2 | 0.0 | 45.0 | 55.0 |
| 6-3 | 80.0 | 5.0 | 15.0 |
| 6-4 | 70.0 | 5.0 | 25.0 |
| 6-5 | 70.0 | 10.0 | 20.0 |
| 6-6 | 70.0 | 20.0 | 10.0 |
| 6-7 | 60.0 | 10.0 | 30.0 |
| 6-8 | 60.0 | 20.0 | 20.0 |
| 6-9 | 60.0 | 30.0 | 10.0 |
| 6-10 | 50.0 | 20.0 | 30.0 |
| 6-11 | 50.0 | 30.0 | 20.0 |

The X-ray diffraction measurement was conducted for the resulting target. The results showed that the target was composed mostly of $Dy_2Sn_2O_7$ and $In_2O_3$.

FIGS. 54 to 62 show X-ray charts of the targets prepared in Examples 6-3 to 6-11.

Table 12 shows the results of the ICP analysis of the target, the results of the in-plane elementary distribution measurement by means of EPMA, the density and the bulk resistance.

TABLE 12

Figure 54:
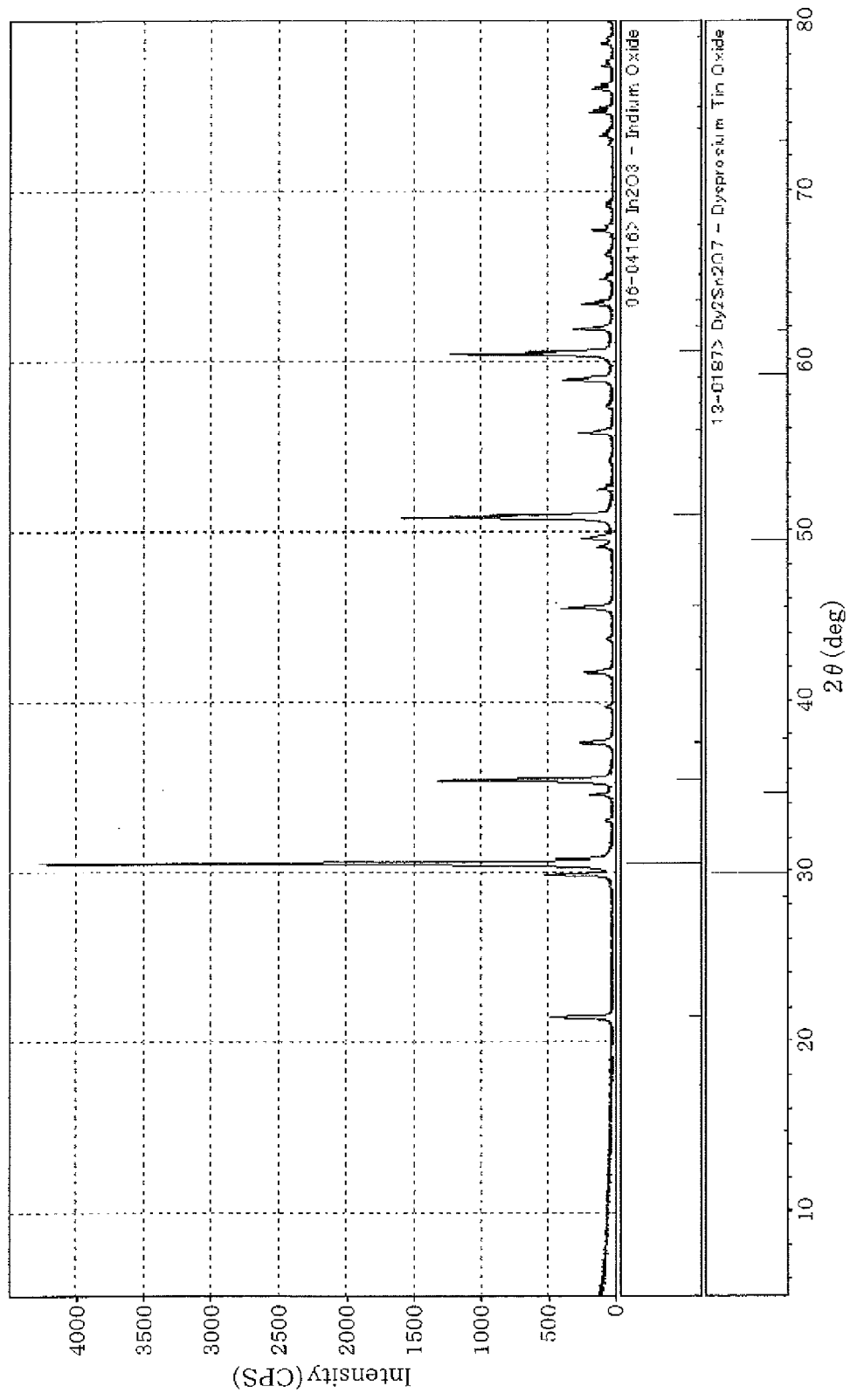
FIG. 54 is the X-ray chart of the target prepared in Example 6-3.
Figure 55:
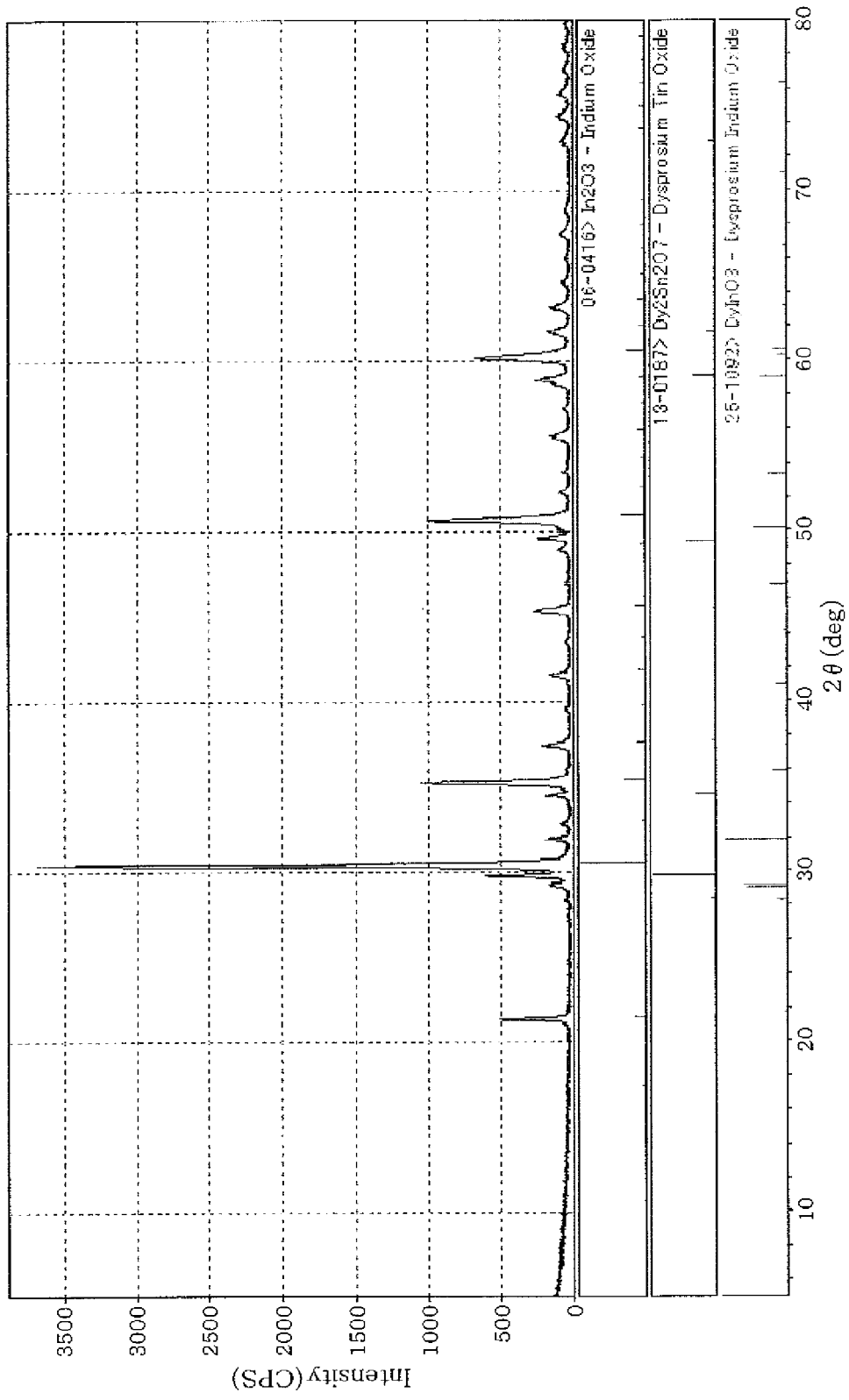
FIG. 55 is the X-ray chart of the target prepared in Example 6-4.
Figure 56:
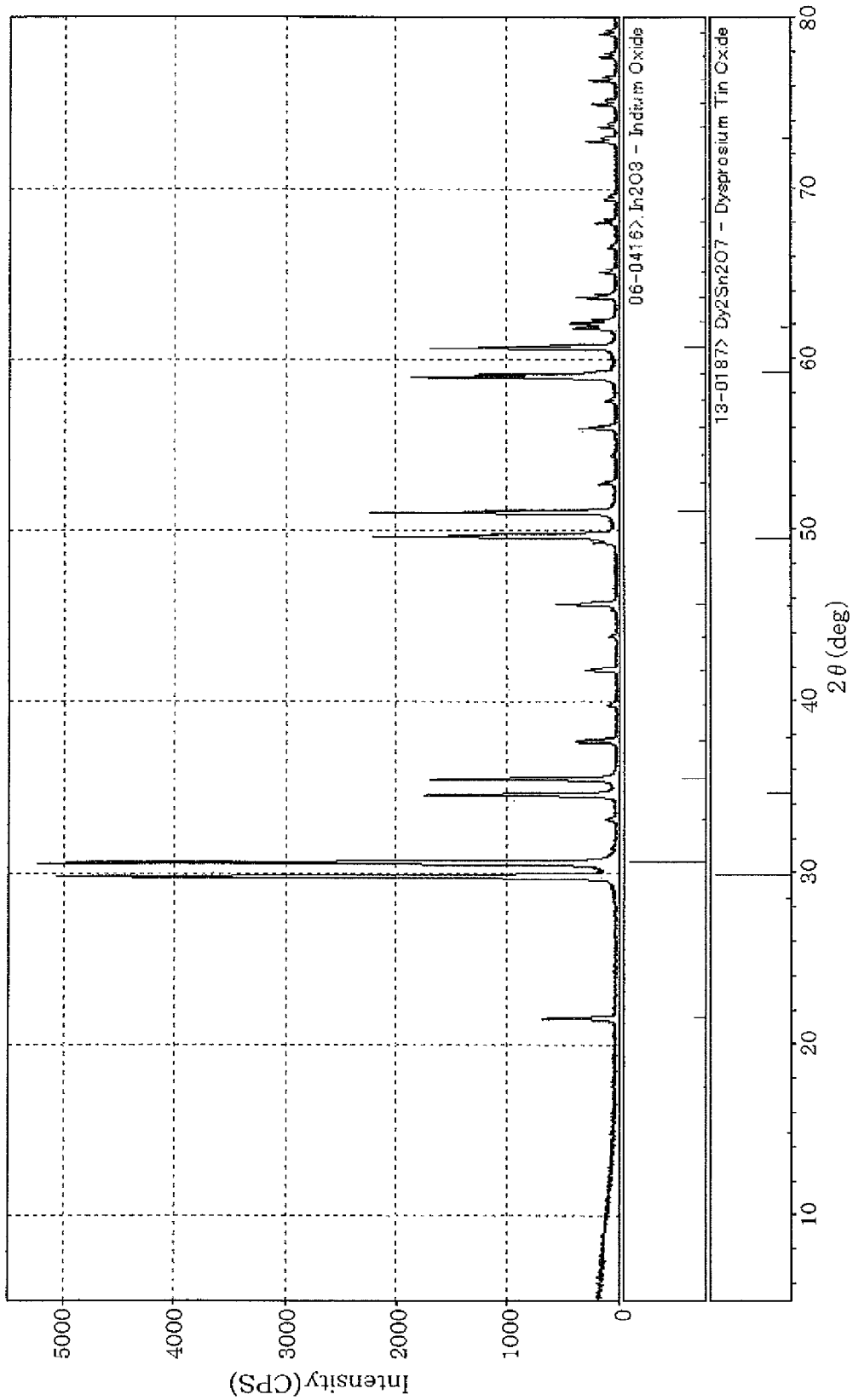
FIG. 56 is the X-ray chart of the target prepared in Example 6-5.
Figure 57:
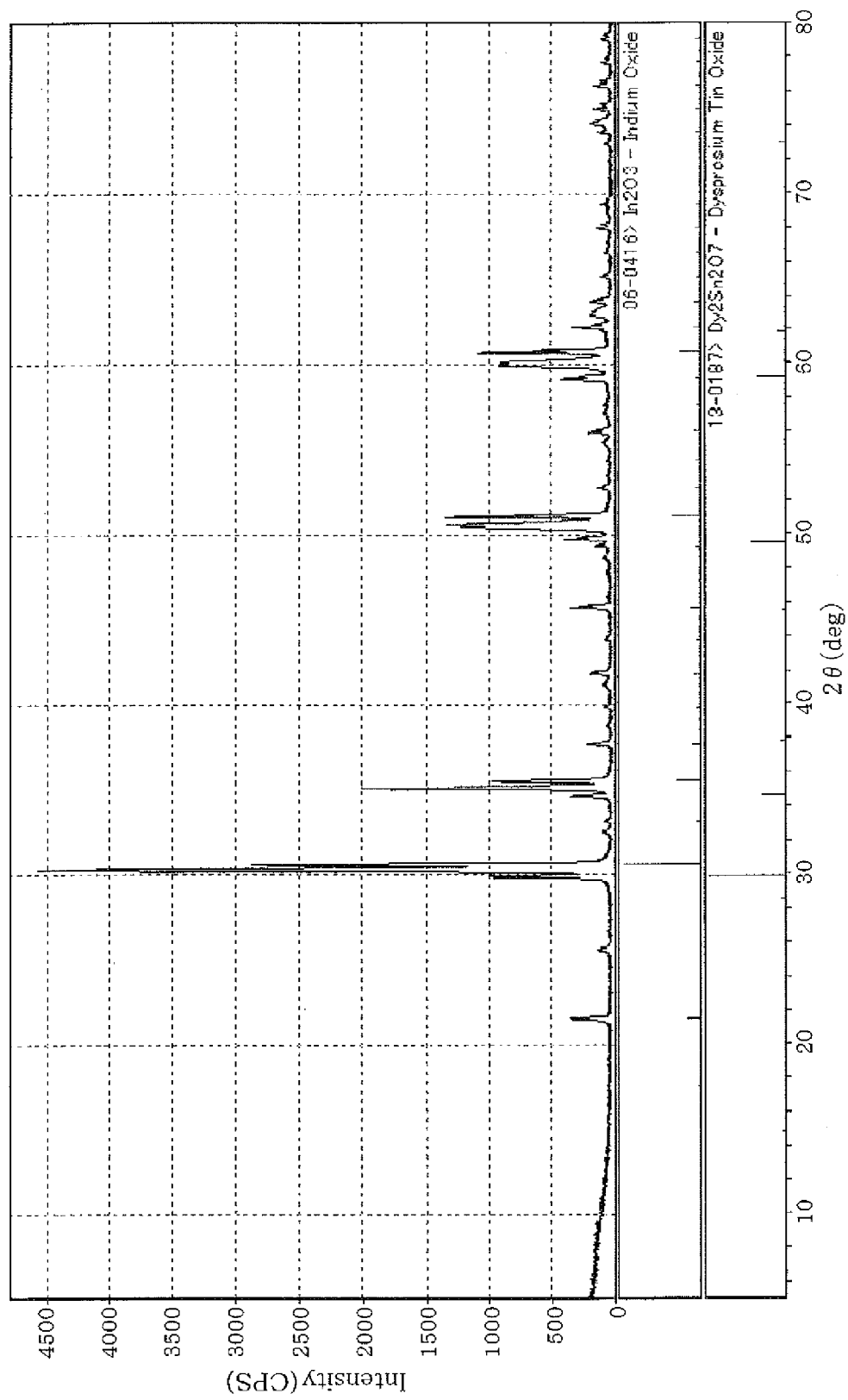
FIG. 57 is the X-ray chart of the target prepared in Example 6-6.
Figure 58:
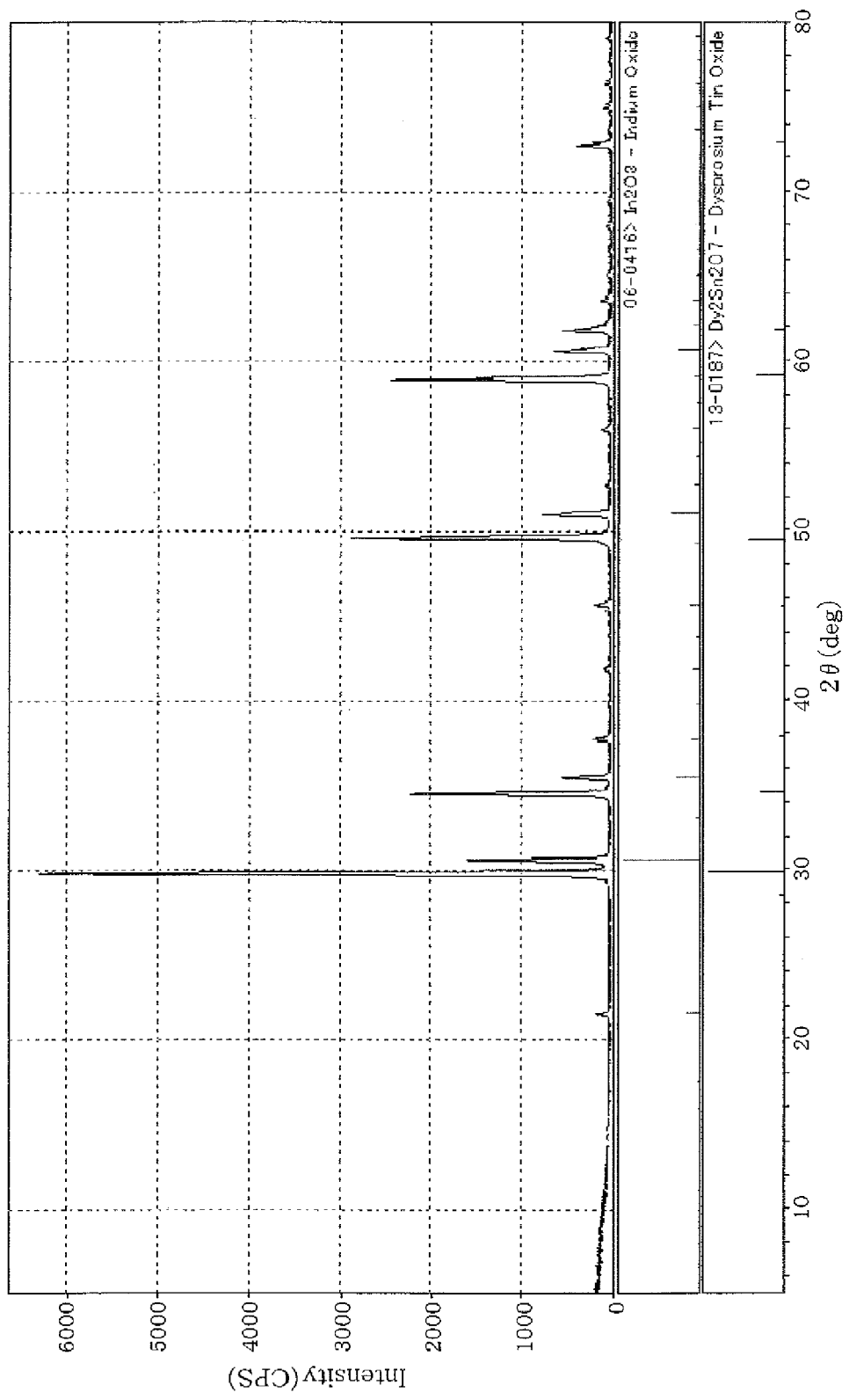
FIG. 58 is the X-ray chart of the target prepared in Example 6-7.
Figure 59:
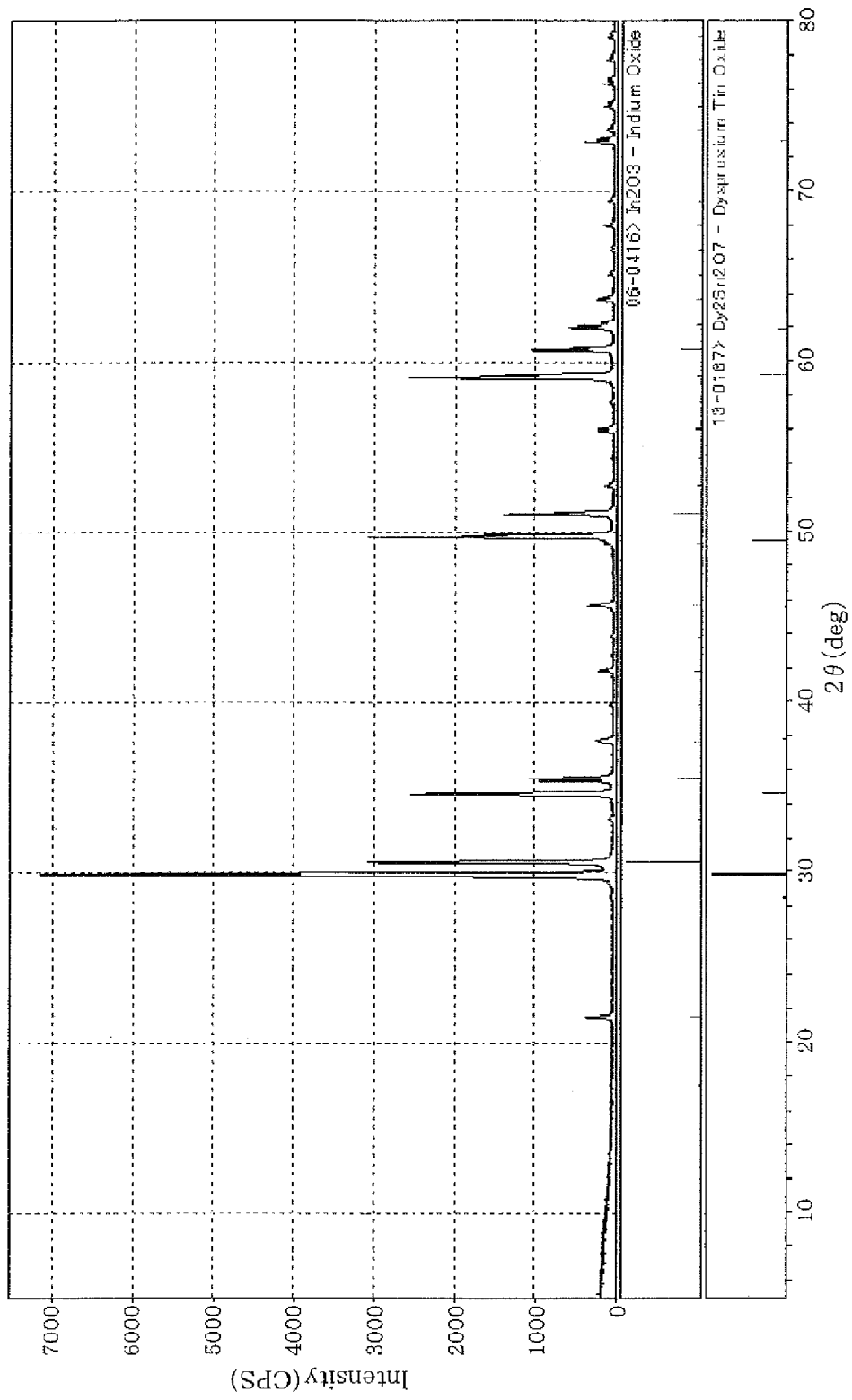
FIG. 59 is the X-ray chart of the target prepared in Example 6-8.
Figure 60:
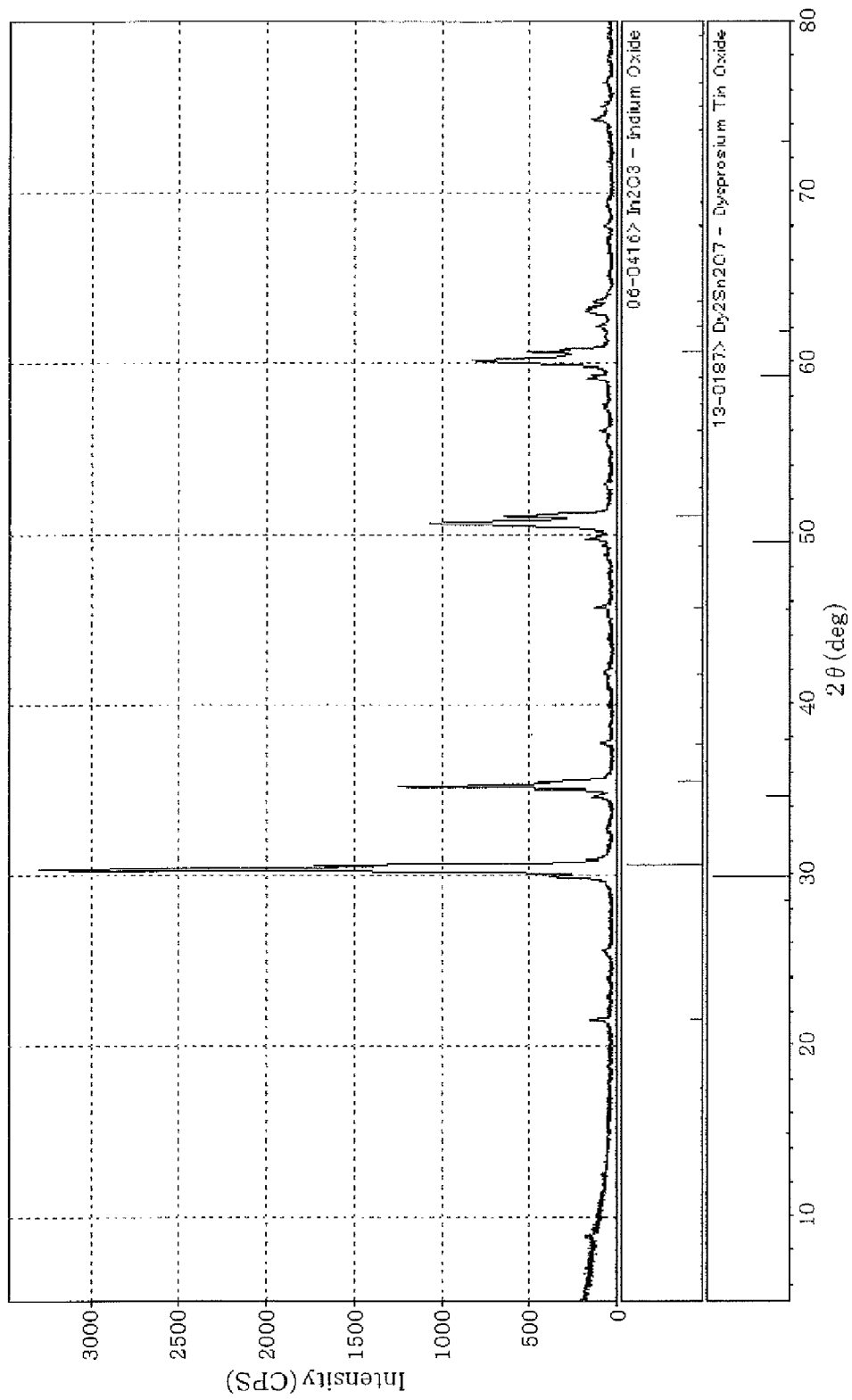
FIG. 60 is the X-ray chart of the target prepared in Example 6-9.

| | Results of ICP analysis*¹ | | | Results of X-ray diffractometry*² | | | | | X-ray chart | EPMA Uniformity | Density g/cm³ | Resistance Ωcm |
|---|---|---|---|---|---|---|---|---|---|---|---|---|
| Example | In | Sn | Dy | $In_2O_3$ | $SnO_2$ | $Dy_2O_3$ | $Dy_2Sn_2O_7$ | $DyInO_3$ | | | | |
| 6-1 | 0.53 | 0.0 | 0.47 | ○ | X | X | X | ○ | FIG. 52 | Good | 6.94 | 1.6M |
| 6-2 | 0.0 | 0.51 | 0.49 | X | ○ | X | ○ | X | FIG. 53 | Good | 6.87 | 1.2M |
| 6-3 | 0.83 | 0.05 | 0.12 | ○ | X | X | ○ | X | FIG. 54 | Good | 6.68 | 0.134 |
| 6-4 | 0.75 | 0.05 | 0.20 | ○ | X | X | ○ | ○ | FIG. 55 | Good | 6.79 | 5.3 |
| 6-5 | 0.74 | 0.10 | 0.16 | ○ | X | X | ○ | X | FIG. 56 | Good | 6.74 | 0.039 |
| 6-6 | 0.73 | 0.19 | 0.08 | ○ | X | X | ○ | X | FIG. 57 | Good | 6.68 | 0.003 |
| 6-7 | 0.65 | 0.10 | 0.25 | ○ | X | X | ○ | X | FIG. 58 | Good | 6.81 | 0.4 |
| 6-8 | 0.64 | 0.20 | 0.16 | ○ | X | X | ○ | X | FIG. 59 | Good | 6.76 | 0.005 |
| 6-9 | 0.63 | 0.29 | 0.08 | ○ | X | X | ○ | X | FIG. 60 | Good | 6.71 | 0.057 |

TABLE 12-continued

Figure 61:
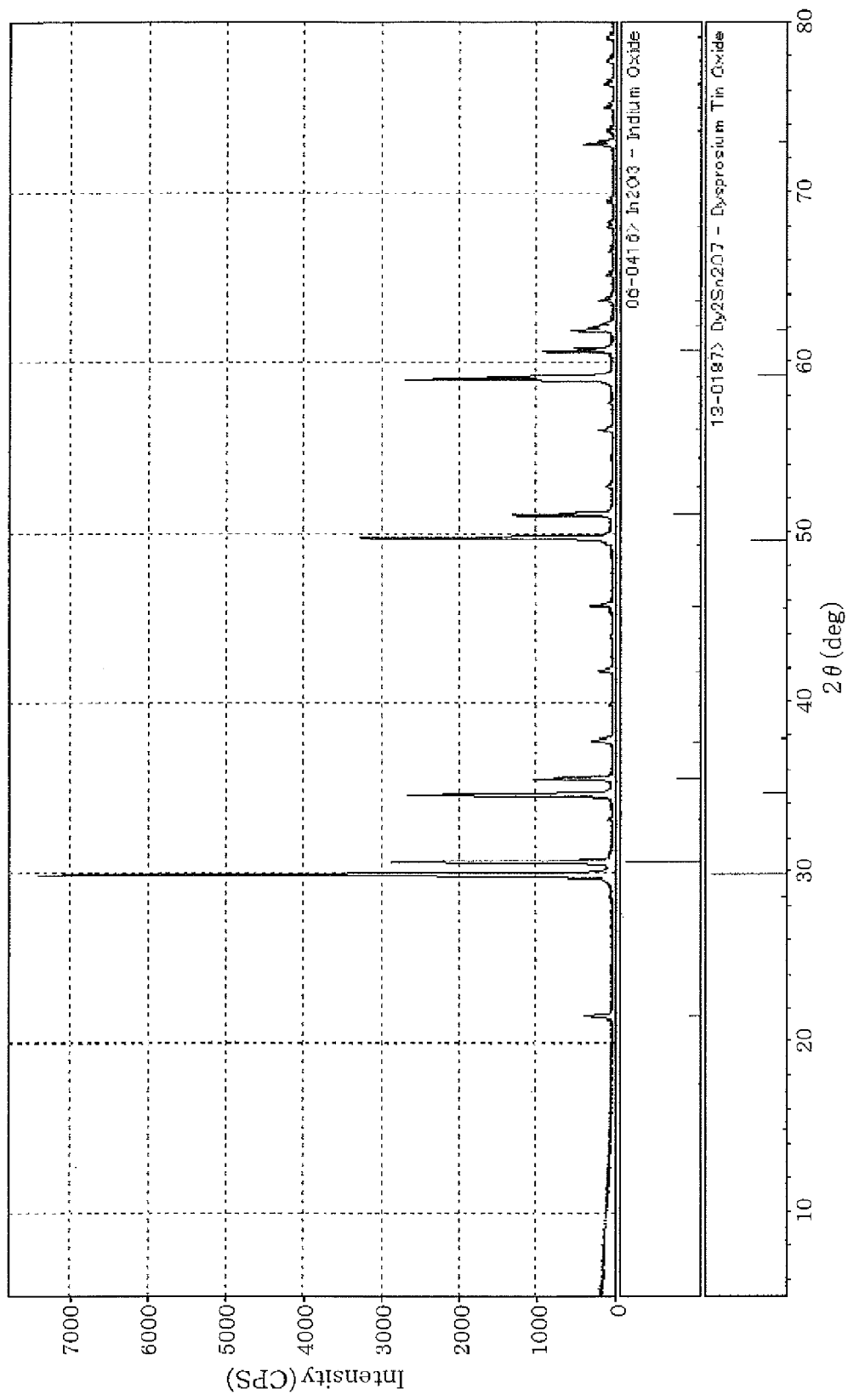
FIG. 61 is the X-ray chart of the target prepared in Example 6-10.
Figure 62:
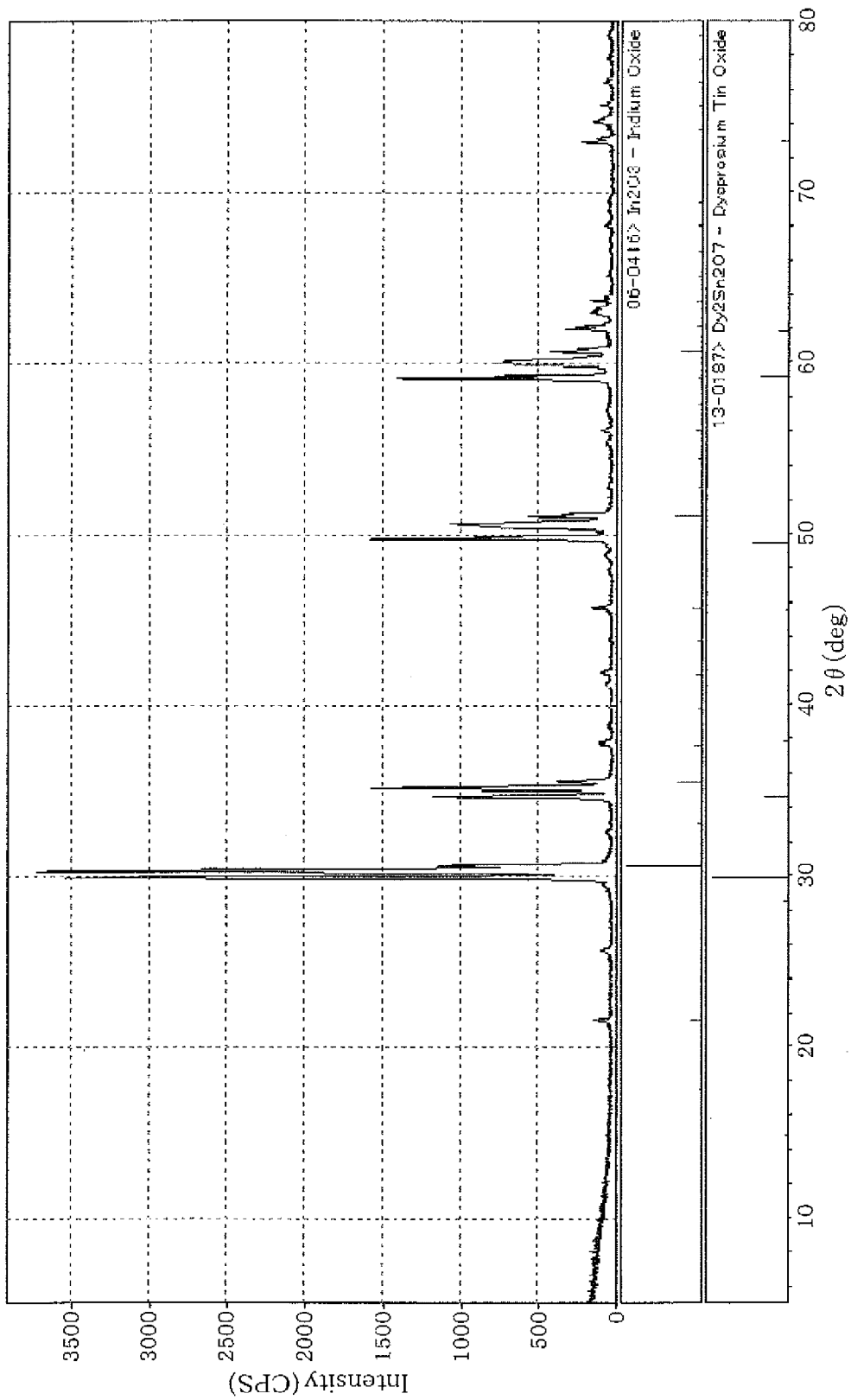
FIG. 62 is the X-ray chart of the target prepared in Example 6-11.

|  | Results of ICP analysis[*1] | | | Results of X-ray diffractometry[*2] | | | | | X-ray chart | EPMA Uniformity | Density g/cm³ | Resistance Ωcm |
|---|---|---|---|---|---|---|---|---|---|---|---|---|
| Example | In | Sn | Dy | In₂O₃ | SnO₂ | Dy₂O₃ | Dy₂Sn₂O₇ | DyInO₃ | | | | |
| 6-10 | 0.55 | 0.20 | 0.25 | ○ | X | X | ○ | X | FIG. 61 | Good | 6.73 | 0.087 |
| 6-11 | 0.54 | 0.30 | 0.16 | ○ | X | X | ○ | X | FIG. 62 | Good | 6.70 | 0.066 |

[*1]Each value in the table is the ratio of each atom to (In + Sn + Dy) (atomic amount ratio).
[*2]Results of X-ray diffractometry: ○ The compound was identified. X: No peak was observed.

Comparative Example 6-1

100 g of indium oxide, 100 g of tin oxide and 800 g of dysprosium oxide were mixed, and the resultant was pulverized and mixed for about 5 hours by means of a dry-type beads mill, followed by drying by means of a spray dryer.

Subsequently, the resulting powder was placed in a 10 mmφ-die, and subjected to preliminary molding by means of a die pressing machine at a pressure of 100 kg/cm². Subsequently, the resultant was compacted by means of a cold isostatic pressing machine at a pressure of 4 t/cm², followed by sintering at 1350° C. for 10 hours.

The sintered body immediately after being taken out from the furnace had a large number of cracks, and broken. Therefore, this sintered body could not be machined into a target (grinding, polishing, and attaching to a backing plate).

The X-ray diffraction measurement was conducted for this sintered body. The results showed that the sintered body was composed of an oxide containing dysprosium oxide as the main component.

As a result of the ICP analysis, the atomic ratio [Dy/(Dy+Sn+In)] was 0.76.

The dispersion state of In, Sn and Dy was confirmed by the in-plane elemental distribution measurement of the sintered body by means of EPMA. The results showed that the composition was substantially non-uniform. This sintered body had a bulk resistance of 2 MΩcm or more.

INDUSTRIAL APPLICABILITY

The target of the invention is suitable for use as a target to obtain by the sputtering method a transparent conductive film and an oxide semiconductor film for various applications including a liquid crystal display (LCD), an electroluminescence (EL) display and a solar cell. Specifically, by using the target of the invention, it is possible to obtain a transparent conductive film for electrodes of an organic EL device or a semi-transmissive/semi-reflective LCD, an oxide semiconductor film for driving liquid crystals, and an oxide semiconductor film for driving an organic EL device.

The invention claimed is:

1. An oxide target comprising indium (In) and an element (A), wherein said target contains an oxide of the formula AInO₃, the ratio of the element (A) to the total content of In and A, expressed as the A/(A+In) atomic ratio is 0.01 to 0.2, and element (A) is lanthanum (La), neodymium (Nd) or ytterbium (Yb).

2. The oxide target according to claim 1, wherein the element (A) is Nd or Yb and the density is 6.5 g/cm³ or more.

3. The oxide target according to claim 1, wherein the element (A) is La, and the density is 6.5 g/cm³ or more.

4. The oxide target according to claim 1, wherein the element (A) is La, and the bulk resistance is 1 Ωcm or less.

5. The oxide target according to claim 1, wherein the element (A) is Nd or Yb.

* * * * *